United States Patent
Garra et al.

(10) Patent No.: US 12,227,612 B2
(45) Date of Patent: Feb. 18, 2025

(54) ULTRAFAST CYCLIC ETHER-AMINE PHOTOPOLYADDITION AND USES THEREOF

(71) Applicants: Centre National de la Recherche Scientifique, Paris (FR); Université de Haute-Alsace, Mulhouse (FR)

(72) Inventors: Patxi Garra, Mulhouse (FR); Jacques Lalevée, Mulhouse (FR); Fabrice Morlet-Savary, Pfastatt (FR); Céline Dietlin, Mulhouse (FR); Aurore Caron, Mulhouse (FR)

(73) Assignees: CENTRE NATIONAL DE LA RECHERCHE SCIENTIFIQUE, Paris (FR); UNIVERSITE DE HAUTE-ALSACE, Mulhouse (FR)

( * ) Notice: Subject to any disclaimer, the term of this patent is extended or adjusted under 35 U.S.C. 154(b) by 771 days.

(21) Appl. No.: 17/280,354

(22) PCT Filed: Sep. 25, 2019

(86) PCT No.: PCT/EP2019/075871
§ 371 (c)(1),
(2) Date: Mar. 26, 2021

(87) PCT Pub. No.: WO2020/064839
PCT Pub. Date: Apr. 2, 2020

(65) Prior Publication Data
US 2021/0363286 A1    Nov. 25, 2021

(30) Foreign Application Priority Data

Sep. 27, 2018  (EP) .................... 18306272

(51) Int. Cl.
| | | |
|---|---|---|
| C08F 2/46 | (2006.01) | |
| C08F 2/50 | (2006.01) | |
| C08G 59/02 | (2006.01) | |
| C08G 59/22 | (2006.01) | |
| C08G 59/38 | (2006.01) | |
| C08G 59/50 | (2006.01) | |
| C08G 61/04 | (2006.01) | |
| C08J 5/24 | (2006.01) | |
| C08K 5/03 | (2006.01) | |
| C08K 5/45 | (2006.01) | |

(52) U.S. Cl.
CPC ......... *C08G 59/022* (2013.01); *C08G 59/226* (2013.01); *C08G 59/38* (2013.01); *C08G 59/5006* (2013.01); *C08G 59/5033* (2013.01); *C08J 5/249* (2021.05); *C08K 5/03* (2013.01); *C08K 5/45* (2013.01); *C08G 2150/00* (2013.01); *C08G 2170/00* (2013.01)

(58) Field of Classification Search
CPC . C08K 5/03; C08K 5/45; C08G 59/50; C08G 59/38; C08G 59/245; C08G 59/5006; C08G 59/24; C08G 59/5033; C08G 59/022; C08G 59/226; C08G 59/68; C08G 2170/00; C08G 2150/00; G03F 7/0045; C08J 5/249
USPC ............. 522/26, 7, 6, 189, 184, 71, 1; 520/1
See application file for complete search history.

(56) References Cited

U.S. PATENT DOCUMENTS

| | | |
|---|---|---|
| 4,835,193 A | 5/1989 | Hayase |
| 5,439,746 A | 8/1995 | Suzuki |
| 2005/0064333 A1 | 3/2005 | Crivello |

FOREIGN PATENT DOCUMENTS

| | | | |
|---|---|---|---|
| EP | 0195846 A2 | | 10/1985 |
| EP | 0195846 | * | 10/1986 |
| EP | 0195846 B | * | 10/1986 |
| JP | 2015165028 A | * | 9/2015 |
| WO | 2016200972 A1 | | 12/2016 |

OTHER PUBLICATIONS

Kurimura et al, JP 2015165028 Machine Translation, Sep. 17, 2015 (Year: 2015).*
Shi et al, Sep. 20, 2016, Photoinitiating systems for cationic photopolymerization ongoing push toward long wavelengths and low light intensities, Progress in Polymer Science, 65, 1-41 (Year: 2016).*
International Search Report for corresponding application PCT/EP2019075871 filed Sep. 25, 2019; Mail date Oct. 14, 2019.
Suqing Shi, "Photoinitiating Systems for Cationic Photopolymerization: Ongoing Push Toward Long Wavelengths and Low Light Intensities", Progress in Polymer Science, vol. 65, Sep. 20, 2016, pp. 1-41, XP055564454.
Written Opinion of the International Searching Authority for corresponding application PCT/EP2019075871 filed Sep. 25, 2019; Mail date Oct. 14, 2019.

* cited by examiner

*Primary Examiner* — Jessica Whiteley
(74) *Attorney, Agent, or Firm* — CANTOR COLBURN LLP

(57) ABSTRACT

The present invention relates to compositions (self-thermally) curable on demand under the triggering action of UV-visible to near-infrared irradiation of moderate intensity, method of using same for accelerated photopolyaddition of cyclic ether-amine resins or ultrafast dark curing of cyclic ether-amine resins, and articles obtained by such method. The invention also relates to a resin casting, film or coated substrate, and an adhesive layeror bonding agent, comprising acyclic ether-amine resin obtained by an accelerated curing process according to the invention. The invention additionally relates to the use of a composition of the invention for increasing the delamination strength of laminated composite materials.

21 Claims, 29 Drawing Sheets

Table 2: Computed (at uB3LYP/6-31G* level) protonic affinity reactions for the epoxy-amine compounds.

| Component | Compound | Ground state | Protonated state | Protonic affinity (kJ/mol) |
|---|---|---|---|---|
| Amine | mxda |  |  | 997.8 |
| Epoxy | BisA |  |  | 826.8 |
| | BisF |  |  | 824.2 |
| | tpte |  |  | 939.9 |

ULTRAFAST CYCLIC ETHER-AMINE PHOTOPOLYADDITION AND USES THEREOF

CROSS REFERENCE TO RELATED APPLICATIONS

This application is a National Stage application of PCT/EP2019/075871, filed Sep. 25, 2019, which claims the benefit of European Application No. 18306272.8, filed Sep. 27, 2018, both of which are incorporated by reference in their entirety herein.

FIELD OF THE INVENTION

A wipe impregnated with a chemistry solution is capable of achieving intermediate level disinfection within a short contact time and is capable of cleaning dried on soils. The wipe substrate is absorbent enough to hold and deliver sufficient liquid to thoroughly wet even large devices for the duration of the contact time but the wipe substrate does not absorb the active ingredients. The chemistry is specifically formulated with a moderate pH range of from about 8.5 to about 10.5.

BACKGROUND OF THE INVENTION

Healthcare customers working in the Central Services (CS) department are responsible for the reprocessing of the many instruments used in a healthcare setting. These instruments are received on the dirty side of the CS where they must be cleaned and disinfected before being delivered to the clean side of the CS for further processing. Typically, dirty instruments are placed in Washer/Disinfectors to go through cycles that include a cleaning phase to remove soil and a thermal rinse phase to provide intermediate level disinfection. These steps render the instrument clean and safe to handle on the clean side of the CS.

However, there are a number of heat-liable, non-submersible instruments that would be damaged by the conditions of conventional Washer/Disinfectors. These instruments must be cleaned by hand and then passed from the dirty side of the CS to the clean side through a pass-through window. This creates a need for a cleaner/disinfectant solution that is designed for use on medical devices to provide intermediate level disinfection.

Some of the currently marketed disinfectant wipe products are not one-step cleaner/disinfectors. There are many different wipe products available, but these products are not specifically labelled for use on non-submersible/heat liable medical devices. Additionally, various currently marketed products have a high pH such as from about 11.0 to about 12.5 which can negatively impact the safety profile for the user as well as the compatibility profile of the product with substrates common to medical devices.

SUMMARY OF THE INVENTION

The cleaner/disinfectant composition of the present invention has been formulated to be used for pass-through items in a Central Services department of hospitals. The formulation is designed to render instruments safe to handle on the clean side of the Central Services department. The wipe is impregnated with a chemistry solution that is capable of achieving intermediate level disinfection claims within a three-minute contact time and capable of cleaning dried on soils. Furthermore, the wipes of the present invention have the following advantages. It contains a mixture of quaternary ammonium chloride compounds of various chain lengths that allow for a broad spectrum of microbial disinfection; an alcohol co-solvent that confers broader efficacy profile and improves bioavailability of the quaternary ammonium active ingredient; an ether alcohol to enhance the antimicrobial efficacy of the product against mycobacteria; and wetting agents comprising a polyethylene glycol derivative of Cocamine having a high and low HLB value that improve the solubilization/removal of diverse soil types.

In general, a cleaner, disinfectant composition comprises a quaternary ammonium chloride disinfectant in an amount of from about 0.5 to about 3.0 wt. %; an ether alcohol comprising PPG-2 methyl ether, propylene glycol methyl ether acetate, dipropylene glycol dimethyl ether, propylene glycol phenyl ether, propylene glycol n-propyl ether, or butoxydiglycol, or any combination thereof, in an amount of from about 1.0 to about 5.0 wt. %; a wetting agent comprising ethoxylated alcohols and ethoxylated amines, independently, having from 1 to about 4 ethoxyl groups, amine oxides, block copolymers such as block copolymers of propylene oxide and ethylene oxide (20% EO), sorbitan esters, methyl esters, and PEG-2 Cocamine, or any combination thereof, having an HLB value of from about 4 to about 10 in an amount of from about 0.5 to about 3.0 wt. %; a wetting agent comprising ethoxylated alcohols and ethoxylated amines, independently, having from 7 to about 20 ethoxyl groups, ethoxylated amines, amine oxides, block copolymers such as block copolymers of propylene oxide and ethylene oxide (50% EO) polyoxyethylenated alcohol, sorbitan esters, methyl esters, and PEG-15 Cocamine, or any combination thereof, having a high HLB value of from about 11 to about 17 in an amount of from about 0.1 to about 1.0 wt. %; a short chain aliphatic alcohol having from 1 to about 3 carbon atoms in an amount of from about 35 to about 55 wt. %, and wherein the remainder is an amount of $H_2O$ that adds up to 100 wt. %.

DETAILED DESCRIPTION OF THE INVENTION

Figure 1:
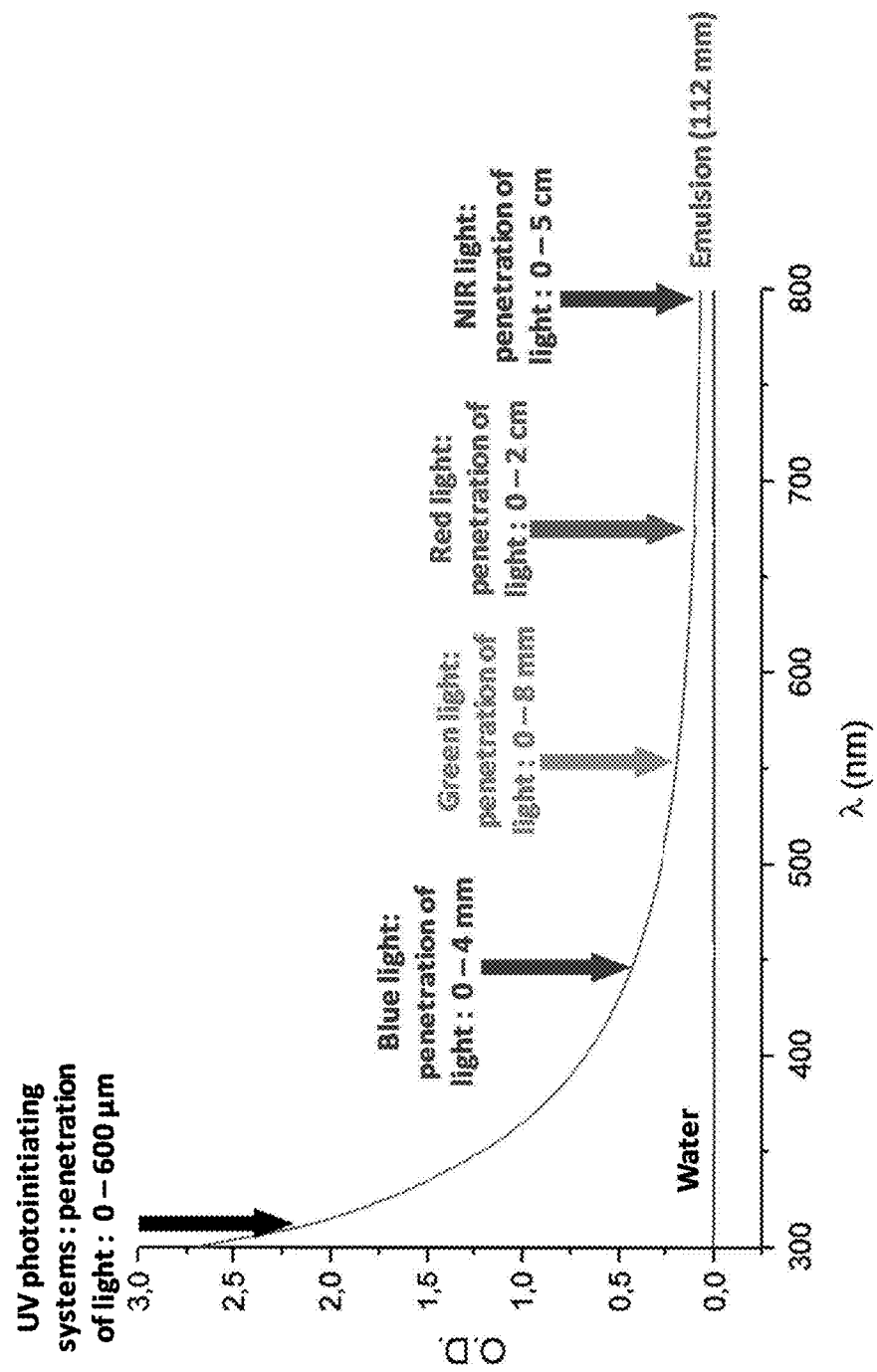
FIG. 1 illustrates the results of compatibility testing conducted on substrate coupons exposed to the indicated solution under static conditions for one week at room temperature.

The ready-to-use wipes of the present invention allow for a one-step cleaning and intermediate level disinfection of heat-liable, non-submersible medical devices, generally prior to passing these instruments to the clean side of a Central Services department of a hospital, or other medical care institution or medical instrument supply company. The wipes are absorbent enough to hold and deliver sufficient liquid to thoroughly wet even large devices for the duration of the contact time and the wipe per se does not absorb any active ingredients. These and other advantages will become apparent from the following detailed description of the preparation of the ready-to-use cleaner/disinfectant wipes of the present invention.

The composition or formulation of the present invention is generally a finely tuned system of several components such as active disinfection compounds, a short chain aliphatic alcohol that boosts the efficacy profile against organisms, an alkalinity source, an ether alcohol that enhances the antimicrobial efficacy of the product against mycobacteria, wetting agents and cleaning profile compounds, as well as a pH adjuster.

Hereinafter, numerous compounds are set forth that comprise the formulation of the ready to use cleaner/disinfectant wipe product of the present invention. With respect to the various chemical compounds, the amount thereof is given in wt. % with the same of each individual compound being based upon 100 wt. %, or 100 parts by weight of the total composition formulation. Any active amount of a particular compound refers to the weight percent of active ingredient within the compound per se, that is the actual given weight percent of a compound utilized in the formulation of the present invention.

A suitable disinfect is various quaternary ammonium chlorides that are well known to the art and to the literature. A particularly useful active ingredient ammonium compound is a mixture by weight, of four quaternary ammonium chlorides as follows: 20% alkyl (C14 50%, C12 40%, C16 10%) dimethyl benzyl ammonium chloride, 15% octyl decyl dimethyl ammonium chloride, 6% dioctyl dimethyl ammonium chloride and 9% didecyl dimethyl ammonium chloride. This disinfectant has an active compound content of approximately 50% to 52% by weight and also contains approximately 10% by weight of ethyl alcohol with the remainder being water. This material is commercially available as Bardac 205M, manufactured by Lonza of Basel, Switzerland. It is EPA registered with respect to being a suitable hard surface disinfectant. In addition to these compounds, other suitable quaternary ammonium compounds include n-alkyl dimethyl ethylbenzyl, ammonium chloride, n-akyl trimethyl ammonium chloride, dimethyloctadecyl[3-(trimethyoxsilylpropyl) ammonium chloride, or polymeric quaternary ammonium chlorides, or any combination thereof.

The total amount of the one or more quaternary compounds that is utilized in the present invention is generally from about 0.5 wt. % to about 3.0 wt. %, desirably from about 0.7 wt. % to about 2.5 wt. %, and preferably from about 0.8 wt. % to about 2.2 wt. %.

Another compound of the present cleaner/disinfectant wipe for intermediate level disinfection comprises a short chain aliphatic alcohol having from about 1 to about 3 carbon atoms such as methyl alcohol, ethyl alcohol, propyl alcohol, or isopropyl alcohol, wherein isopropyl alcohol is preferred, or any combination thereof. The purpose of the alcohol is to increase the efficacy profile of the wipe against certain organisms as well as improve the chemical and physical stability of the formulation. The alcohol is generally utilized in large amounts such as from about 35 to about 55 wt. %, desirably from about 40 to about 50 wt. %, and preferably from about 42 to about 48 wt. %. The alcohol is considered an active component of the wipe formulation or composition and generally exists in the noted high active amounts thereof, such as about 100 wt. %.

Optionally, but desirably, one or more alkalinity sources is utilized to boost the buffering capacity of the formulation in amounts of such as from about 0.1 to about 2.0 wt. %, desirably from about 0.2 to about 1.5 wt. %, and preferably from about 0.3 to about 1.0 wt. %. Examples of suitable alkalinity compounds include monoethanol amine, triethanol amine, potassium hydroxide, sodium hydroxide, calcium carbonate/bicarbonate, sodium carbonate/bicarbonate, 2-amino-2-methyl-1-propanol, or monoisopropanolamine, wherein monoisopropanolamine is preferred, or any combination thereof. Amounts in excess of the broad noted range generally caused the product to be outside the optimal pH range which can negatively impact the overall safety profile and compatibility profile of the product.

Another component of the cleaner/disinfectant wipe formulation of the present invention is an ether alcohol that enhances the antimicrobial efficacy of the product against mycobacteria. Suitable compounds include PPG-2 methyl ether, propylene glycol methyl ether acetate, dipropylene glycol dimethyl ether, propylene glycol phenyl ether, or propylene glycol n-propyl ether, wherein butoxydiglycol is preferred, or any combination thereof. Suitable amounts thereof generally range from about 1.0 to about 5.0 wt. %, desirably from about 2.5 to about 4.0 wt. %, and preferably from about 3.0 to about 3.5 wt. %. An excess of this material outside of the above ranges generally negatively impacts the products compatibility profile whereas an undercharge thereof will negatively impact the product's antimicrobial efficacy profile.

Wetting agents are desired since they contribute to the wetting and cleaning profile of the product. Suitable wetting agents generally have a high HLB (hydrophilic-lipophilic balance) of from about 11 to about 17 and preferably from about 14 to about 16. Such compounds include ethoxylated alcohols and ethoxylated amines; independently, having 7 to 20 and preferably from 9 to 15 ethoxyl groups, amine oxides such as Lauramine oxide and Cocamidopropyl amine oxide, block copolymers such as block copolymers of propylene oxide and ethylene oxide (50% EO), Poloxamer 235, Poloxamer 184, Meroxapol 105, Meroxapol 174, polyoxyethylenated alcohol (C9-11 Pareth 8), sorbitan esters, methyl esters, and PEG-15 Cocamine, or any combination thereof. A preferred high HLB wetting agent is PEG-15 Cocamine. Suitable amounts thereof generally range from about 0.1 to about 1.0 wt. %, desirably from about 0.1 to about 0.5 wt. %, and preferably from about 0.2 to about 0.4 wt. %. A significant undercharge can negatively impact the product's cleaning performance against polar soils. Moreover, it is noted that significant overcharges or undercharges can negatively impact the antimicrobial efficacy profile.

Another wetting agent that has a moderately low HLB (hydrophilic-lipophilic balance) are various compounds such as ethoxylated alcohols and ethoxylated amines, independently, having from 1 to 4 ethoxy groups, amine oxides such as Stearamine oxide, block copolymers propylene oxide and ethylene oxide (20% EO), Poloxamer 182, Poloxamer 101, Meroxapol 172, Meroxapol 252, polyether polyols, sorbitan esters, and methyl esters and the like with HLBs from about 4 to about 10, and desirably from 5 to about 7, or any combination thereof. A preferred low HLB compound is PEG-2 Cocamine. Suitable amounts thereof generally range from about 0.5 to about 3.0 wt. %, desirably from about 1.0 to about 2.0 wt. %, and preferably from about 1.2 to about 1.8 wt. %. Similar to the PEG-15 Cocamine, a significant undercharge can impact the product negatively with respect to cleaning performance thereof against nonpolar soils. Moreover, overcharges or undercharges can also negatively impact the antimicrobial efficiency thereof.

With regard to the pH adjuster, generally many different types of pH adjusters can be utilized such as phosphoric acid, hydrocholoric acid, glycolic acid, oxalic acid, lactic acid, formic acid, and the like, or any combination thereof. A preferred pH adjuster is citric acid which can be supplied either in liquid form or as a 100% active solid powder. General amounts thereof are from about 0.025 to about 0.500 wt. %, desirably from about 0.050 to about 0.300 wt. %, and preferably from about 0.100 to about 0.25 wt. %. Significant overcharge of this material can cause a pH to be too low and thus negatively impact the product's antimicrobial efficacy profile. Moreover, undercharges can also cause the product pH to be elevated which can result in damage to delicate instrumentation and negatively impact the safety profile.

The remaining portion of the above-noted compounds that comprise Formula 1 of the present application is Deionized water as in an amount that add up to a total 100% or 100 total parts by weight, typically about 47.26 wt. % or parts by weight. However, in another embodiment, i.e. Formula 2 as set forth hereinbelow, hexylene glycol can be partially substituted for water, or a cosolvent in various suitable amounts such as approximately 7.5 wt. %.

With respect to the wipes, the one step cleaner disinfectant solution is saturated thereon to increase the ease of use of the product. The wipes are made of a non-cellulose based substrate to ensure the quaternary ammonium active ingredient is not adsorbed to the wipe. Examples of suitable materials of construction for the wipe are polyester, polypropylene, polyurethane, or similar materials, or any combination thereof; and the like. Additionally, the wipe substrate is manufactured to be 35 to 50 grams per square inch with an aperture pattern that allows for increased surface area. The higher weight of the wipe along with the aperture pattern helps to increase the amount of liquid the wipe can deliver. Alternatively, the disinfectant solution can be used to saturate a sponge made of non-cellulose material. Examples of suitable sponge materials of construction are polyester, polypropylene, or polyurethane, or similar materials, or any combination thereof, and the like.

The following formulations are preferred formulations of the various compounds of the present invention and it is to be understood that many variations thereof are also suitable.

Preferred wipe cleaner/disinfectant formulation.

TABLE 1

| Material* | Formula 1 (as wt. %) | Formula 2 (as wt. %) |
| --- | --- | --- |
| Deionized Water | 47.2600 | 40.4100 |
| Bardac 205M, 50% active | 2.0000 | 1.5000 |
| Monoisopropanolamine | 0.5000 | 0.5000 |
| PEG-15 Cocamine | 0.3000 | 0.1500 |
| PEG-2 Cocamine | 1.5000 | 1.5000 |

TABLE 1-continued

| Material* | Formula 1 (as wt. %) | Formula 2 (as wt. %) |
| --- | --- | --- |
| Butoxydiglycol | 3.2500 | 3.2500 |
| Hexylene Glycol | 0.0000 | 7.5000 |
| Isopropyl Alcohol | 45.0000 | 45.0000 |
| Citric Acid | 0.1900 | 0.1900 |

*All compounds except for Bardac are 100% active.

The above invention will be better understood by reference to the following examples which serve to illustrate the present invention but not to limit the scope thereof.

Cleaning Study

A blood/protein-based soil was applied onto stainless steel coupons and allowed to dry at 50° C. for 1 hour. The coupons with dried soil were removed from the oven and allowed to cool to room temperature. Once cooled, the coupons were wiped with wipes saturated in the present invention or a commercially available competitive product. The amount of time required to completely remove the dried-on soil was recorded for three replicates. The results are reported as an average of the replicates. From the data it can be seen that Formula 1 was able to remove the soil more quickly than the currently available products. This is due to the superior surfactant system present in Formula 1

TABLE 2

| Product Used for Cleaning | Average time Required to Completely Remove 0.50 mL of Dried on Blood/Protein Soil (seconds) |
| --- | --- |
| Formula 1 | 26 |
| Competitive Product #1 | 33 |
| Competitive Product #2 | 33 |
| Competitive Product #3 | 60 |
| Competitive Product #4 | 32 |
| Competitive Product #5 | 33 |

The test method with regard to bacteria/fungal was according to AOAC official Method 961.02 whereas the virus testing was according to ASTM international test method designated E1053-20. *M. bovis* according to AOAC official Method 965.12.

TABLE 3

| Study Description | Product(s) Tested | Results | Notes |
| --- | --- | --- | --- |
| GLP *M. bovis* Qualitative Towelette Test | Formula 1: Formula 2: | Formula 1; *M. Bovis* All Lots = No Growth; passed<br>Formula 2; *M. Bovis* All Lots = No Growth; passed | Contact Time: 2 min 45 sec, dirty conditions |
| GLP Bacterial and Fungal Towelette Test | Formula 1: | *P. aeruginosa*/*S. aureus*: All Lots = No Growth; passed<br>MRSA: All Lots = No Growth; passed<br>VRE: All Lots = No Growth; passed<br>*T. interdigitale*: All Lots = No Growth; passed<br>*S. epidermidis*: All Lots = No Growth; passed<br>*E. cloacae*: All Lots = No Growth; passed<br>*S. marcescens*: All Lots = No Growth; passed<br>*M. yunnanensis*: All Lots = No Growth; passed<br>*B. cepcia*: All Lots = No Growth; passed<br>*S. pyogenes*: All Lots = No Growth; passed<br>*L. monocytogenes*: All Lots = No Growth; passed<br>*C. albicans*: All Lots = No Growth; passed | Contact Time: 2 min 45 sec, dirty conditions |

TABLE 3-continued

| Study Description | Product(s) Tested | Results | Notes |
|---|---|---|---|
| GLP Viral Towelette Test | Formula 1 | HIV-1: passed<br>Influenza A2: passed<br>Adenovirus Type 2: passed<br>Avian Influenza Virus: passed<br>Poliovirus: passed<br>Duck Hepatitis B Virus: passed<br>Bovine Viral Diarrhea Virus: passed<br>Feline calicivirus: passed | Contact Time: 2 min 45 sec, dirty conditions |

Antimicrobial efficacy testing was conducted with Formula 1 by an independent, third-party testing laboratory.

TABLE 4

| Product Contact Time | Formula 1 (Replicate 1) 2.75 min | Formula 1 (Replicate 2) 2.75 min | Formula 1 (Replicate 3) 2.75 min | Competitive Product #1 3 min | Competitive Product #2 2 min | Competitive Product #3 2 min | Competitive Product #4 1 min | Competitive Product #5 10 min |
|---|---|---|---|---|---|---|---|---|
| CFU on Filter after 14 day incubation | | | | | | | | |
| 1 | 0 | 0 | 0 | TNTC | TNTC | TNTC | TNTC | TNTC |
| 2 | 0 | 0 | 0 | TNTC | TNTC | TNTC | TNTC | TNTC |
| 3 | 0 | 0 | 0 | TNTC | TNTC | TNTC | TNTC | TNTC |
| 4 | 0 | 0 | 0 | TNTC | TNTC | TNTC | 2 | TNTC |
| 5 | 0 | 1 | 0 | TNTC | TNTC | TNTC | TNTC | TNTC |
| 6 | 0 | 0 | 0 | TNTC | TNTC | TNTC | TNTC | TNTC |
| 7 | 0 | 0 | 10 | TNTC | TNTC | TNTC | TNTC | TNTC |
| 8 | 0 | 14 | 0 | TNTC | TNTC | TNTC | 21 | TNTC |
| 9 | 1 | 0 | 4 | TNTC | TNTC | TNTC | TNTC | TNTC |
| 10 | 0 | 0 | 6 | TNTC | TNTC | TNTC | TNTC | TNTC |

This testing was performed to establish the efficacy profile of Formula 1 over a broad spectrum of organisms included in the *mycobacterium*, gram-negative/gram-positive bacteria, fungi, and virus classes. All studies were performed under GLP using test methods recognized by the US Environmental Protection Agency (EPA) which certifies disinfectant products. The bactericidal/fungicidal testing was conducted according to AOAC official Method 961.02 whereas the viricidal testing was performed according to ASTM international test method designated E1053-20. The testing for the *mycobacterium* species was done according to AOAC official Method 965.12. From the testing result in Table 3, it is apparent that Formula 1 has the efficacy profile of an intermediate level disinfectant.

Efficacy Against *M. terrae*

Efficacy testing was conducted against commercially available products using *Mycobacterium terrae* as a surrogate for *Mycobacterium bovis* (target organisms for intermediate level disinfection claims.). Formula 1 was tested at its EPA Lowest Certified Limit (LCL) for each active ingredient.

Glass Slides inoculated with *M. terrea* under 5% organic soil conditions were wiped with the indicated product and allowed to dwell for the products label indicated contact time. After the contact time, the slides were placed in a neutralizer solution to quench the active ingredients. The neutralizer solution was filtered through a 0.2 µm filter which was incubated for 14 days at 37° C. The number of colonies present on the filters were counted. To Numerous To Count (TNTC) Designation for filters with greater than 200 Colony Forming Units (CFU).

Formula 1 shows no to low counts for each slide whereas the commercially available products show greater than 200 CFU on all or most of the slides. Formula 1 even outperforms the competitive products with longer contact times suggesting an overall superior efficacy profile.

Compatibility Testing

As shown in FIG. 1, compatibility testing was conducted with each substrate coupon exposed to the indicated solution under static conditions for one week at room temperature. Upon completion of the study, the wipe was removed, the coupon rinsed, and then observed for visual changes. The coupons exposed to Formula 1 and Formula 2 show no visual changes as compared to the coupons exposed to the commercially available wipe solution which caused visual damage to all three soft metals.

While in accordance with the Patent Statutes, the best mode and preferred embodiments have been set forth, the scope of the invention is not limited thereto, but rather, by the scope of the attached claims.

PRIORITY

This PCT Application claims priority to European Patent Application no. EP 18306272.8 filed on 27 Sep. 2018; the entire contents of each of which are hereby incorporated by reference.

FIELD OF THE INVENTION

The present invention relates to compositions (self-thermally) curable on demand under the triggering action of UV-visible to near-infrared irradiation of moderate intensity, method of using same for accelerated photopolyaddition of cyclic etheramine resins or ultrafast dark curing of cyclic ether-amine resins, and articles obtained by such method. The invention also relates to a resin casting, film or coated substrate, and an adhesive layer or bonding agent, comprising a cyclic ether-amine resin obtained by an accelerated curing process according to the invention. The invention additionally relates to the use of a composition of the invention for increasing the delamination strength of laminated composite materials.

In what follows, the numbers between brackets ([ ]) refer to the List of References provided at the end of the document.

BACKGROUND OF THE INVENTION

Epoxy resins are widely used throughout the world. Their global market volume is expected to reach 450 kilo Tons in 2021 (about 11.2 billion $). They can be used in combination with amine hardeners through the very well established epoxy-amine reaction, and they have many applications in adhesives, paints, coatings, wind energy, composites, construction, electronics, . . . . One of the main drawbacks of this material's production (from liquid/viscous to a functional solid) is the slow kinetics of this epoxy-amine polyaddition reaction e.g. 3 hours for state of the art bisphenol A/F and trifunctional crosslinking epoxide mixed with m-xylylene-diamine difunctional aliphatic amine at room temperature (RT, Scheme 1).

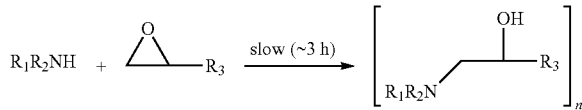

On the other hand, materials produced by photopolymerization can be produced very quickly (<10 min). However, one important drawbacks resides in the fact that it touches a very limited variety of resin structures (acrylates, pure epoxides, thiol-ene, . . . ). The vast majority is photopolymerized by free radical polymerization (for example acrylates) which induces a very strong shrinkage and limits the interest of these resins. However, epoxy-amine resins are not obtainable by this existing photopolymerization technique. In addition, the adhesion properties of existing photopolymerizable resins are not competitive with those of epoxy/amine resins on most surfaces/substrates. Therefore, there remains a need for the development of new systems and methods for producing epoxy-amine resins, and cyclic ether-amine resins in general, with a very short curing time (minutes, as opposed to hours).

BRIEF DESCRIPTION OF THE DRAWINGS

FIG. 1. UV-vis diffusion of light for a polystyrene latex (112 nm of average diameter) and calculated light penetrations of selected photons.

Figure 2A:
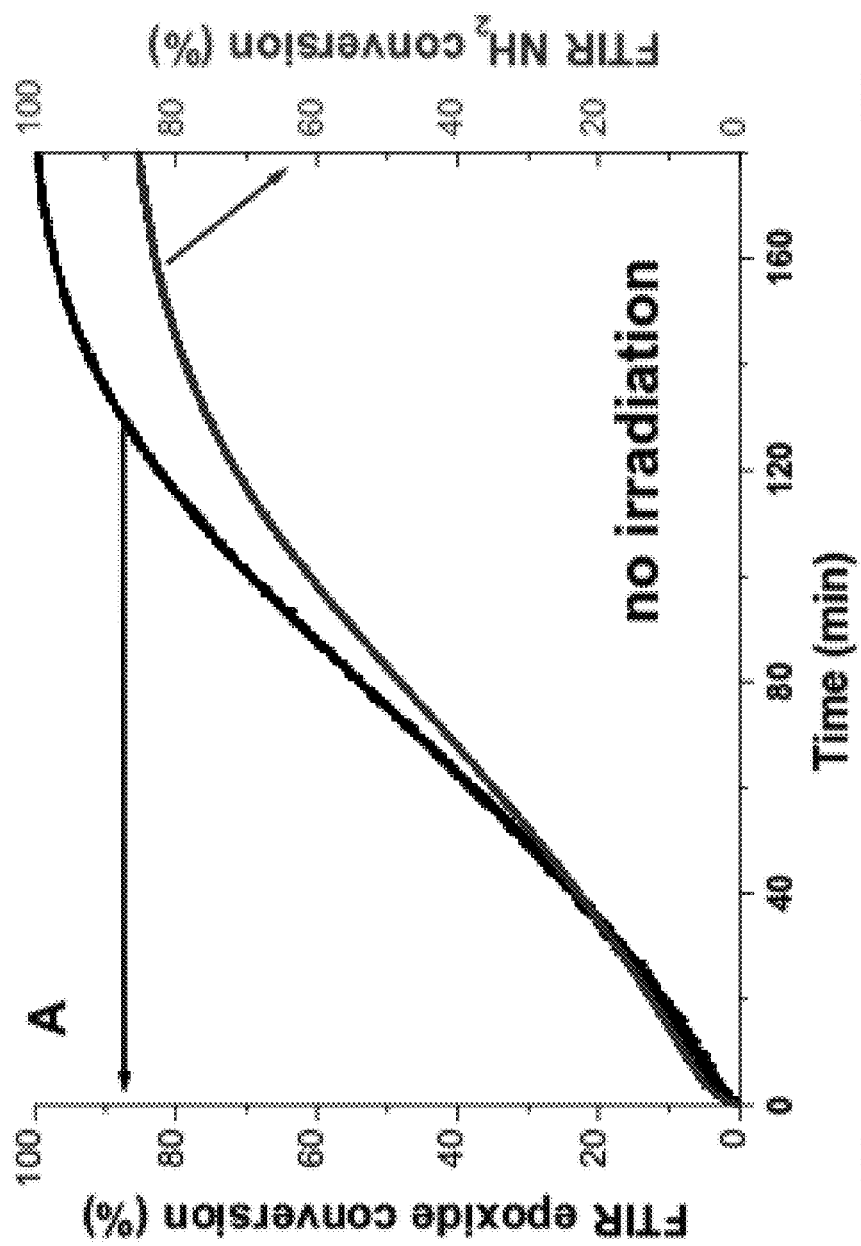
Figure 2B:
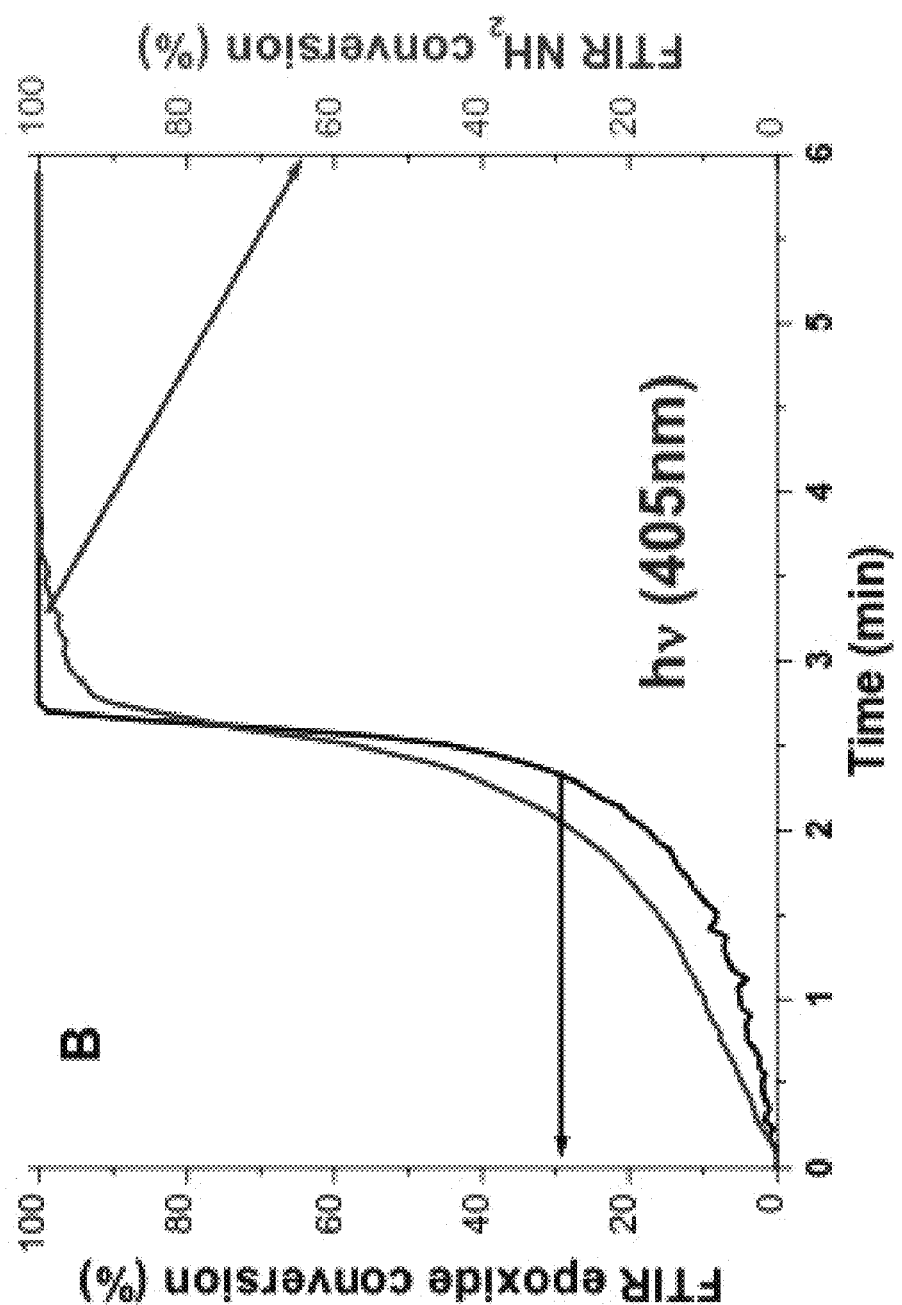

FIG. 2A and FIG. 2B. shows photoacidic enhancement of epoxy-amine polyaddition reaction. Real-time Fourier transformed infrared spectroscopy (RT-FTIR) monitoring of the epoxy/amine reaction (primary amine ($NH_2$) and epoxide conversion vs time, 1.4 mm sample) without (no irradiation) and with 1 wt % CPTX, 2 wt % Iod under Laser Diode (LD@405 nm) excitation (hv (405 nm), 450 mW/cm$^2$).

Figure 3:
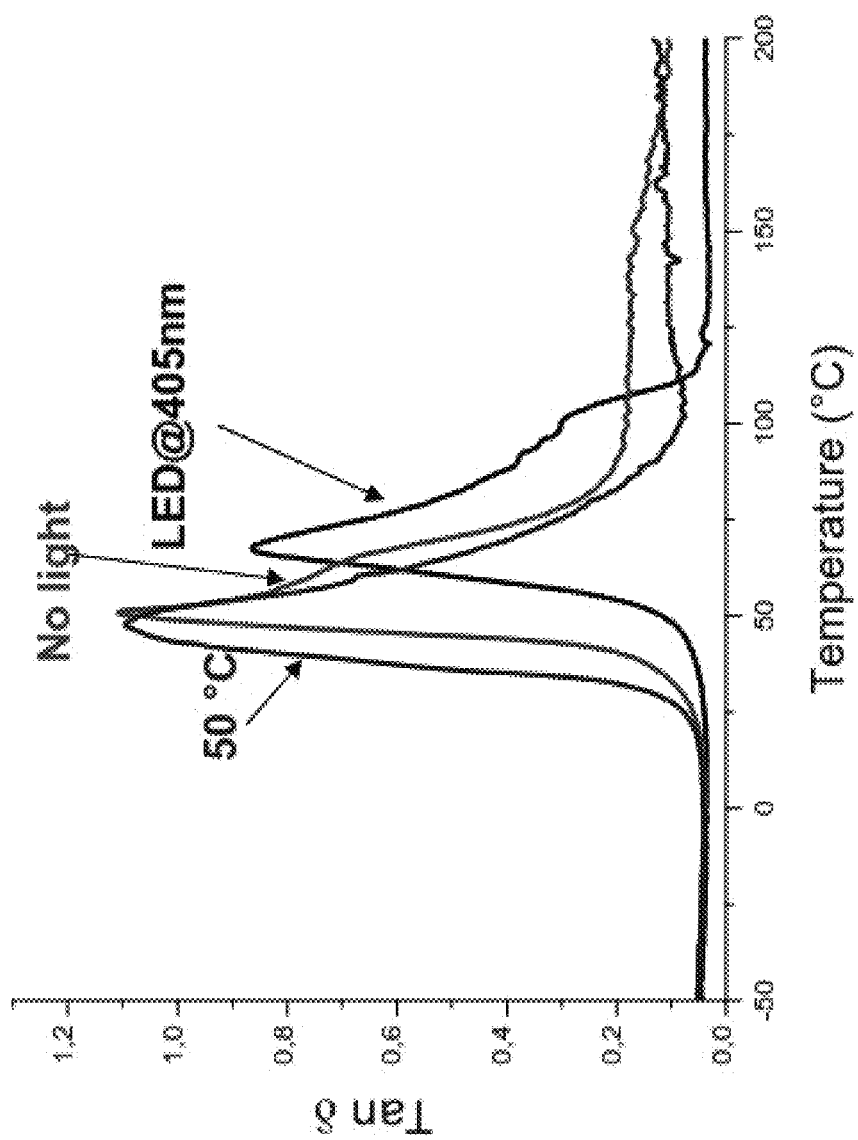

FIG. 3. shows a dynamic mechanical analysis (DMA) of tan S for experiments: normal polyaddition without light (NL at RT), normal polyaddition heated (50° C.) and epoxy-amine Photopolyaddition (1 wt % CPTX, 2 wt % Iod, LED@405 nm: 210 mW/cm$^2$).

Figure 4A:
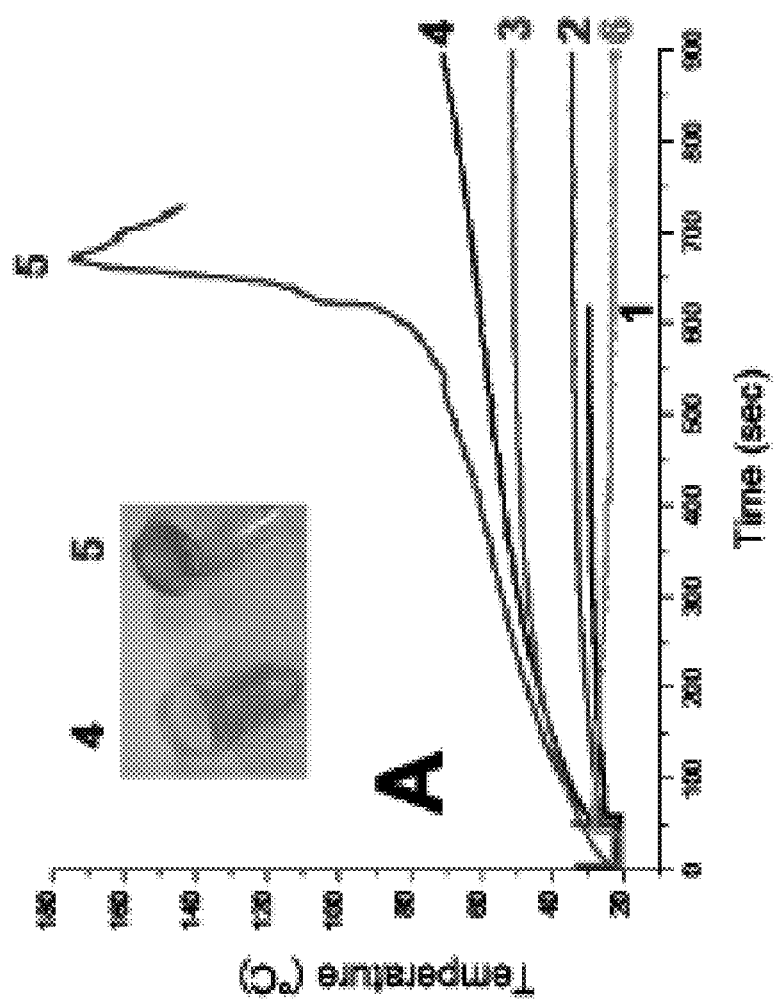
Figure 4B:
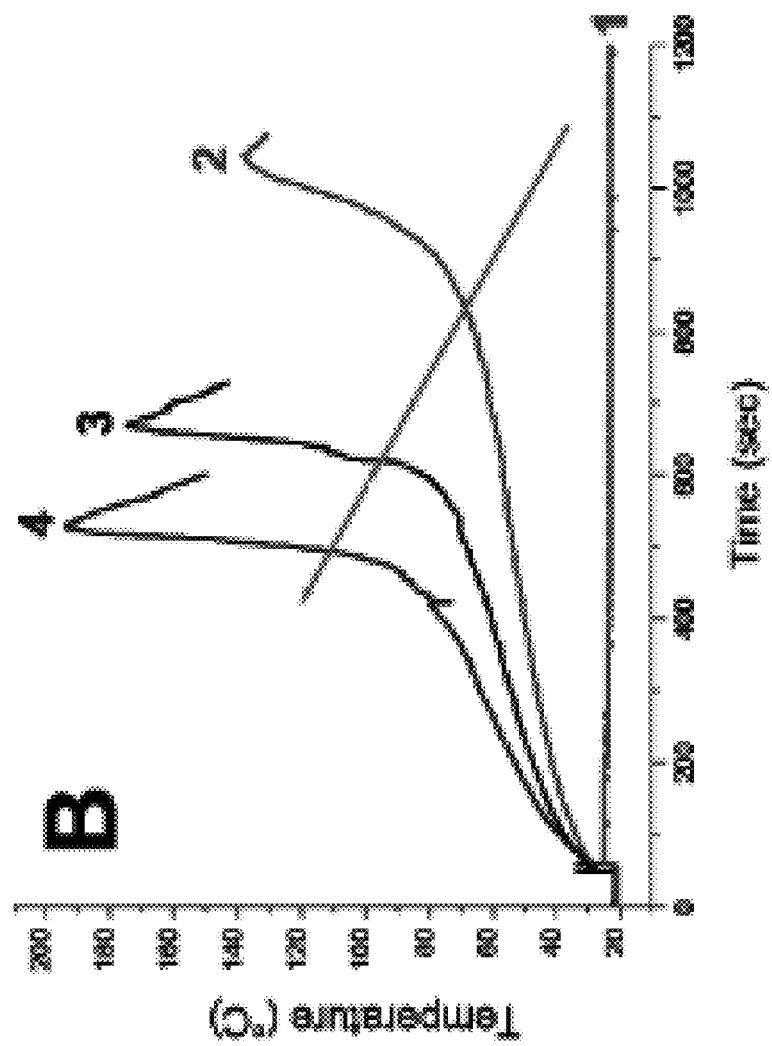

FIG. 4A and FIG. 4B: shows thermal imaging monitoring (Temperature vs time, 4 mm sample) monitoring of epoxy-amine Photopolyaddition for (if mentioned) 1 wt % CPTX and 2 wt % Iod. Mixing stops at t=45 sec when irradiation starts. A: Irradiation by LED@405 nm (210 mW/cm$^2$, 15 minutes); 1: no additives; 2: Iod added; 3: CPTX added in epoxy, no amine component. 4: CPTX added. 5: CPTX and Iod added; 6: CPTX and Iod added, no irradiation. B: CPTX+Iod for LED@405 nm irradiances: 1 (no irradiance); 2 (150 mW/cm$^2$); 3 (210 mW/cm$^2$); 4 (300 mW/cm$^2$).

Figure 5A:
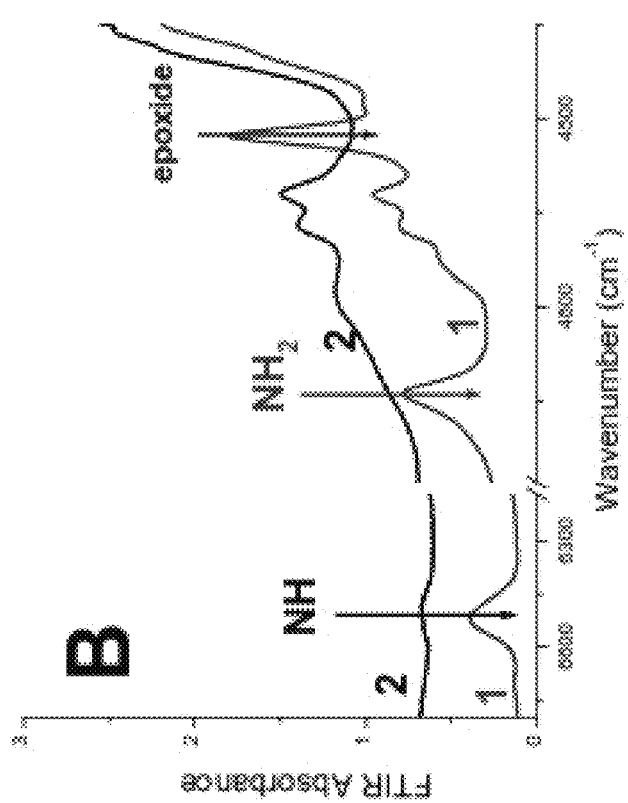
Figure 5B:
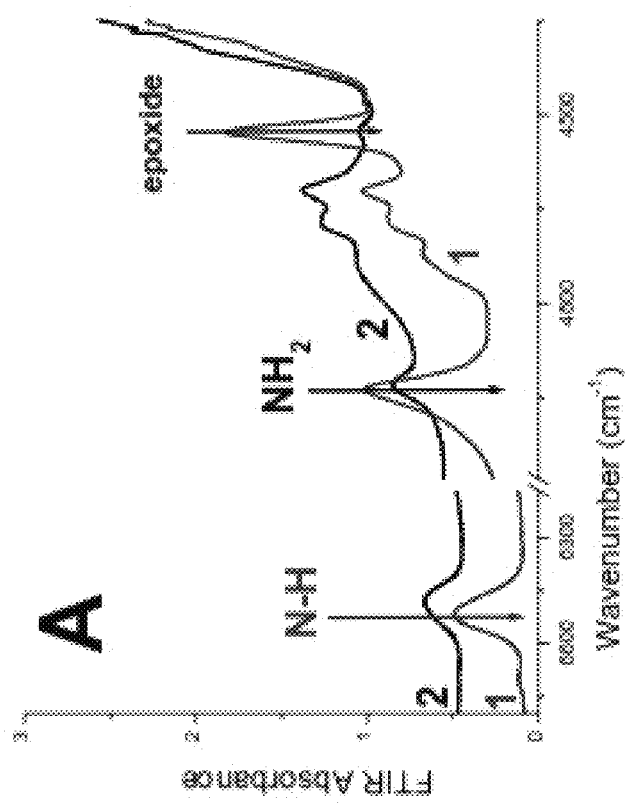
Figures 5C, 5D:
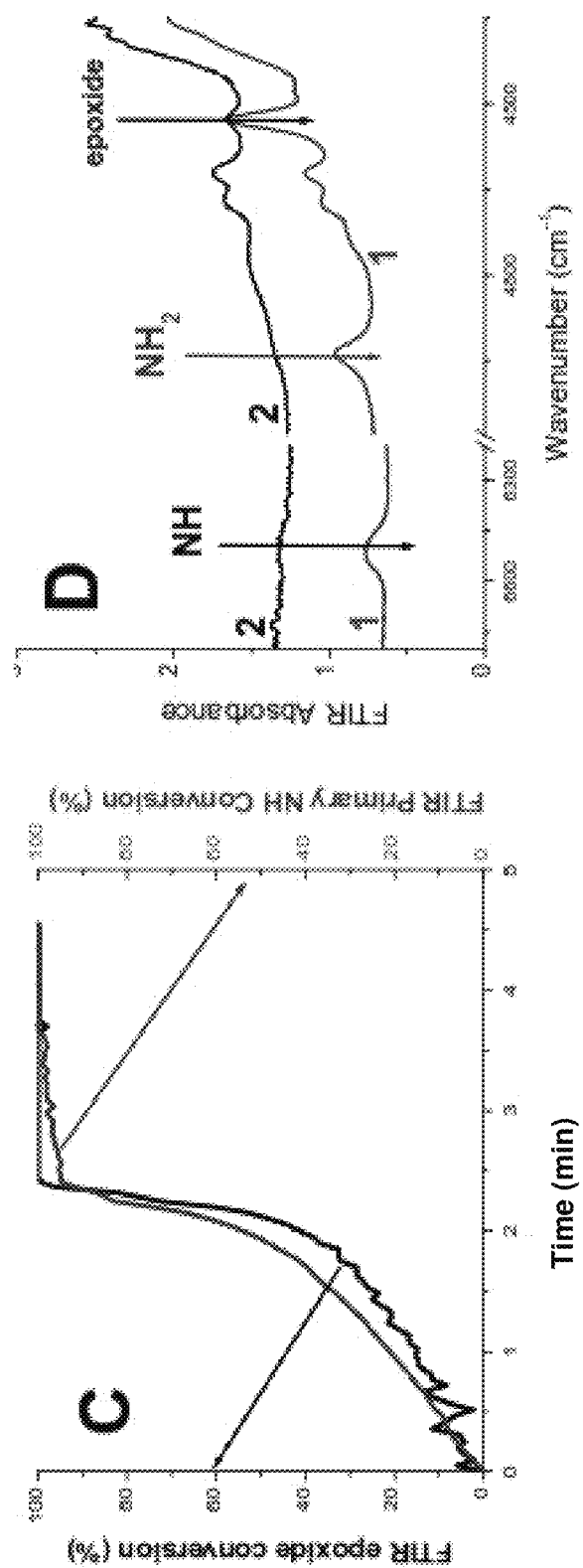
Figure 5F:
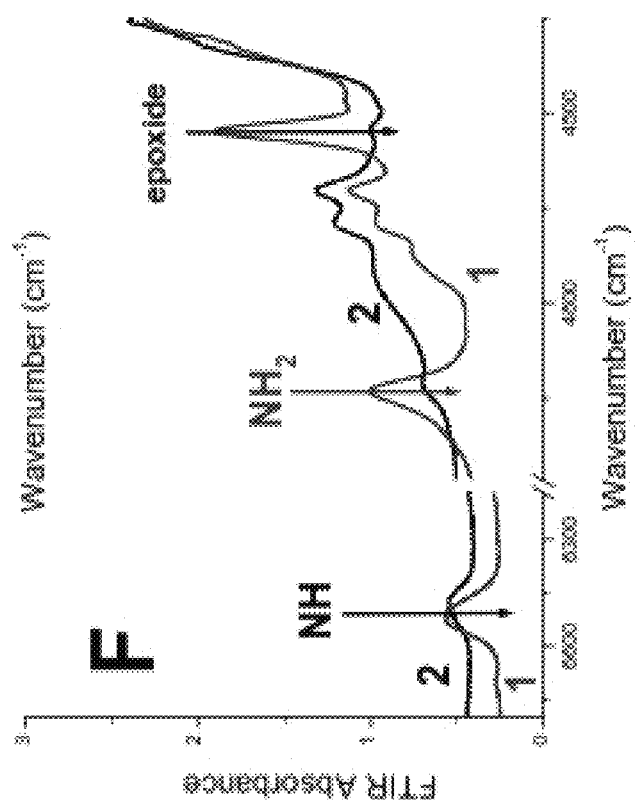
Figure 5E:
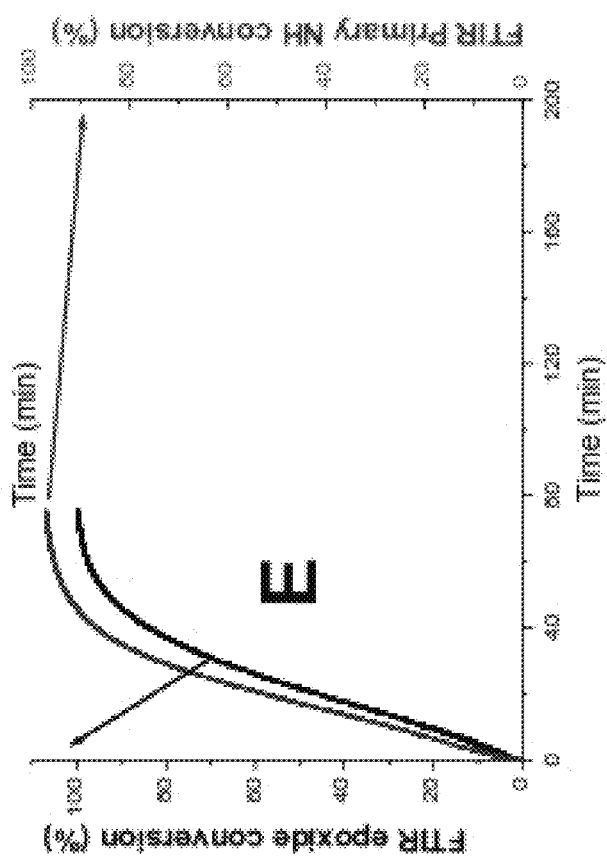

FIG. 5A, FIG. 5B, FIG. 5Cm FIG. 5D, FIG. 5E, and FIG. 5F: shows real-time Fourier transformed infrared spectroscopy (RT-FTIR) monitoring of the epoxy/amine reaction (Primary ($NH_2$), primary and secondary (NH) amines and epoxide conversion vs time, 1.4 mm sample) for (if mentioned) 1 wt % CPTX, 2 wt % Iod. C, E: kinetics for CPTX+Iod Photopolyaddition C under LD@405 nm (450 mW/cm$^2$) and E: under LED@405 nm (110 mW/cm$^2$). A, B, D, F: 1 Spectra at the beginning and 2 at the end of the RT-FTIR kinetics: A for FIG. 2, no irradiation; B for FIG. 1, LD@405 nm; D for FIG. 4C; F for FIG. 4E.

FIG. 6A, FIG. 6B, FIG. 6C, and FIG. 60: shows real-time Fourier transformed infrared spectroscopy (RT-FTIR) monitoring of the epoxy/amine reaction (Primary ($NH_2$), primary and secondary (NH) amines and epoxide conversion vs time, 1.4 mm sample) under LD@405 nm irradiation (450 mW/cm$^2$). B: kinetics for 0.55 wt % CPTX+1.1 wt % Iod+45 wt % barium glass fillers Photopolyaddition under LD@405 nm (450 mW/cm$^2$). A, C: 1 Spectra at the beginning and 2 at the end of the RT-FTIR kinetics: A: for 40 μm thin samples (1 wt % CPTX/2 wt % Iod) C for FIG. 5B. D: Parallel between thermal imaging data (Temperature of the sample inside the RT-FTIR vs time) and RT-FTIR epoxide conversion (see conditions in FIG. 5C).

Figure 7A:
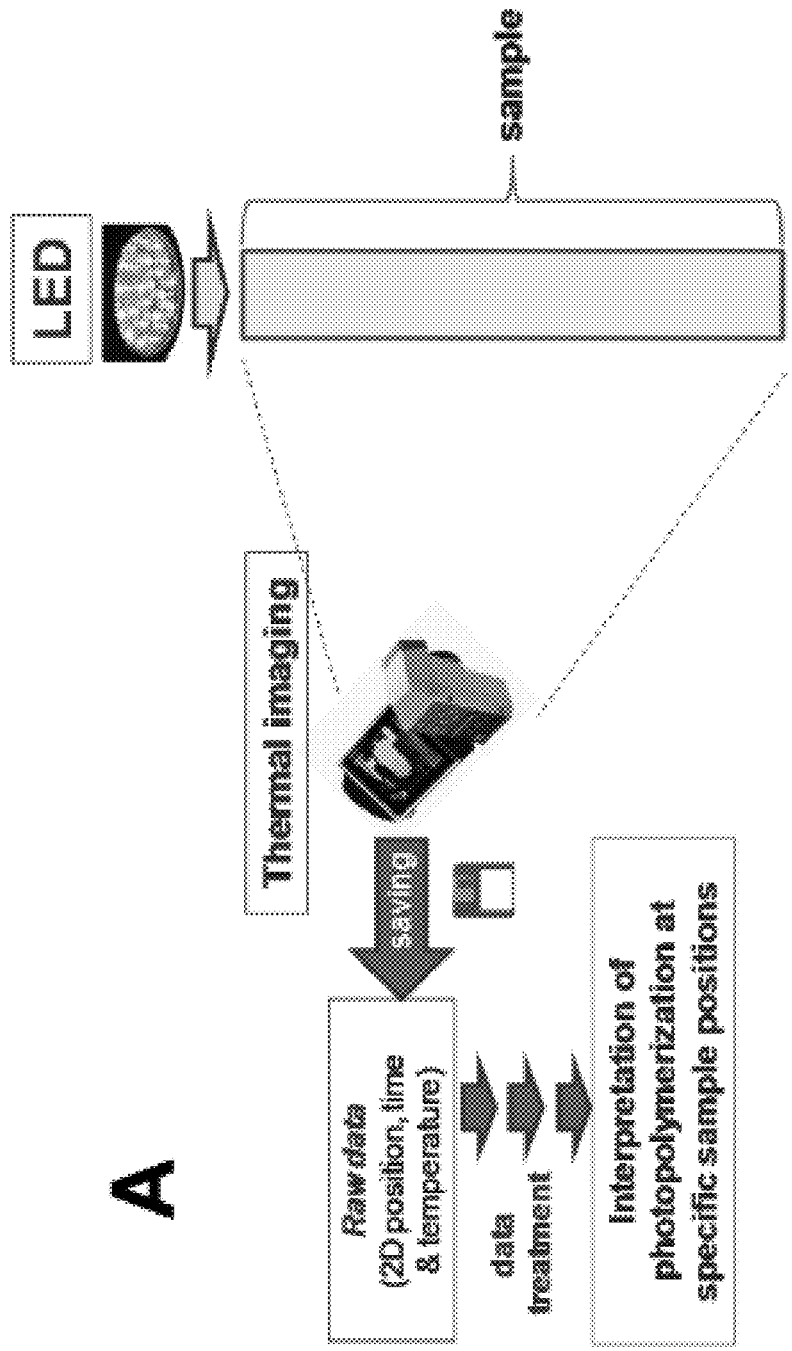
Figures 7B, 7C:
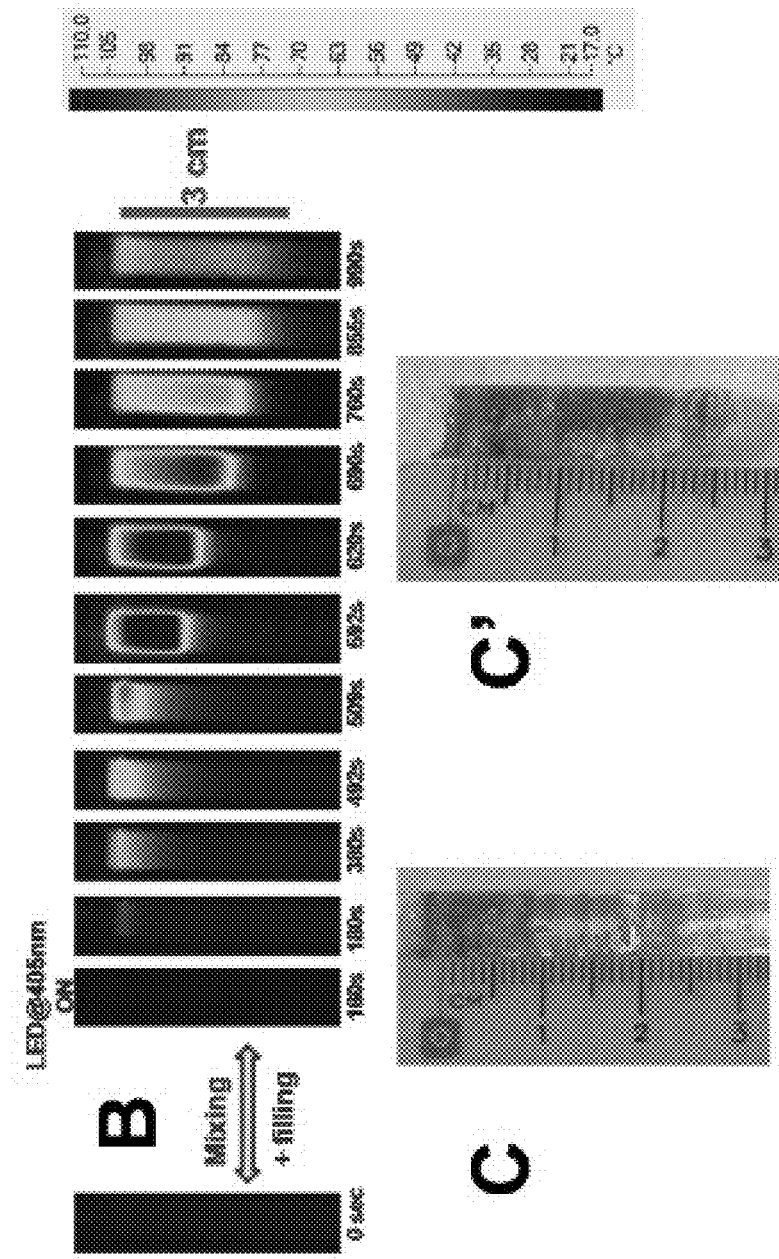

FIG. 7A, FIG. 7B, FIG. 7C, and FIG. 7C': shows thermal imaging monitoring of very deep (2.6 cm) epoxy-amine Photopolyaddition under LED@405 nm (230 mW/cm$^2$, irradiation on the top of the sample). A: experimental set-up to follow the polymerization propagation in depth from thermal imaging experiments (see full study[1]). B: Thermal imaging monitoring of very thick samples epoxy-amine Photopolyaddition (the irradiation starts at t=160 sec), for 1 wt % CPTX and 2 wt % Iod. C: Pipette before breaking surrounding glass and C': Photopolyaddition material after breaking glass.

Figure 8A:
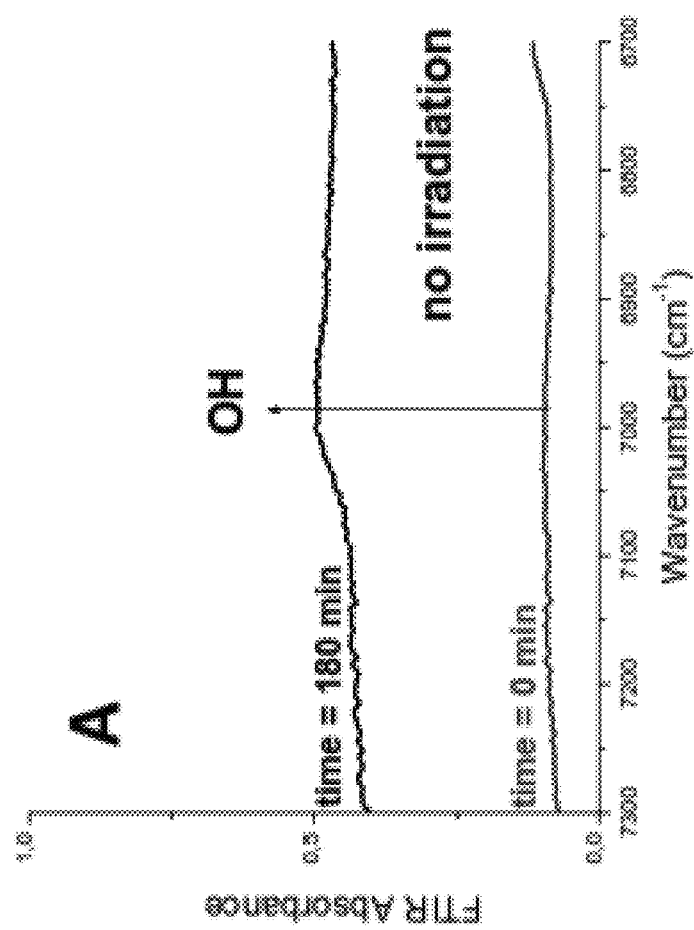
Figure 8B:
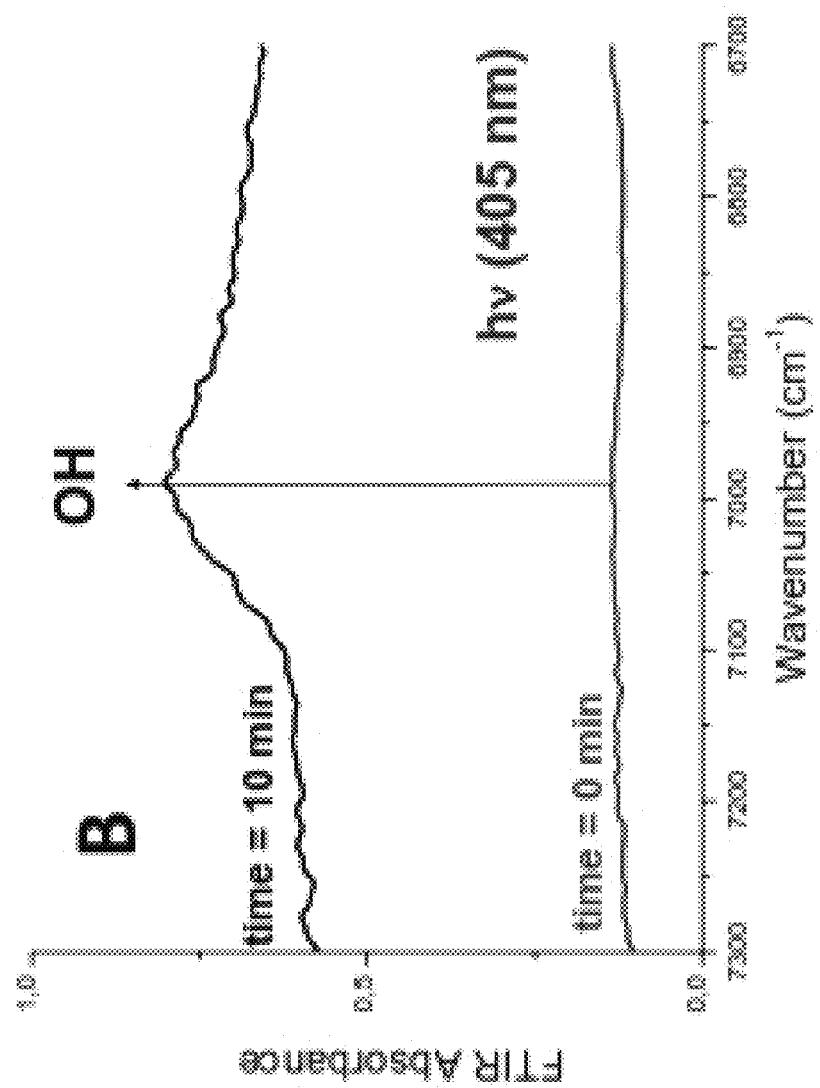

FIG. 8A and FIG. 8B: shows hydroxyl FTIR Absorbance (before and after curing) for the experiment described in FIG. 2.

Figure 9:
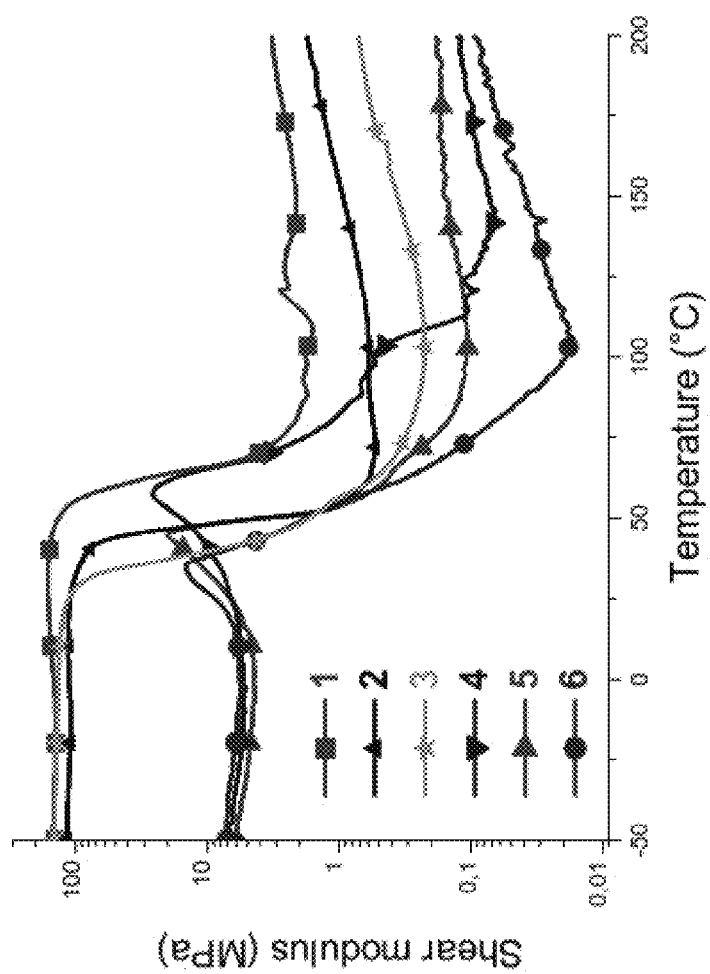

FIG. 9: shows dynamic mechanical analysis (DMA) for experiments: 1: G', and 4: G", for LED@405 nm (210 mW/cm$^2$, 4 mm samples), 1 wt % CPTX+2 wt % Iod; 2: G', and 5: G", for slow polyaddition without light; 3: G', and 6: G", for slow polyaddition without light at 50° C.

Figure 10A:
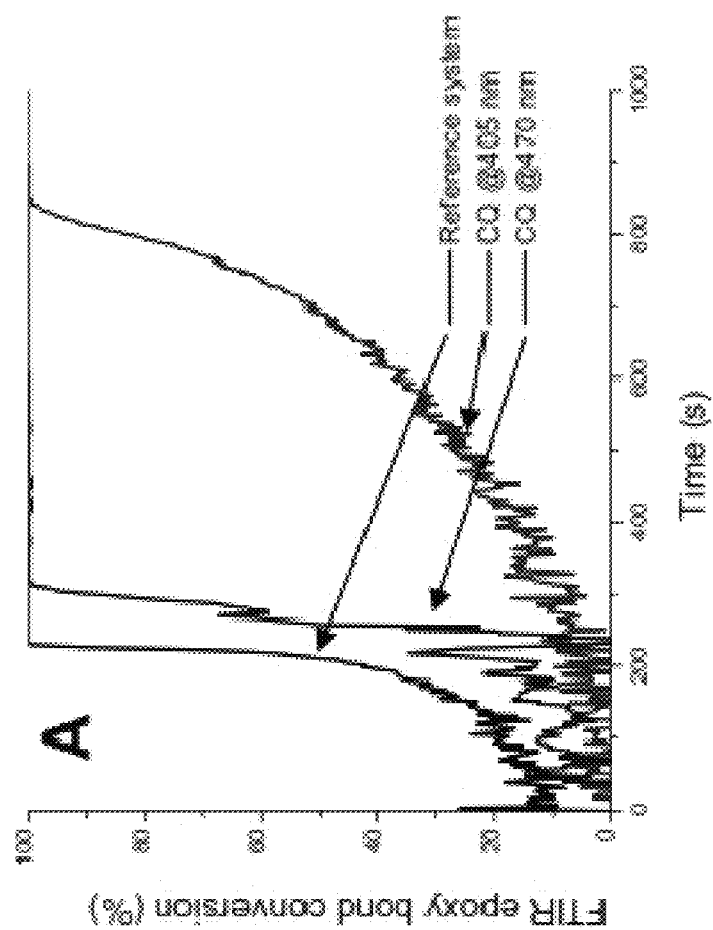
Figure 10B:
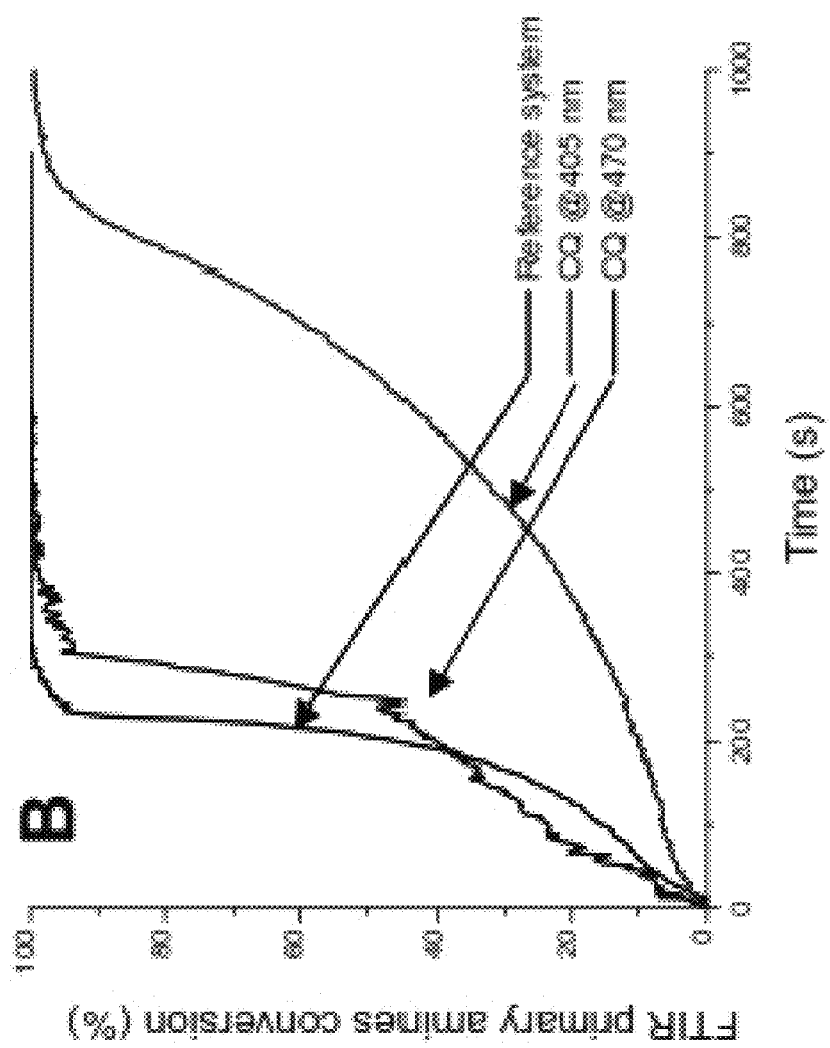
Figure 10C:
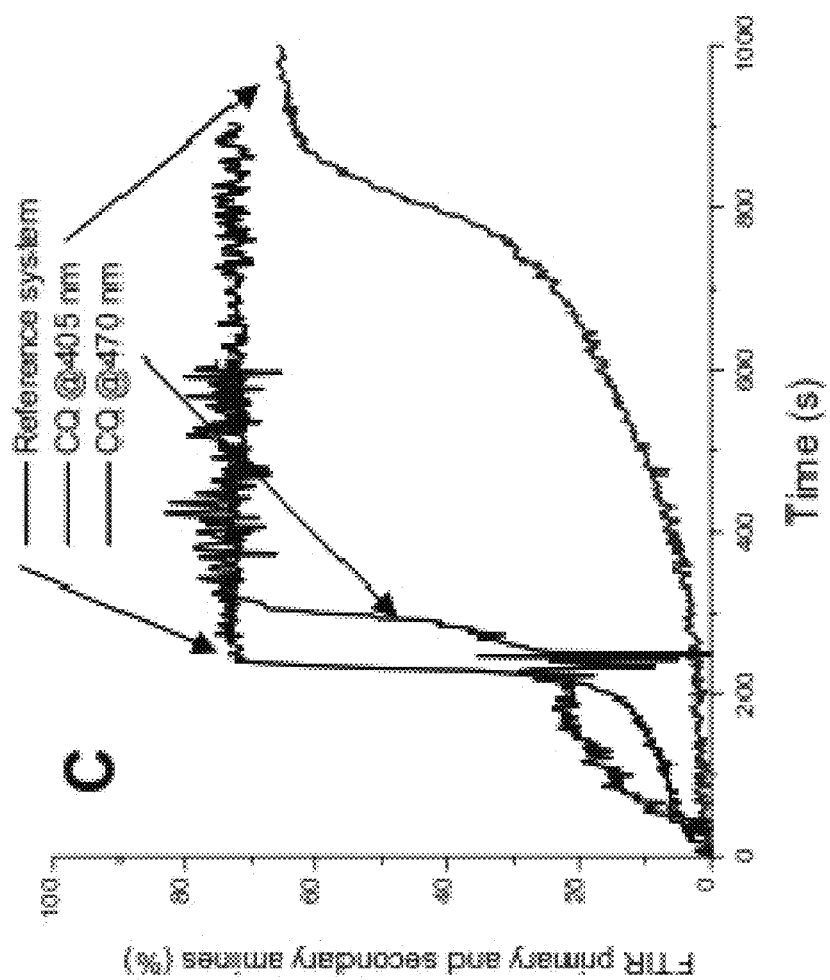

FIG. 10A, FIG. 10B, and FIG. 10C: shows comparative real-time Fourier transformed infrared spectroscopy (RT-FTIR) monitoring of the epoxy/amine reaction (Primary ($NH_2$), primary and secondary (NH) amines and epoxide conversion vs time, 1.4 mm sample) for (i) kinetics of photopolyaddition of reference system (1 wt % CPTX+2 wt % Iod) under LD@405 nm (450 mW/cm$^2$), (ii) 1 wt % camphorquinone+2 wt % Iod under LD@405 nm (450 mW/cm$^2$), and (iii) 1 wt % camphorquinone+2 wt % Iod under LD@477 nm (300 mW/cm$^2$), A: epoxy function conversion; B: primary amine function conversion; C: primary+secondary amine function conversion.

Figure 11:
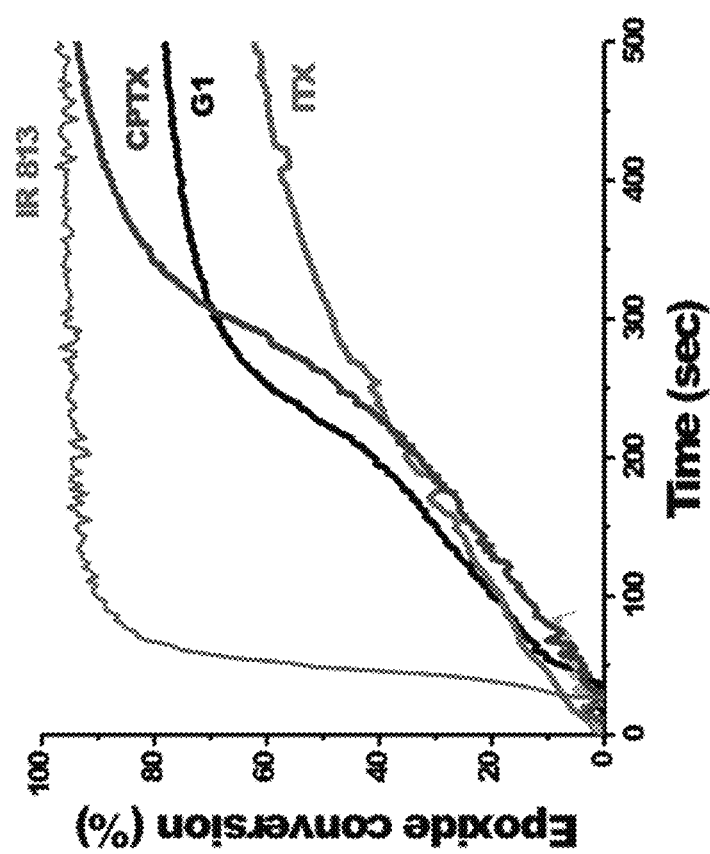

FIG. 11: shows comparative photopolymerization profiles between NIR photosentitizer IR-813 discussed in Example 4 and UV-visible photosensitizers CPTX (1 wt %), G1 (0.5 wt %) and ITX (1 wt %). Irradiation with laser diode@405 nm (I=450 mW/cm$^2$) for CPTX, G1 and ITX. Irradiation with laser diode@785 nm (I=2.5 W/cm$^2$) for IR-813.

Figure 12:
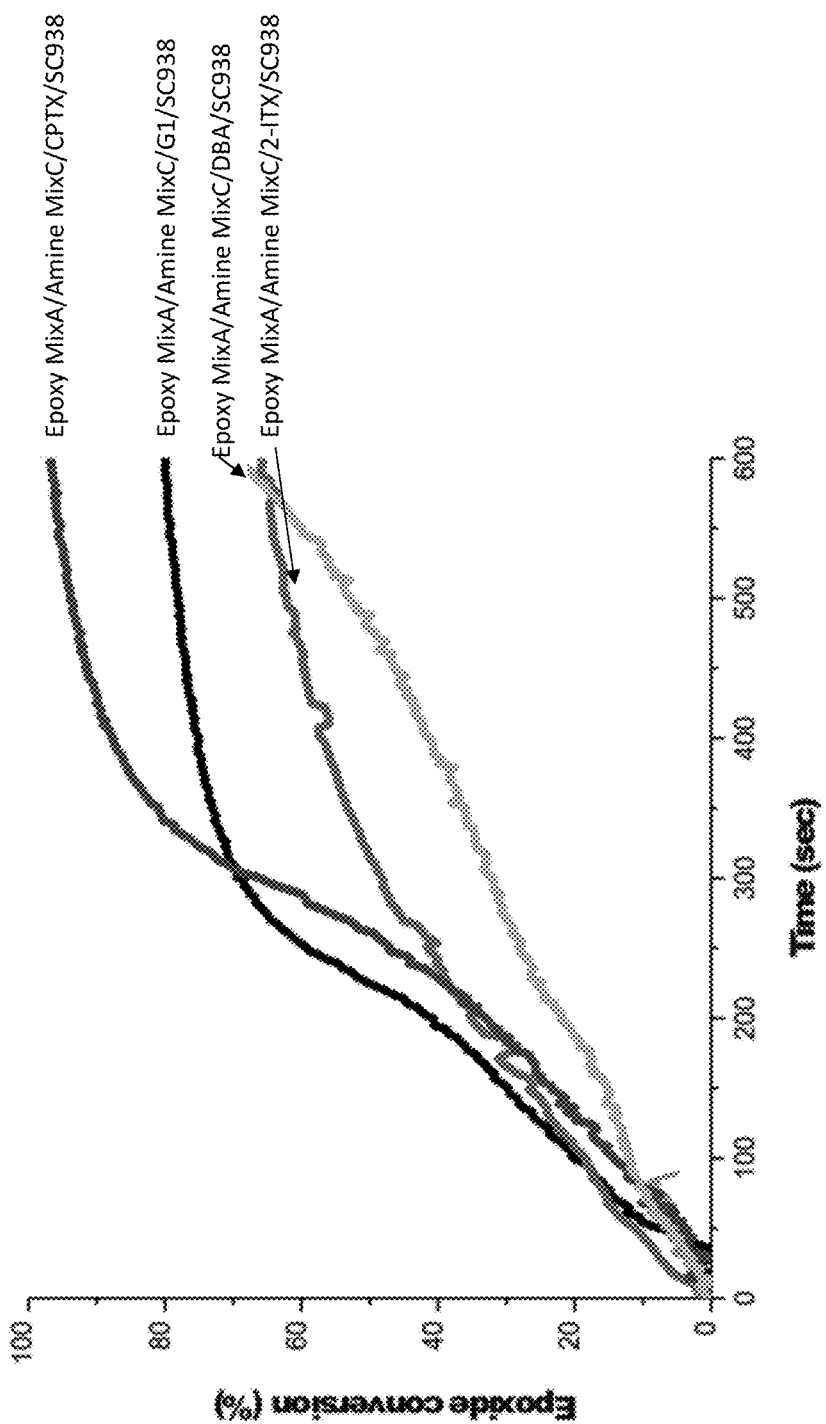

FIG. 12: shows photopolymerization profiles for the system: Epoxy MixA (69%)/Amine MixC (31%)/Photoinitiator (2-ITX, CPTX or DBA@1 wt %, or G1 0.5 wt %)/oxidation agent SC938 (2 wt %) discussed in Example 5. Irradiation with laser diode @405 nm (I=450 mW/cm$^2$).

Figure 13:
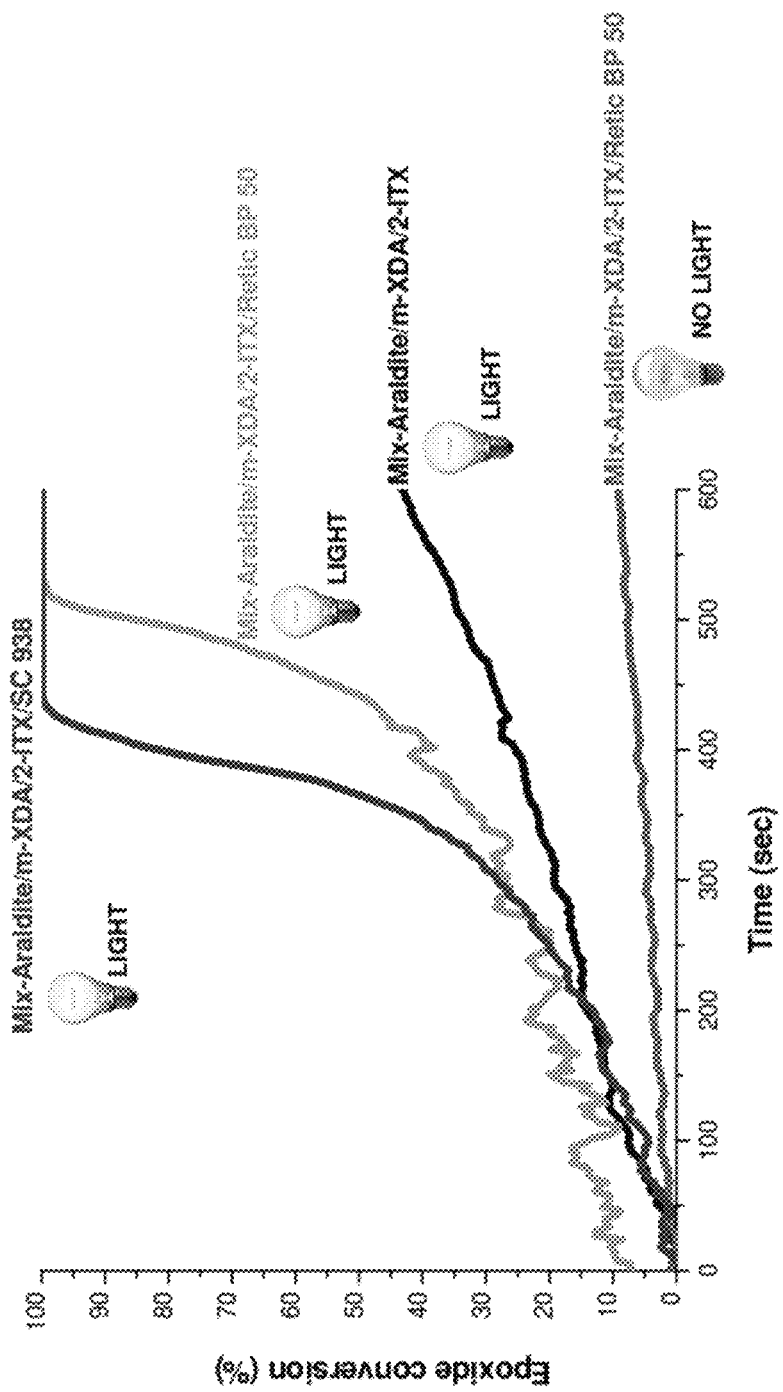

FIG. 13: shows photopolymerization profiles for the system: Mix Araldite-TGE (75 wt %)/m-XDA (25 wt %)/2-ITX 1 wt % and REDIC BP 50 WHITE (2 wt %) discussed in Example 6. Irradiation with laser diode@405 nm (I=450 mW/cm$^2$).

Figure 14:
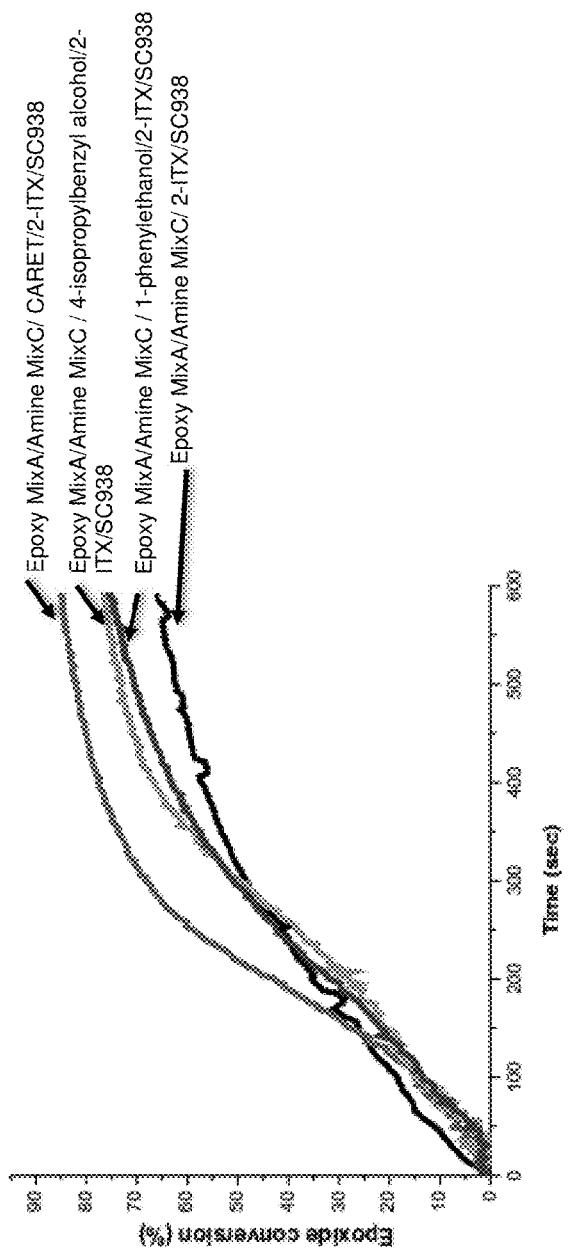

FIG. 14: shows photopolymerization profiles for the system: Epoxy MixA/Amine MixC/benzyl-type alcohol/2-ITX (1%)/SC938 & Epoxy MixA/Amine MixC/2-ITX (1%)/SC938 discussed in Example 7. Irradiation with laser diode@405 nm (I=450 mW/cm$^2$).

Figure 15:
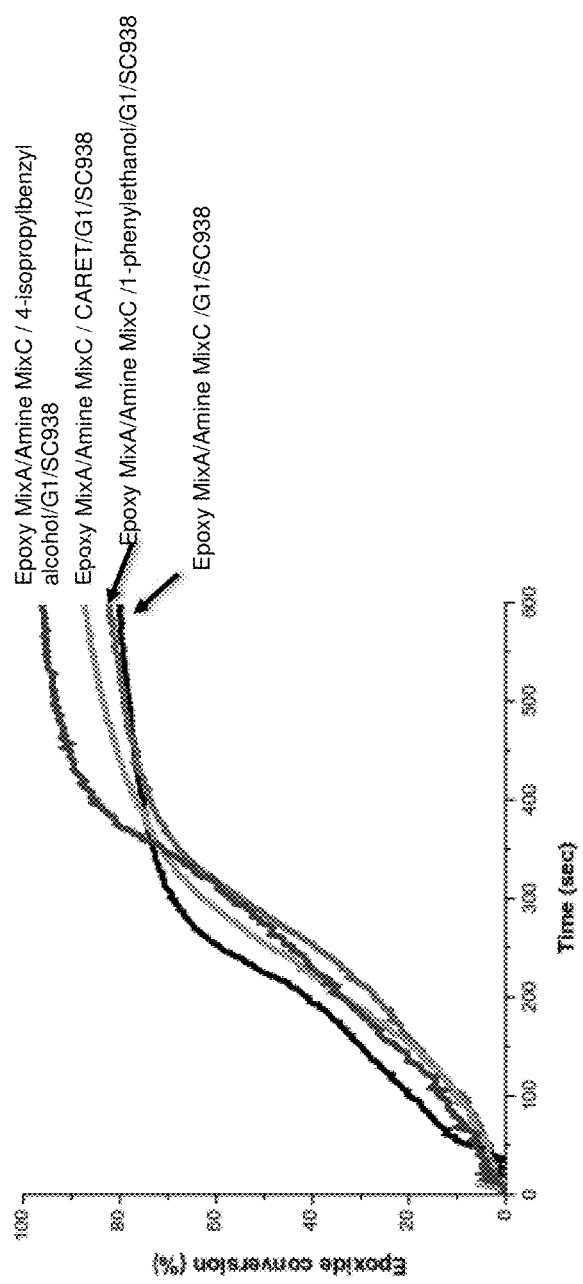

FIG. 15: shows photopolymerization profiles for the system: Epoxy MixA/Amine MixC/benzyl-type alcohol/G1 (0.5 wt %)/SC938 & Epoxy MixA/Amine MixC/G1 (0.5%)/SC938 discussed in Example 7. Irradiation with laser diode@405 nm (I=450 mW/cm$^2$).

Figures 16A, 16B:
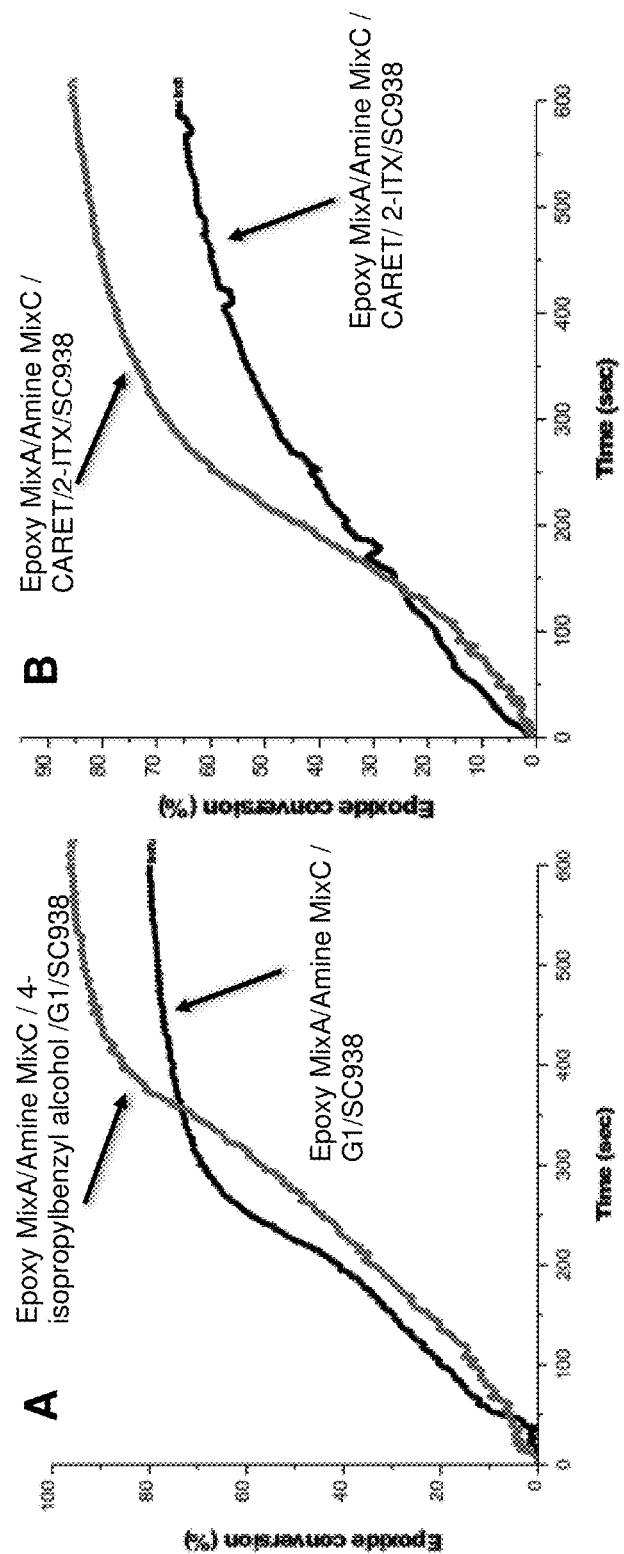
Figure 16C:
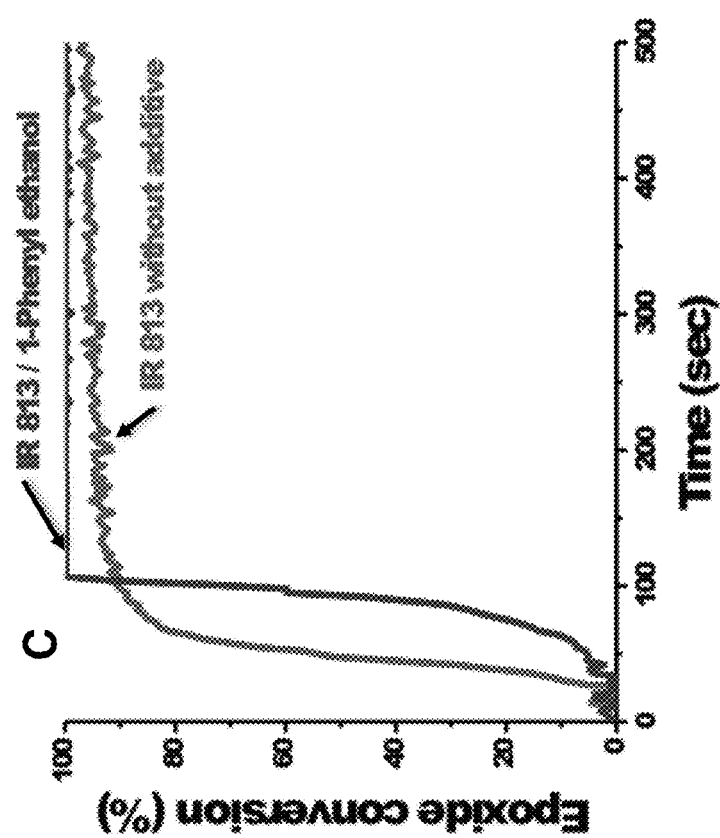

FIG. 16A, FIG. 16B, and FIG. 16C: shows comparative photopolymerization profiles for the systems: (A) Epoxy MixA/Amine MixC/4-isopropylbenzyl alcohol (2 wt %)/G1 (0.5 wt %)/SC938 (2 wt %) versus Epoxy MixA/Amine MixC/G1 (0.5 wt %)/SC938 (2 wt %) discussed in Example 7. (B) Epoxy MixA/Amine MixC/CARET (2 wt %)/2-ITX (1 wt %)/SC938 (2 wt %) versus Epoxy MixA/Amine MixC/2-ITX (1 wt %)/SC938 (2 wt %) discussed in Example 7. (B) Epoxy MixA/Amine MixC/1-phenylethanol (2 wt %)/IR 813 (0.1 wt %)/SC938 (2 wt %) versus Epoxy MixA/Amine MixC/IR 813 (0.1 wt %)/SC938 (2 wt %) discussed in Example 7. Irradiation with laser diode@405 nm (I=450 mW/cm$^2$). Irradiation with laser diode@405 nm (I=450 mW/cm$^2$) for G1 and 2-ITX. Irradiation with laser diode@785 nm (I=2.5 W/cm$^2$) for IR-813.

FIG. 17: shows Preparation of a Epoxy MixA/SD822 epoxy resin (A) fiberglass sheet composite, and (B) multi-fiberglass sheet composite, discussed in Example 10.

Figure 18:
Figure 18:
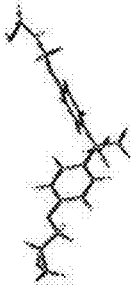
Figure 18:
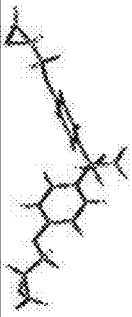
Figure 18:
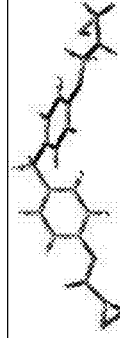
Figure 18:
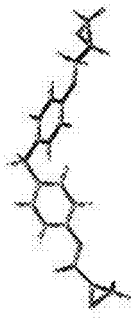
Figure 18:
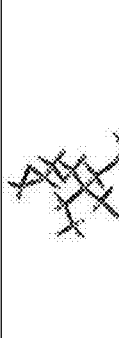
Figure 18:
Figure 18:
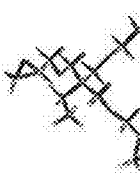

FIG. 18: Table of Computed (at uB3LYP/6-31G*level) protonic affinity reactions for epoxy-amine compounds.

DEFINITIONS

To facilitate an understanding of the present invention, a number of terms and phrases are defined below:

As used herein other than the claims, the terms "a," "an," "the," and/or "said" means one or more. As used herein in the claim(s), when used in conjunction with the words "comprise," "comprises" and/or "comprising," the words "a," "an," "the," and/or "said" may mean one or more than one. As used herein and in the claims, the terms "having," "has," "is," "have," "including," "includes," and/or "include" has the same meaning as "comprising," "comprises," and "comprise." As used herein and in the claims "another" may mean at least a second or more.

The phrase "a mixture thereof" and such like following a listing, the use of "and/or" as part of a listing, a listing in a table, the use of "etc" as part of a listing, the phrase "such as," and/or a listing within brackets with "e.g.," or i.e., refers to any combination (e.g., any sub-set) of a set of listed components, and combinations and/or mixtures of related species and/or embodiments described herein though not directly placed in such a listing are also contemplated. Such related and/or like genera(s), sub-genera(s), specie(s), and/or embodiment(s) described herein are contemplated both in the form of an individual component that may be claimed, as well as a mixture and/or a combination that may be described in the claims as "at least one selected from," "a mixture thereof" and/or "a combination thereof."

In general, the term "substituted" whether preceded by the term "optionally" or not, and substituents contained in formulae of this invention, refer to the replacement of hydrogen radicals in a given structure with the radical of a specified substituent. When more than one position in any given structure may be substituted with more than one substituent selected from a specified group, the substituent may be either the same or different at every position. As used herein, the term "substituted" is contemplated to include all permissible substituents of organic compounds.

The term "aliphatic", as used herein, includes both saturated and unsaturated, straight chain (i.e., unbranched) or branched aliphatic hydrocarbons, which are optionally substituted with one or more functional groups. As will be appreciated by one of ordinary skill in the art, "aliphatic" is intended herein to include, but is not limited to, alkyl, alkenyl, alkynyl moieties.

As used herein, the term "alkyl", refers to straight and branched C1-C10alkyl groups. An analogous convention applies to other generic terms such as "alkenyl", "alkynyl" and the like. As used herein, "lower alkyl" is used to indicate those alkyl groups (substituted, unsubstituted, branched or unbranched) having about 1-6 carbon atoms. Illustrative alkyl groups include, but are not limited to, for example, methyl, ethyl, npropyl, isopropyl, allyl, n-butyl, sec-butyl, isobutyl, tert-butyl, n-pentyl, sec-pentyl, isopentyl, tert-pentyl, n-hexyl, sec-hexyl, moieties and the like, which again, may bear one or more substituents. Alkenyl groups include, but are not limited to, for example, ethenyl, propenyl, butenyl, 1-methyl-2-buten-1-yl, and the like. Representative alkynyl groups include, but are not limited to, ethynyl, 2-propynyl (propargyl), 1-propynyl and the like.

The term "alicyclic", as used herein, refers to compounds which combine the properties of aliphatic and cyclic compounds and include but are not limited to cyclic, or polycyclic aliphatic hydrocarbons and bridged cycloalkyl compounds, which are optionally substituted with one or more functional groups. As will be appreciated by one of ordinary skill in the art, "alicyclic" is intended herein to include, but is not limited to, cycloalkyl, cycloalkenyl, and cycloalkynyl moieties, which are optionally substituted with one or more functional groups. Illustrative alicyclic groups thus include, but are not limited to, for example, cyclopropyl, —CH$_2$-cyclopropyl, cyclobutyl, —CH$_2$-cyclobutyl, cyclopentyl, —CH$_2$-cyclopentyl-n, cyclohexyl, —CH$_2$-cyclohexyl, cyclohexenylethyl, cyclohexanylethyl, norborbyl moieties and the like, which again, may bear one or more substituents.

The term "heteroaliphatic", as used herein, refers to aliphatic moieties in which one or more carbon atoms in the main chain have been substituted with a heteroatom. Thus, a heteroaliphatic group refers to an aliphatic chain which contains one or more oxygen, sulfur, nitrogen, phosphorus or silicon atoms, i.e., in place of carbon atoms. Heteroaliphatic moieties may be branched or linear unbranched. An analogous convention applies to other generic terms such as "heteroalkyl", "heteroalkenyl", "heteroalkynyl" and the like.

The term "heterocyclic" or "heterocycle", as used herein, refers to compounds which combine the properties of heteroaliphatic and cyclic compounds and include but are not limited to saturated and unsaturated mono- or polycyclic heterocycles such as morpholino, pyrrolidinyl, furanyl, thiofuranyl, pyrrolyl etc., which are optionally substituted with one or more functional groups, as defined herein. In certain embodiments, the term "heterocyclic" refers to a non-aromatic 5-, 6- or 7-membered ring or a polycyclic group, including, but not limited to a bi- or tri-cyclic group comprising fused six-membered rings having between one and three heteroatoms independently selected from oxygen, sulfur and nitrogen, wherein (i) each 5-membered ring has 0 to 2 double bonds and each 6-membered ring has 0 to 2 double bonds, (ii) the nitrogen and sulfur heteroatoms may optionally be oxidized, (iii) the nitrogen heteroatom may optionally be quaternized, and (iv) any of the above heterocyclic rings may be fused to an aryl or heteroaryl ring. Representative heterocycles include, but are not limited to, pyrrolidinyl, pyrazolinyl, pyrazolidinyl, imidazolinyl, imidazolidinyl, piperidinyl, piperazinyl, oxazolidinyl, isoxazolidinyl, morpholinyl, thiazolidinyl, isothiazolidinyl, and tetrahydrofuryl.

In general, the term "aromatic" or "aryl", as used herein, refers to stable substituted or unsubstituted unsaturated mono- or polycyclic hydrocarbon moieties having preferably 3-14 carbon atoms, comprising at least one ring satisfying Huckle's rule for aromaticity. Examples of aromatic moieties include, but are not limited to, phenyl, indanyl, indenyl, naphthyl, phenanthryl and anthracyl.

As used herein, the term "heteroaromatic" or "heteroaryl" refers to unsaturated monoheterocyclic or polyheterocyclic moieties having preferably 3-14 carbon atoms and at least one ring atom selected from S, O and N, comprising at least one ring satisfying the HOckel rule for aromaticity. Preferably, the heteroaromatic compound or heteroaryl may be a cyclic unsaturated radical having from about five to about ten ring atoms of which one ring atom is selected from S, O and N; zero, one or two ring atoms are additional heteroatoms independently selected from S, O and N; and the remaining ring atoms are carbon, the radical being joined to the rest of the molecule via any of the ring atoms, such as, for example, pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furany1, quinolinyl, isoquinolinyl, and the like. Examples of heteroaryl moieties include, but are not limited to, pyridyl, quinolinyl, dihydroquinolinyl, isoquinolinyl, quinazolinyl, dihydroquinazolyl, and tetrahydroquinazolyl.

The term "aromatic polyamine" as used herein refers to a compound having at least two amino groups (primary or secondary, preferably two primary amino groups) bound directly to an aromatic moiety, as defined above.

The term "aliphatic polyamine" as used herein refers to a linear or branched aliphatic or heteroaliphatic, preferably aliphatic, compound having at least two amino groups (primary or secondary, preferably two primary amino groups) bound directly to the aliphatic or heteroaliphatic, preferably aliphatic, moiety, as defined above.

The term "alicyclic polyamine" as used herein refers to an alicyclic or heterocyclic compound having at least two amino group (primary or secondary) that are either (i) both bound to the alicyclic or heterocyclic moiety (as amino substituents, or amino-containing substituents); (ii) both part of the heterocyclic moiety (e.g. piperazine), or (iii) one is bound to the alicyclic or heterocyclic moiety (as amino substituents, or amino-containing substituents) and the other part of the heterocyclic moiety (e.g. 1-(2-aminoethyl)-piperazine).

The term "aliphatic aromatic polyamine" as used herein refers to an aliphatic polyamine, as defined above, containing at least one aromatic moiety within its structure, which is not bound directly to the amino groups (for example, the amino groups may be connected to the aromatic moiety via an aliphatic linker).

The term "amine" refers to a group having the structure —N(R)$_2$ wherein each occurrence of R is independently hydrogen, or an aliphatic, heteroaliphatic, aryl or heteroaryl moiety, or the R groups, taken together with the nitrogen atom to which they are attached, may form a heterocyclic moiety.

As used herein, the term "independently" refers As used herein, the term "independently" refers to the fact that the substituents, atoms or moieties to which these terms refer, are selected from the list of variables independently from each other (i.e., they may be identical or the same).

As used herein, "about" refers to any inherent measurement error or a rounding of digits for a value (e.g., a measured value, calculated value such as a ratio), and thus the term "about" may be used with any value and/or range. As used herein, the term "about" can refer to a variation of ±5% of the value specified. For example, "about 50" percent can in some embodiments carry a variation from 45 to 55 percent. For integer ranges, the term "about" can include one or two integers greater than and/or less than a recited integer. Unless indicated otherwise herein, the term "about" is intended to include values, e.g., weight %, temperatures, proximate to the recited range that are equivalent in terms of the functionality of the relevant individual ingredient, the composition, or the embodiment.

As used herein, the term "and/or" means any one of the items, any combination of the items, or all of the items with which this term is associated.

As will be understood by the skilled artisan, all numbers, including those expressing quantities of ingredients, properties such as molecular weight, reaction conditions, and so forth, are approximations and are understood as being optionally modified in all instances by the term "about." These values can vary depending upon the desired properties sought to be obtained by those skilled in the art utilizing the teachings of the descriptions herein. It is also understood that such values inherently contain variability necessarily resulting from the standard deviations found in their respective testing measurements.

As will be understood by one skilled in the art, for any and all purposes, particularly in terms of providing a written description, all ranges recited herein also encompass any and all possible subranges and combinations of subranges thereof, as well as the individual values making up the range, particularly integer values. A recited range (e.g., weight percents or carbon groups) includes each specific value, integer, decimal, or identity within the range. Any listed range can be easily recognized as sufficiently describing and enabling the same range being broken down into at least equal halves, thirds, quarters, fifths, or tenths. As a non-limiting example, each range discussed herein can be readily broken down into a lower third, middle third and upper third, etc.

As will also be understood by one skilled in the art, all language such as "up to," "at least," "greater than," "less than," "more than," "or more," and the like, include the number recited and such terms refer to ranges that can be subsequently broken down into subranges as discussed above. In the same manner, all ratios recited herein also include all subratios falling within the broader ratio. Accordingly, specific values recited for radicals, substituents, and ranges, are for illustration only; they do not exclude other defined values or other values within defined ranges for radicals and substituents.

One skilled in the art will also readily recognize that where members are grouped together in a common manner, such as in a Markush group, the invention encompasses not only the entire group listed as a whole, but each member of the group individually and all possible subgroups of the main group. Additionally, for all purposes, the invention encompasses not only the main group, but also the main group absent one or more of the group members. The invention therefore envisages the explicit exclusion of any one or more of members of a recited group. Accordingly, provisos may apply to any of the disclosed categories or embodiments whereby any one or more of the recited elements, species, or embodiments, may be excluded from such categories or embodiments, for example, as used in an explicit negative limitation.

Detailed Description of Certain Preferred Embodiments of the Invention

As noted above, there is a dire need for the development of new systems and methods for producing cyclic ether-amine resins with a very short curing time (minutes, as opposed to hours. It has been discovered that an appropriately selected combination of a suitable photoinitiator or photosensitizer and a suitable oxidation agent can overcome the aforementioned drawbacks in the field.

In this context, there is provided herein a composition curable on demand under the triggering action of UV-visible to near-infrared irradiation comprising:
(a) at least one polyfunctional cyclic ether component comprising at least two cyclic ether moieties;
(b) at least one polyfunctional amine component comprising at least two primary or secondary amine moieties; and
(c) a photoinitiating system generating catalytic species comprising:
at least one suitable photoinitiator or photosensitizer that absorbs light at the desired UV-visible to near-infrared irradiation under which the composition is to be cured;
at least one oxidation agent able to react with the photoinitiator or the photosensitizer, selected from iodonium salts, sulfonium salts, peroxides and thianthrenium salts.

As used herein, the term "polyfunctional cyclic ether" does not deviate from the conventional meaning of the term in the art, and refers to a compound comprising at least two cyclic ether moieties.

Likewise, as used herein, the term "polyfunctional amine" does not deviate from the conventional meaning of the term in the art, and refers to a compound comprising at least two amine moieties. Preferably, the amine moieties are primary or secondary amine moieties.

In an advantageous variant, the composition may further comprise a benzyl-type alcohol. As used herein, the term benzyl-type alcohol refers to compounds featuring an —OH group on a carbon atom α or β to an aromatic or heteroaromatic nucleus.

This new system surprisingly provides remarkable enhancement of cyclic ether-amine polyaddition kinetics, and leads to self-thermally curing of the composition upon UV-visible to near infrared irradiation in a very short time. The invention therefore proposes an unprecedented acceleration of 2-component cyclic ether/amine light-induced polymerizations (typically less than. 2 min 30 seconds are required to obtain a functional cyclic ether-amine resin material, as opposed to frequently more than one hour, or even three hours, in the case of existing conventional cyclic ether-amine polyaddition processes). The catalytic species generated by the photoinitiating system may be strong acidic species (for example when iodonium salts are used as oxidation agent), or cationic species (for example when peroxides are used as oxidation agent). Advantageously, the irradiation intensity may be moderate. For example, the intensity may be as low as 25 mW/cm² or even lower (for example 25 mW/cm²≤I≤100 W/cm², preferably 25 mW/cm²≤I≤20 W/cm²).

Polyfunctional Cyclic Ether Component

Advantageously, the polyfunctional cyclic ether component in the curable compositions according to the invention may be any suitable compound containing at least two cyclic ether moieties. The polyfunctional cyclic ether components used in the composition can be used alone or in admixture, and they advantageously have a number of epoxide functions greater than or equal to two, preferably two to four. One can refer to the various publications in the literature that describe the chemistry, structure, reactivity of epoxide monomers, such as notably: "Handbook of Epoxy Resins," Lee & Neville, Mc Graw-Hill (1982), "Chemistry and technology of the epoxy Resins," B. Ellis, Chapman Hall (1993), New York and "Epoxy Resins Chemistry and technology," C. A. May, Marcel Dekker, New York (1988). [1] Advantageously, the polyfunctional cyclic ether component may contain 2, 3 or 4, preferably 2 or 3, cyclic ether moieties. The cyclic ether moieties of the polyfunctional cyclic ether component may each independently be reactive to primary or secondary amine compounds (polyaddition reaction). Aromatic, cycloaliphatic, heterocyclic or aliphatic polyfunctional cyclic ether components can be used indiscriminately in the context of the invention. The polyfunctional cyclic ether components can carry substituents such as aliphatic, cycloaliphatic, aromatic or heterocyclic chains, or other elements such as fluorine and bromine for example. Generally, the substituents present on the polyfunctional cyclic ether component is not of a nature to interfere with the reaction of the cyclic ether functions with a primary or secondary amine. Such additional types of substituents include halogens; hydroxyl, sulfhydryl, cyano, nitro, silicon, for example.

For example, the cyclic ether functional group may be a 3- to 6-membered cyclic ether functional group, preferably a 3- or -membered cyclic ether functional group. For example, the cyclic ether functional group may be an epoxy or an oxetane group, preferably an epoxy functional group.

Advantageously, at least one polyfunctional cyclic ether component may be selected from aliphatic, heteroaliphatic, aromatic or heteroaromatic polyfunctional epoxy compounds. For example, polyfunctional aromatic epoxy compounds such as:

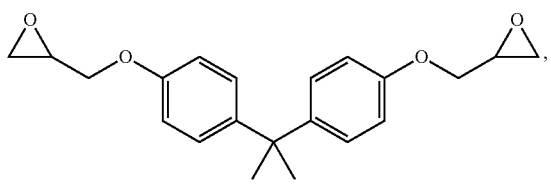

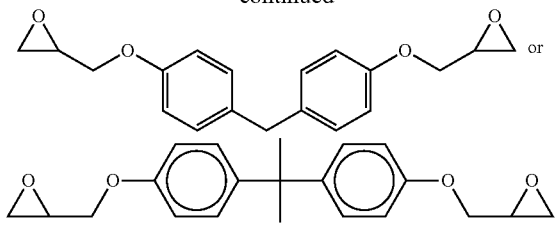 or

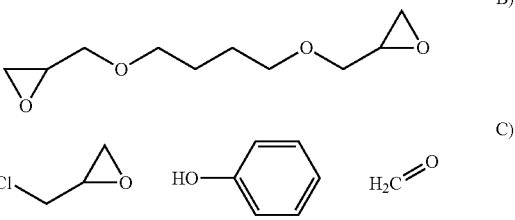

may be used.

Polyfunctional heteroaliphatic epoxy compounds may be used, such as:

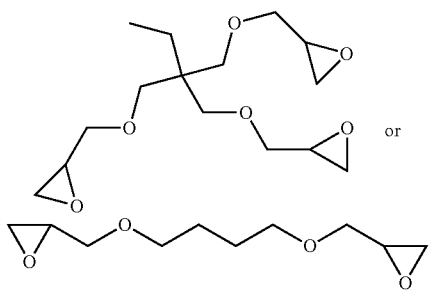

Epoxy prepolymers may also be used as polyfunctional cyclic ether components, in particular those epoxy prepolymers obtained from reaction of diols with epichlorhydrine, such as bisphenol A diglycidyl ether, 1,4-butanediol diglycidyl ether.

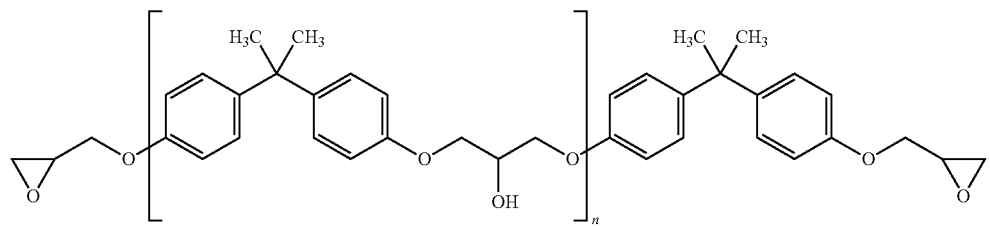

Poly(Bisphenol A-co-Epichlorhydrin), Glycidyl End-Capped

Epoxy prepolymers obtained from reaction of diamines with epichlorhydrine may also be used, for example 4,4'-diaminodiphenyl methane tetraglycidyl ether.

Mixtures of two or more polyfunctional epoxy components, such as Epoxy MixA or Epoxy MixB (a mixture of Poly(bisphenol A-co-epichlorhydrin), glycidyl end-capped and 1,4-butanediol diglycidyl ether), may also be used. Epoxy MixA is composed of A+B+C below:

A)

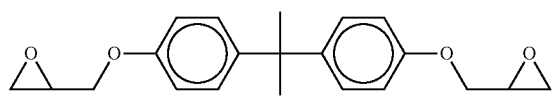

B)

C)

C being the oligomeric reaction products of formaldehyde with 1-chloro-2,3-epoxypropane and phenol.

As mentioned previously, the polyfunctional cyclic ether component may be used alone, or in admixture. As such, a mixture of two or more of the above-mentioned polyfunctional cyclic ether components, for example a mixture of two or more polyfunctional epoxy components, may be used.

Polyfunctional Amine Component

In general terms, any organic compounds comprising at least two primary amine functions, or at least one primary amine function and one or more primary or secondary amine functions are likely to go into the composition. A mixture of two or more polyfunctional amine components can be used. The polyfunctional amine components can be of aromatic, heterocyclic, cycloaliphatic or aliphatic type, substituted or not by aliphatic chains.

Advantageously, the polyfunctional amine component in the curable compositions according to the invention may be any suitable compound containing at least two amine groups, preferably primary or secondary amine groups, most preferably primary amine groups. The polyfunctional amine components used in the composition can be used alone or in admixture, and they advantageously have a number of amine functions greater than or equal to two, preferably two to four. The polyfunctional amine components may contain:

two or more primary amine groups;
two or more secondary amine groups; or
at least one primary amine group and at least one secondary amine group.

The amine moieties of the polyfunctional amine component may each independently be reactive to cyclic ether compounds (polyaddition reaction). Aromatic, cycloaliphatic, heterocyclic or aliphatic polyfunctional amine components, substituted or not by aliphatic chains (e.g., aromatic aliphatic amines), can be used indiscriminately in the context of the invention. The polyfunctional amine components can carry substituents such as aliphatic, cycloaliphatic, aromatic or heterocyclic chains, or other elements such as fluorine and bromine for example. Generally, the substituents present on the polyfunctional amine component is not of a nature to interfere with the addition reaction of the amine functions with a cyclic ether group: the substituents may be unreactive towards cyclic ether groups or may have a substantially lesser reactivity towards cyclic ether groups than the amine functions present on the polyfunctional amine component. Such additional types of substituents include halogens, hydroxyl, sulfhydryl, cyano, nitro, silicon, for example.

Advantageously, at least one polyfunctional amine component may be selected from aliphatic, heteroaliphatic, aromatic or heteroaromatic polyfunctional primary or secondary amine compounds, substituted or not by aliphatic chains (e.g., aromatic aliphatic amines). Polyfunctional amines conventionally used in cyclic ether-amine resins are preferred, such as commercially available Jeffamine, Baxxodur and Dytek polyamines. For example:

linear or branched chain aliphatic polyamines may be used. Mention may be made of ethylene diamine (also referred to herein as "EDAA" which stands for ethylene diamine anhydrous), diethylenetriamine (DTA), Triethylenetetramine (TTA, also referred to herein as "TETA"), Tetraethylenepentamine (TEPA), Diproprenediamine (DPDA), Diethylaminopropylamine (DEAPA), hexamethylenediamine, 1,5-Diamino-2-methylpentane, 2,2-Dimethyl-1,3-propanediamine, aminoethylethanolamine;

alicyclic polyamines may be used, such as N-aminoethylpiperazine (NAEP), Lamiron C-260 (also referred to herein as "MMCA" which stands for 4,4'-methylenebis (2-methylcyclohexylamine)), Araldit HY-964, Menthane diamine (MDA), Isophoronediamine (IPDA), S Cure 211, S cure 212, Wandamin HM, 1.3 BAC, piperazinoethylethylene-diamine, diaminoethylpiperazine, aminoethyltris-aminoethylamine, aminoethyldiaminoethylpiperazine, aminoethylpiperazinoethylethylenediamine, aminoethyl-piperazine;

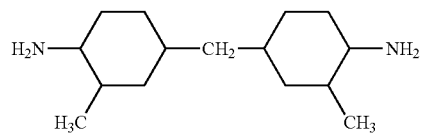

Lamiron C-260

1.3 BAC

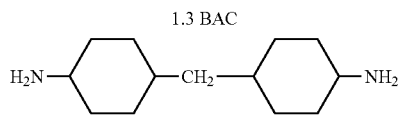

Wandamin HM aliphatic aromatic polyamines may be used (i.e., polyamine compounds bearing an aromatic moiety, whereby the amine groups are bound to the aromatic moiety via an aliphatic linker; in other words the amine groups are not bound directly to the aromatic nucleus), such as 1-N-benzylbenzene-1,4-diamine, m-xylenediamine (m-XDA, or Sho-amine X), xylylenediamine trimer (such as amine black or Sho-amine black), xylylenediamine derivatives (such as Sho-amine N, Sho-amine 1001 and Sho-amine 1010);

aromatic polyamines may be used (i.e., polyamine compounds bearing an aromatic moiety, whereby the amine groups are bound directly to the aromatic nucleus), such as m-phenylene diamine, diaminodiphenylmethane, diaminodiphenylsulfone, melamine, melamine polyphosphate, 6-phenyl-1,3,5-triazine-2,4-diamine, or melamine cyanurate;

polyetheramines may be used, such as

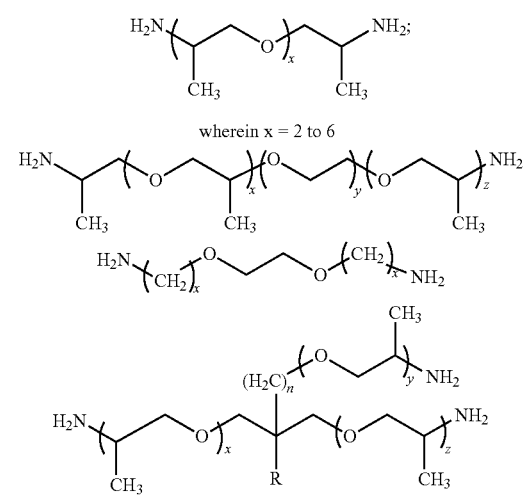

wherein x = 2 to 6 or a mixture of two or more of the above may be used, for example Amine MixC which is a mixture of two amine components:

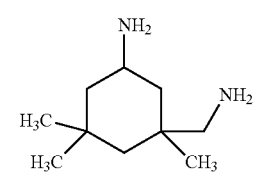

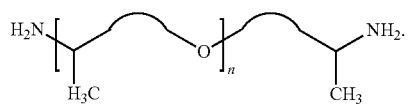

n = 2-6

Preferably, at least one polyfunctional amine component may be selected from any one or more of the following:

linear or branched chain aliphatic polyamines such as diethylenetriamine (DTA), Triethylenetetramine (TTA), Tetraethylenepentamine (TEPA), Diproprenediamine (DPDA), Diethylaminopropylamine (DEAPA), hexamethylenediamine;

alicyclic polyamines such as N-aminoethylpiperazine (N-AEP), Lamiron C-260, Araldit HY-964, Menthane diamine (MDA), Isophoronediamine (IPDA), S Cure 211, S cure 212, Wandamin HM, 1.3 BAC, and 2,4,6-tris(dimethylaminomethyl)phenol;

aliphatic aromatic polyamines such as m-xylenediamine (m-XDA, or Shoamine X), xylylenediamine trimer (such as amine black or Sho-amine black), xylylenediamine derivatives (such as Sho-amine N, Sho-amine 1001 and Sho-amine 1010);

aromatic polyamines such as m-phenylene diamine, diaminodiphenylmethane, and diaminodiphenylsulfone.

In general, aromatic polyamines are not preferred because the curing time is significantly longer (hours) than that of aliphatic-type polyamines (minutes). Accordingly, most advantageously, at least one polyfunctional amine component may be preferably selected from any one or more of the following:

linear or branched chain aliphatic polyamines such as diethylenetriamine (DTA), Triethylenetetramine (TTA), Tetraethylenepentamine (TEPA), Diproprenediamine (DPDA), Diethylaminopropylamine (DEAPA), hexamethylenediamine, 1,5-Diamino-2-methylpentane;

alicyclic polyamines such as N-aminoethylpiperazine (N-AEP), Lamiron C260, Araldit HY-964, Menthane diamine (MDA), Isophoronediamine (IPDA), S Cure 211, S cure 212, Wandamin HM, 1.3 BAC, and 2,4,6-tris(dimethylaminomethyl)phenol; or aliphatic aromatic polyamines such as m-xylenediamine (m-XDA, or Shoamine X), xylylenediamine trimer (such aspiper amine black or Sho-amine black), xylylenediamine derivatives (such as Sho-amine N, Sho-amine 1001 and Sho-amine 1010).

The polyfunctional cyclic ether component and polyfunctional amine component may be used in a stoichiometric ratio. Alternatively, the polyfunctional amine component may be used in molar excess with respect to polyfunctional cyclic ether component, to drive the polyaddition reaction to completion.

Advantageously, the polyfunctional amine component is preferably used is stoichiometric excess relative to the cyclic ether component (number of reactive primary/secondary amines of the polyfunctional amine component is preferably higher than the number of reactive cyclic ether functions, to drive the polyaddition reaction to completion. For example, the ratio (reactive 1°+2° amine function)/(reactive cyclic ether function) may range from 2/1 to 1.1/1, for example about 1.4/1.

Photoinitiator or Photosensitizer

Advantageously, the photoinitiator or photosensitizer may be any suitable compound that absorbs light at the desired UV-visible to near-infrared irradiation under which the composition is to be cured.

The photoinitiator or photosensitizer is preferably soluble in the polyfunctional cyclic ether component and/or in the polyfunctional amine component.

Suitable photoinitiators or photosensitizers in the UV, near-UV and Visible include:

type I photoinitiators such as 2-hydroxy-2-methyl-1-phenylpropan-1-one, 2-hydroxy-1,2-diphenylethanone, (diphenylphosphoryl)(phenyl)methanone, 2-(dimethylamino)-1-(4-morpholinophenyl)ethanone, bis-acylphosphine oxide (BAPO);

type II photoinitiators such as benzophenone, xanthones, thioxanthones such as ITX, 2-ITX and CPTX, quinones, anthraquinones, and camphorquinone;

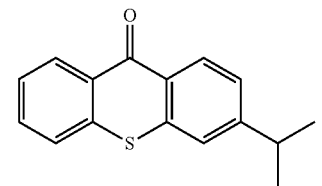

ITX

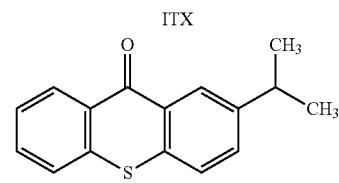

2-ITX

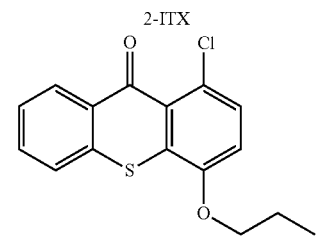

CPTX organic dye photosensitizers such as eosin Y and Rose Bengal;

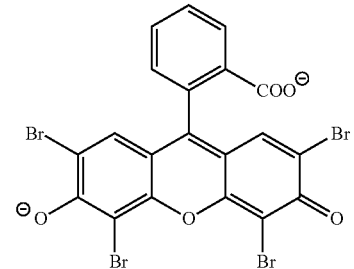

EY

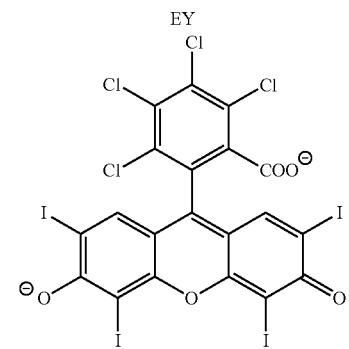

RB polyaromatic hydrocarbon photosensitizers such as pyrene and anthracene;

preferably camphorquinone or thioxanthone compounds such as ITX, 2-ITX and CPTX.

Suitable photoinitiators or photosensitizers in the red to near infrared include dyes that generate heat when exposed to a 625-2500 nm light source, for example when exposed to a 625-1500 nm light irradiation.

Advantageously, the heat-generating dye may be any suitable dye that generates heat when exposed to a 625-2500 nm light source (i.e., when exposed to irradiation in the red to near-infrared), for example when exposed to a 625-1500 nm light irradiation. Advantageously, the irradiation intensity may be adjusted/tuned down so as to keep the heat generated by the NIR dye at a level below that which is sufficient to accelerate the cyclic ether/amine polyaddition on its own (i.e., without the oxidation agent such as iodonium salts, sulfonium salts, peroxides and thianthrenium salts). For example, the intensity may be as low as 25 mW/cm$^2$ or even lower (for example 25 mW/cm$^2 \leq I \leq 100$ W/cm$^2$, preferably 25 mW/cm$^2 \leq I \leq 20$ W/cm$^2$).

Advantageously, the heat-generating dye may comprise a cyclic or acyclic conjugated system containing 2 or 4 heteroatoms selected from N or S the lone pair of which may participate in the conjugated system; wherein the heat-generating dye generates heat when exposed to a 625-2500 nm light source, for example when exposed to a 625-1500 nm light irradiation. Advantageously, the heat-generating dye may comprise:

an opened conjugated system containing two N or S atoms, preferably two N atoms, the lone pairs of which may participate in the conjugated system;

a conjugated macrocyclic system containing four N or S atoms, preferably four N atoms, complexed to a single metal atom; preferably a metal atom that absorbs in the red to near-infrared region of 625-2500 nm, for example a metal atom that absorbs in the range 625-1500 nm;

a metal complex comprising two bidentate conjugated ligands; each bidentate ligand containing two N or S atoms, preferably two S atoms, complexed to a single metal atom; preferably a metal atom that absorbs in the red to near-infrared region of 625-2500 nm, for example a metal atom that absorbs in the range 625-1500 nm.

For example, a heat-generating dye selected from any one or more of the following may be used:

(i) cyanine dyes;

(ii) squaraine and squarylium dyes;

(iii) push-pull compounds;

(iv) BODIPY and pyrromethene dyes;

(v) Dithiolene metal salt dyes;

(vi) Porphyrin dyes;

(vii) Copper complex dyes;

(viii) Phthalocyanine dyes;

or a mixture of one or more of the above.

The dyes may be tested for their ability to generate heat upon red-NIR irradiation by thermal imaging. For this characterization, an appropriate concentration of red-NIR dye is incorporated in the polymerizable resin and irradiated with the red-NIR light. Through thermal imaging experiments, the temperature of the resin can be recorded for different irradiation times. Thermal camera, thermocouple or pyrometer can also be used to record the temperature. Without the presence of the red-NIR-dye the temperature remains almost unchanged showing the role of the red-NIR dye as heater.

As used herein, the term "cyanine dye" does not deviate from the conventional meaning of the term in the art, and refers to a dye having an opened conjugated system where a moiety

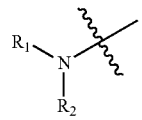

and a moiety

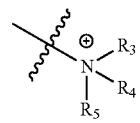

are covalently linked via a conjugated system of two or more double bonds, some of which may belong to an aromatic radical. A counter-ion X$^-$ is typically present to counterbalance the positive charge of the ammonium ion. Advantageously, X$^-$ may represent Cl$^-$, I$^-$, ClO$_4^-$, p-toluenesulfonate, p-dodecylbenzenesulfonate, or a borate anion, such as triphenylbutylborate. Advantageously, the counter ion X$^-$ may represent a borate anion. For example X$^-$ may represent triphenylbutylborate. The expression "opened conjugated system" refers to the fact that the moieties

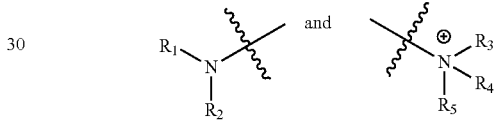

do not form a cycle together with the conjugated double bonds (i.e, the whole does not piggy-back together to form a cycle). However, the whole system may comprise one or more mono- or polycyclic alicyclic, heterocyclic, aromatic or heteroaromatic radicals. For example, cyanine dyes useable in the context of the invention include as synthetic dyes with the general formula R$_2$N[CH=CH]$_n$CH=N$^+$R$_2$ or R$_2$N$^+$=CH[CH=CH]$_n$NR$_2$ (n is a small number, typically 2-5) in which the nitrogen and part of the conjugated chain usually form part of a heterocyclic system, such as imidazole, pyridine, pyrrole, quinoline and thiazole, e.g. [2]

As used herein, the term "squaraine dye" does not deviate from the conventional meaning of the term in the art, and refers to a family of chromophores containing structures such as cyanine dyes, two donor groups conjugated to an electron deficient oxocyclobutenolate core, leading to a highly electron delocalized structure that can be exemplified as zwitterions. Generally, squaraine dyes with donor-acceptor-donor (D-A-D) structures are synthesized by the condensation reaction of 3,4-dihydroxy-3-cyclobutene-1,2-dione (squaric acid) with activated aromatic or heterocyclic components [3]

As used herein, the term "push-pull dye" does not deviate from the conventional meaning of the term in the art, and refers to organic pi-systems end-capped with an electron donor (D) and an electron acceptor (A) at each side of the pi-system. Interaction between A and D allows intramolecular charge-transfer (ICT) and a new low-energy molecular orbital is formed. Thus, it is easier to achieve excitation of electrons in the molecular orbital at longer wavelength. Typical electron donors D are represented by the substituents with +M/+I effects such as OH, NH$_2$, OR and NR$_2$, heterocyclic moieties . . . . On the other hand, the most used electron acceptors A involve substituents featuring M/I effects such as NO₂, CN, CHO, electron deficient heterocyclic compounds . . . [4]

As used herein, the term "BODIPY" does not deviate from the conventional meaning of the term in the art, and refers to boron-dipyrromethene type compounds, which is a class of fluorescent dyes. It is composed of dipyrromethene complexed with a disubstituted boron atom, typically a BF2 unit. [5]

As used herein, the term "dithiolene dye" does not deviate from the conventional meaning of the term in the art, and refers to metal complexes including unsaturated bidentate ligands containing two sulfur donor atoms (e.g., dithiolene ligands attached to a central metal). They may be also referred to as "metallodithiolene dyes". Generally, the metal used is nickel, palladium or platinum and is in a zerovalent state. Dithiolene ligands are unsaturated bidentate ligand wherein the two donor atoms are sulfur. This formed square planar complexes. Because of the extensive electron delocalization about the dithiolene ring system and the interaction of this delocalized system's available d-orbitals on the central metal, strong NIR absorption is observed with these compounds. [6]

Advantageously, a dithiolene dye useable as heat-generator according to the present invention include:

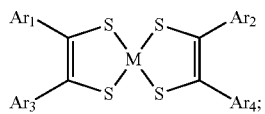

wherein M represents a metal center that absorbs in the red to near-infrared region of 625-2500 nm, for example a metal atom that absorbs in the range 625-1500 nm, such as Ni; and $Ar_1$, $Ar_2$, $Ar_3$, and $Ar_4$ independently represent a $C_{6-10}$ aryl; wherein each aryl moiety may be, individually, further substituted with one or more substituents, such as —OH, —OR, halogen atom, —NO₂, —CN, —$NR^A_1R^A_2$, —NHC(=O)$R^A_3$, —OC(=O)$R^A_3$, vinyl, or linear or branched $C_{1-10}$ alkyl or $C_{6-10}$ aryl moieties; wherein R and $R^A_3$ independently represent a linear or branched $C_{1-10}$ alkyl or $C_{6-10}$ aryl moiety; and $R^A_1$ and $R^A_2$ independently represent H or linear or branched $C_{1-6}$ alkyl or $C_{5-10}$ aryl moieties, where $R^A_1$ and $R^A_2$, taken together with the nitrogen atom to which they are attached, may form a 5- or 6-membered heterocyclic moiety; wherein each of the foregoing aryl moieties may be, individually, further substituted with one or more linear or branched $C_{1-6}$ alkyl or $C_{6-10}$ aryl moieties. Advantageously, $Ar_1$, $Ar_2$, $Ar_3$, and $Ar_4$ may independently represent a phenyl moiety; wherein each phenyl moiety may be, individually, further substituted with one or more substituents, such as those as described immediately above, preferably linear or branched $C_{1-6}$alkyl moieties, including methyl, propyl, butyl, i-propyl.

As used herein, the term "porphyrin dye" does not deviate from the conventional meaning of the term in the art, and refers to conjugated heterocyclic macrocycle metal complexes comprising four modified pyrrole subunits interconnected at their α carbon atoms via methine bridges (=CH—).

Advantageously, a porphyrin dye useable as heat-generator according to the present invention may have a heterocyclic conjugated system having the structure:

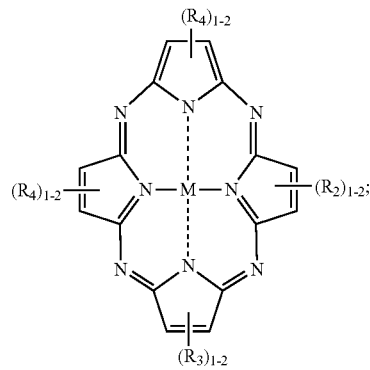

wherein M represents a metal center that absorbs in the red to near-infrared region of 625-2500 nm, for example a metal atom that absorbs in the range 625-1500 nm, such as Mg or Cu; and each occurrence of $R_1$, $R_2$, $R_3$, and $R_4$ may independently represent H, —C(=O)$OR_5$, vinyl, a linear or branched $C_{1-10}$ alkyl or a $C_{6-10}$ aryl moiety; wherein $R_5$, for each occurrence, may independently represent H or an alkali metal cation such as Na⁺; and wherein each of the foregoing alkyl or aryl moieties may be, individually, further substituted with one or more linear or branched $C_{1-6}$alkyl or $C_{6-10}$ aryl moieties.

As used herein, the term "copper complex dye" does not deviate from the conventional meaning of the term in the art, and refers to conjugated oxygen-containing systems (acetylacetonate derivatives) comprising either one of the following basic motifs:

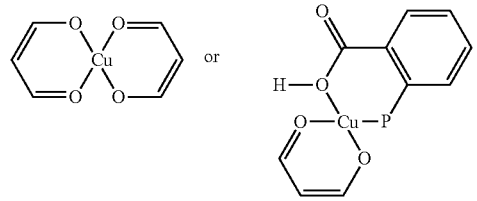

each of which may bear one or more alkyl and/or aryl substituents.

As used herein, the term "phthalocyanine dye" does not deviate from the conventional meaning of the term in the art, and refers to conjugated macrocycles which, depending on how they were synthesized, contain different metal or metalloid inclusions. Advantageously, a phthalocyanine dye useable as heat-generator may have a cyclic conjugated system having the structure:

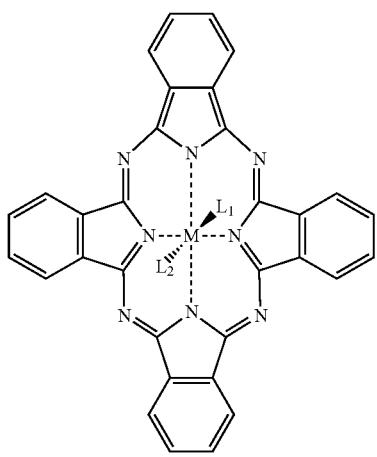
wherein M represents a metal center, for example Mn, and $L_1$ and $L_2$ independently represent acyloyl ligands or may be absent, depending on the metal atom valency.
For example, any one or more of the following may be used:
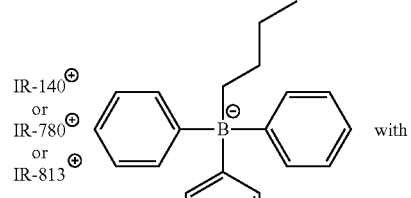
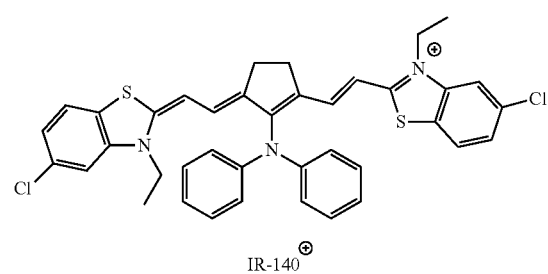
IR-140⊕
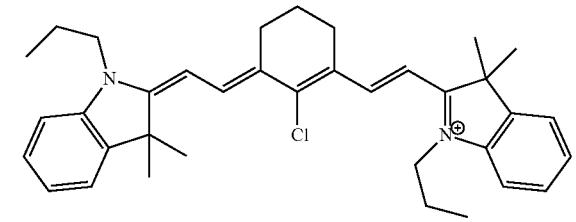
IR-780⊕
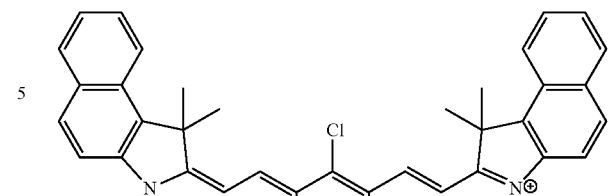
IR-813⊕
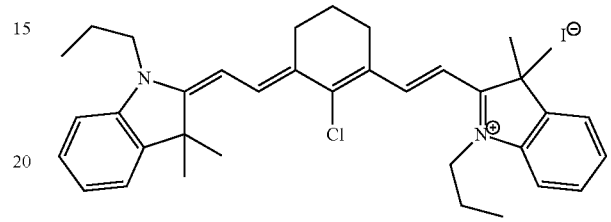
IR-708 iodide
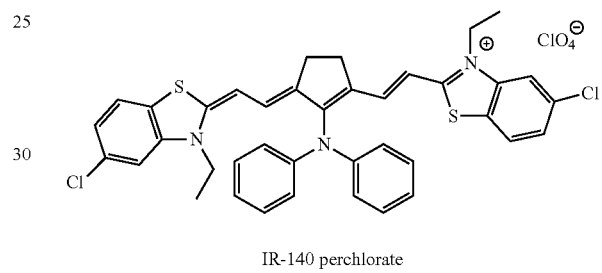
IR-140 perchlorate
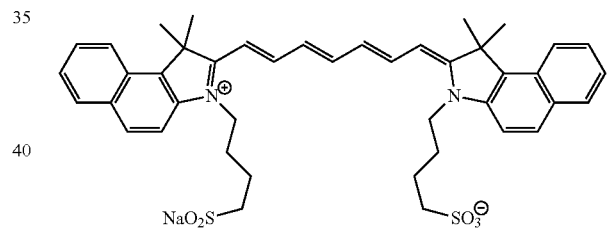
Indocyanine Green
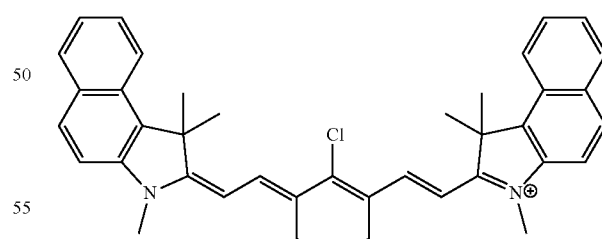
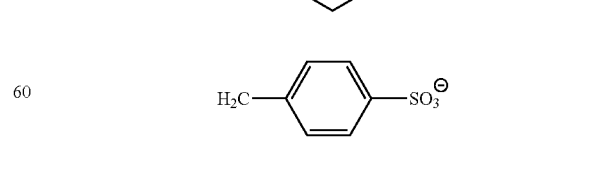
IR-813 p-toluenesulfonate

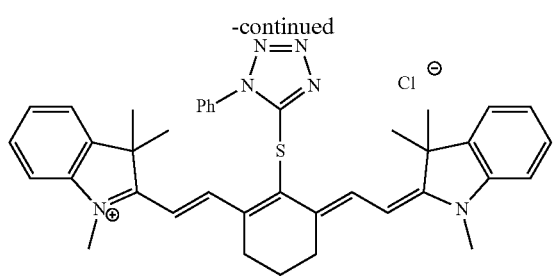
S0507
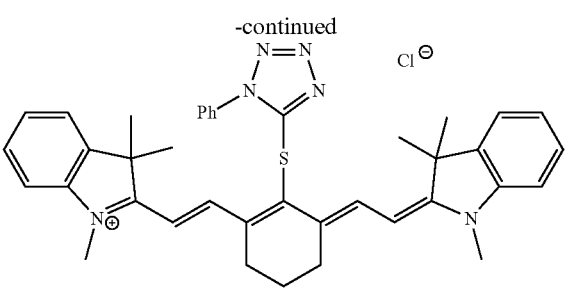
S0507
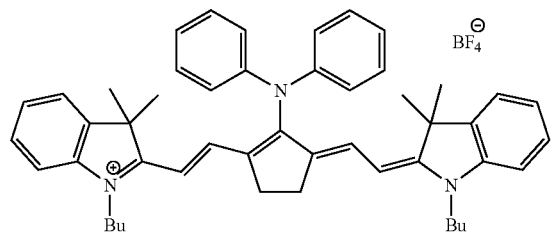
S2025
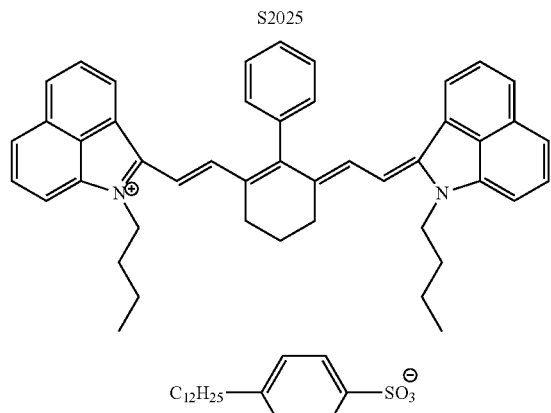
S0991
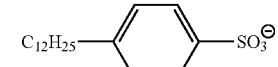
S2544
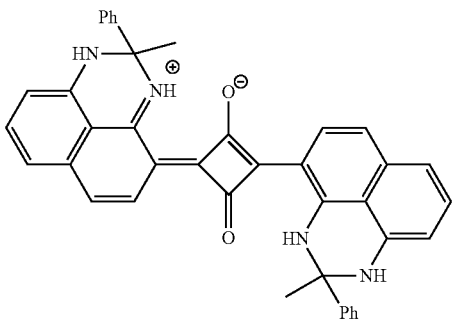
S2425
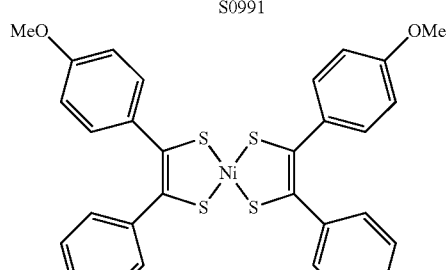
Ni1
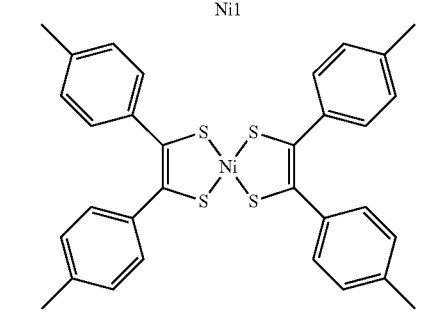
Ni2
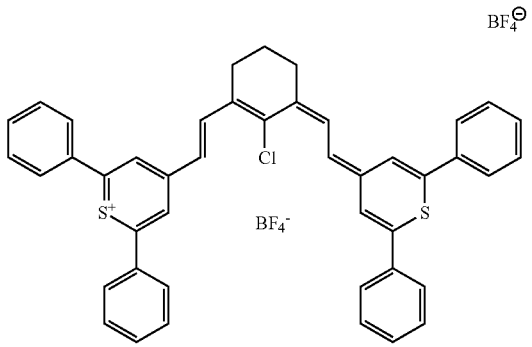

-continued

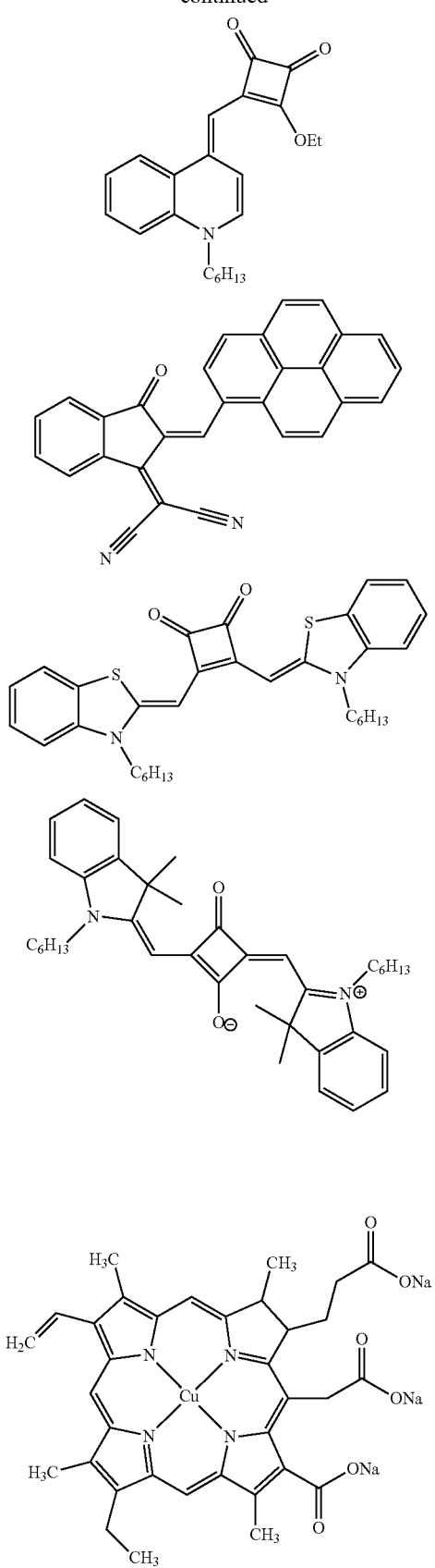

-continued

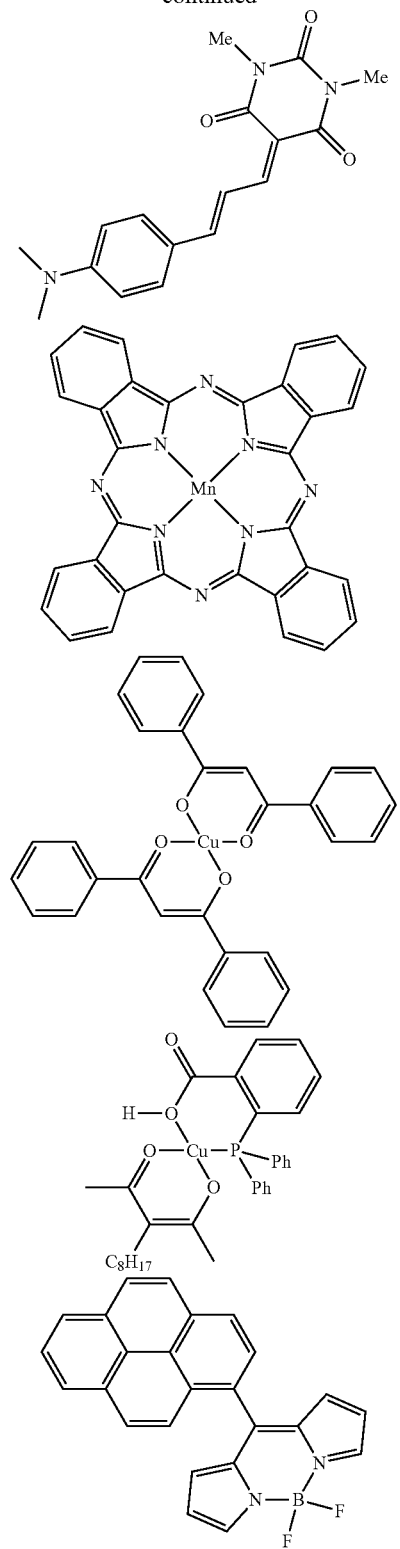

Preferred photoinitiators or photosensitizers are those that absorb in the UV-visible range, notably between 200 and 1600 nm. As such, type I photoinitiators, type II photoinitiators, organic dye photosensitizers such as eosin Y and Rose Bengal; and polyaromatic hydrocarbon photosensitizers such as pyrene and anthracene will be preferred. Most preferably, camphorquinone or thioxanthone compounds such as ITX, 2-ITX and CPTX may be used.

Advantageously, the photoinitiator or photosensitizer may be used in 0.1-0.5 wt %, preferably 0.1-0.4 wt %, preferably 0.1-0.3 wt %, most preferably ≤0.25 wt % based on the total weight of the polyfunctional cyclic ether component(s)+polyfunctional amine component(s).

Oxidation Agent

Advantageously, the at least one oxidation agent may be selected from any suitable oxidation agent known in the art. For example, mention may be made of onium salts, in particular iodonium salts of formula $((R_A)_2I^+X_A^-)$, or sulfonium or thianthrenium salts of formula $(R_B)_3S^+X_A^-$; wherein each occurrence of $R_A$ and $R_B$ independently represents a $C_{6-10}$ aryl or a $C_{1-10}$ alkyl moiety; wherein the aryl moiety may be, individually, further substituted with one or more linear or branched $C_{1-6}$ alkyl, —$OC_{1-6}$ alkyl, —$SC_{1-6}$ alkyl moieties, or $C_{6-10}$ aryl, —$OC_{6-10}$ aryl, —$SC_{6-10}$ aryl, —$C(=O)C_{6-10}$ aryl moieties; wherein two adjacent radicals $R_B$ together with the S atom to which they are attached may form a 6-membered heterocyclic moiety; and wherein $X_A^-$ represents a suitable counter ion such as $B(PhF_6)_4^-$, $AsF_6^-$; $PF_6^-$, $SbF_6^-$ or $Cl^-$. Preferably iodonium salts or thianthrenium salts, as defined above, may be used. The following iodonium salts and thianthrenium salts are particularly preferred:

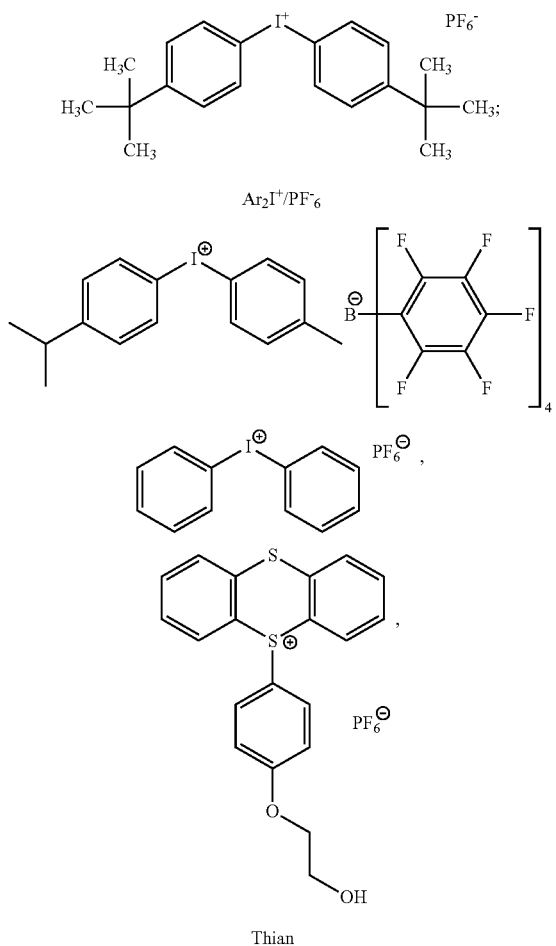

Thian

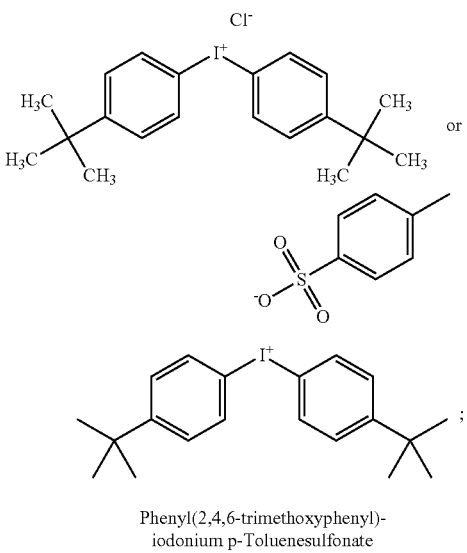

Phenyl(2,4,6-trimethoxyphenyl)-iodonium p-Toluenesulfonate

Sulfonium salts such as triphenylsulfonium trifalte may also be used.

Peroxides such as dibenzoyl peroxide, lauroyl peroxide, dicumyl peroxide, di-tert-butyl peroxide, cumyl hydroperoxide, tert-butyl perbenzoate, cyclohexanone peroxide, methyl ethyl ketone hydroperoxide, acetylacetone peroxide, tert-butyl peroctoate, bis-2-ethylhexyl peroxide dicarbonate or tert-butyl peracetate, or 2-butanone peroxide, may also be used as oxidation agent in the context of the present invention. Preferably, the oxidation agent may not be a silicone-type peroxide, such as triphenyl(t-butylperoxy) silane, triphenyl(α,α'-dimethylbenzylperoxy) silane, and diphenyl(α,α'dimethylbenzylperoxy) silane.

Advantageously, the oxidation agent, for example iodonium salt, may be used in 0.1-10.0 wt %, preferably 0.1-8.0 wt %, preferably 0.1-5.0 wt %, most preferably 1.0-5.0 wt % based on the total weight of the polyfunctional cyclic ether component(s)+polyfunctional amine component(s).

Benzyl-Type Alcohol

Advantageously, the benzyl-type alcohol may be selected from any suitable alcohol featuring an —OH group on a carbon atom α or β to an aromatic or heteroaromatic nucleus known in the art.

Benzyl-type alcohols useable in the context of the present invention may be represented by:

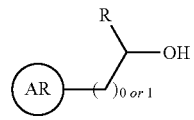

wherein:
AR represents an optionally substituted C6-C10 aryl or heteroaryl moiety (substituents may include halogen, linear or branched C1-6alkyl or linear or branched C1-6heteroalkyl);
R represents H or linear or branched C1-6alkyl; preferably R represents H or methyl.

For example AR may represent an optionally substituted phenyl or N-carbazolyl group:

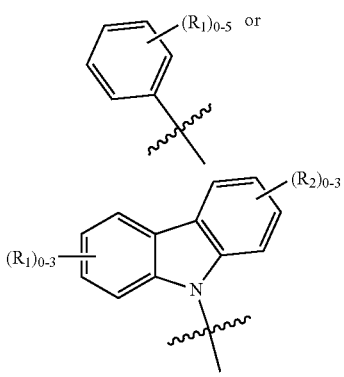

wherein each occurrence of R1, R2 and R3 independently represents H, halogen, linear or branched C1-6alkyl or linear or branched C1-6heteroalkyl.

For example, benzyl alcohol may be used. The following benzyl-type alcohols may also be used:

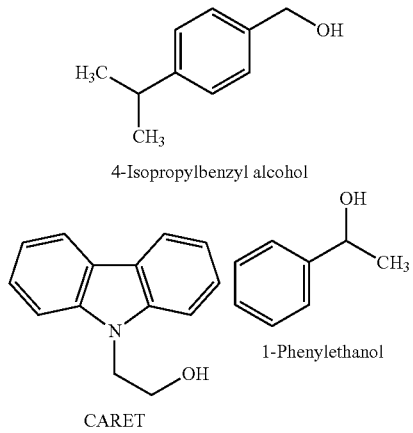

4-Isopropylbenzyl alcohol

1-Phenylethanol

CARET

The presence of benzyl-type alcohol promotes a a remarkable improvement in the reactivity of the polyaddition. Advantageously, benzyl-type alcohol additives may be used alone or in admixtures of two or more benzyl-type alcohols. Typically, benzyl-type alcohol additives may be used in the range of 0.1-5.0 wt %, preferably 0.1-4.0 wt %, preferably 0.1-3.0 wt %, most preferably ≤2.5 wt % based on the total weight of the polyfunctional cyclic ether component(s)+polyfunctional amine component(s). For example about 2 wt % of benzyl-type alcohol may be used based on the total weight of the polyfunctional cyclic ether component(s)+polyfunctional amine component(s). Some preferred combinations include, but are not limited to: 4-isopropylbenzyl alcohol/G1, CARET/G1, 1-phenylethanol/G1 and CARET/ITX.

Methods and Uses

In another aspect, the present invention provides the use of a photoinitiator or photosensitizer in combination with an oxidation agent selected from iodonium salts, sulfonium salts, peroxides and thianthrenium salts, for accelerated photopolyaddition of cyclic ether-amine resins under UV-visible to near-infrared irradiation. Preferably, the oxidation agent may be selected from iodonium salts, peroxides and thianthrenium salts; more preferably iodonium salts and thianthrenium salts.

In another aspect, the present invention provides the use of a photoinitiator or photosensitizer in combination with an oxidation agent selected from iodonium salts, sulfonium salts, peroxides and thianthrenium salts, for dark curing cyclic ether-amine resins under UV-visible to near-infrared irradiation. As used herein, the term "dark curing" refers to continued polymerization after the UV-visible to near-infrared light source has been removed, i.e., the polymerization is not immediately terminated when the UV-visible to near-infrared light source is removed (the polyaddition continues by thermal self-curing process). The present invention therefore provides a system for dark curing cyclic ether-amine resins in an acceptable time frame and to a sufficient depth using a UV-visible to near-infrared light source-initiated two-component system. Preferably, oxidation agent may be selected from iodonium salts, peroxides and thianthrenium salts; more preferably iodonium salts and thianthrenium salts.

In yet another aspect, the present invention provides a process for accelerated curing of a cyclic ether-amine resin comprising the step of exposing to a UV-visible to near-infrared irradiation, preferably of intensity I>25 mW/cm², a composition comprising:
  at least one polyfunctional cyclic ether component comprising at least two cyclic ether moieties; and
  at least one polyfunctional amine component comprising at least two primary and/or or secondary amine moieties;
in the presence of a photoinitiating system generating catalytic species comprising:
  at least one suitable photoinitiator or a photosensitizer that absorbs light at the desired UV-visible to near-infrared irradiation under which the composition is to be cured; and
  at least one oxidation agent able to react with the photoinitiator or the photosensitizer, selected from iodonium salts, sulfonium salts, peroxides and thiantheniums salts; preferably, the oxidation agent may be selected from iodonium salts, peroxides or thianthrenium salts; more preferably iodonium salts or thianthrenium salts.

The polyfunctional cyclic ether component, the polyfunctional amine component, the photoinitiator/photosensitizer and the oxidation agent may be as defined in any variant described above and herein. Advantageously, the process may be carried out at a moderate radiation intensity, for example 25 mW/cm²≤I≤100 W/cm², preferably 25 mW/cm²≤I≤20 W/cm². Advantageously, the duration of exposure of the resin to UV-visible to near-infrared irradiation will depend on the irradiation intensity: the higher the intensity, the smaller the duration time necessary. Typically, for practical purposes, the duration of exposure of the resin to UV-visible to near-infrared irradiation should be 510 minutes, more 55 minutes. Advantageously, the duration of exposure of the resin to UV-visible to near-infrared irradiation preferably may be 1 to 800 seconds, preferably between 1 and 300 seconds, more preferably between 1 and 150 seconds.

In all of the above aspects, a benzyl-type alcohol comprising an —OH group on a carbon atom α or β to an aromatic or heteroaromatic nucleus may be used as additive for enhancing the curing process of a cyclic ether-amine resin according to the present invention.

Advantageously, the process may further comprise a step of mixing or impregnating composite reinforcements with said composition prior to UV, Visible, to near-infrared irradiation. The composite reinforcements may be any suitable reinforcements known in the art, and will be selected depending of the intended composite, and desired composite properties. For example, the composite reinforcements may be glass fibers, carbon fibers, aramid fibers, basalt fibers, silica fibers, polymer fibers, natural fibers or a mixture of two or more of those.

One stark advantage of the process is that crosslinking/curing of the composition may occur throughout the whole thickness of the composition, even in the presence of reinforcements. This allows the manufacture of thick composites, particularly laminate composites. For example, the sample to be cured/crosslinked is at least 1 cm thick, preferably at least 2 cm thick, mist preferably >3 cm thick.

The polyaddition of amines onto cyclic ether groups is not oxygen sensitive. Accordingly, the process may be carried out under air.

In yet another aspect, the present invention provides the use of an alcohol comprising an —OH group on a carbon atom α or β to an aromatic or heteroaromatic nucleus for enhancing a curing process of a cyclic ether-amine resin according to the present invention, as described in any variant herein.

It is to be understood that all the variants described above, notably for the various components for the curable compositions according to the invention are applicable mutatis mutandis to this section, and will be understood to apply to the processes/polymerization methods/uses defined in this section. This includes all the variants described in the "DETAILED DESCRIPTION OF CERTAIN PREFERRED EMBODIMENTS OF THE INVENTION" section of this document, including any one and all variants relating to the a) polyfunctional cyclic ether component, b) polyfunctional amine component, c) photosensitizer or photoinitiator, and d) the oxidation agent. In addition, all the variants relating to the irradiation light source described in the present document are applicable mutatis mutandis to this section. All the variants relating to the benzyl-type alcohol additive described in the present document are applicable mutatis mutandis to this section.

Articles and Composites

In another aspect, the present invention provides a resin casting, film or coated substrate comprising a cyclic ether-amine resin obtained by an accelerated curing process according to the invention, as described generally and in any variants herein. Advantageously, the substrate may include metal, glass, ceramic, plastic, adhesive polymer, composite, concrete or wood.

Also provided is a process for forming the substrate defined above, said process comprising spraying, coating or applying said composition onto a substrate and subsequently curing said composition under UV-visible to near-infrared irradiation. Advantageously, the UV-visible to near-infrared irradiation may be of moderate intensity (e.g., as low as 25 mW/cm$^2$ or even lower, for example 25 mW/cm$^2 \leq I \leq 20$ W/cm$^2$).

In another aspect, the present invention provides an adhesive layer or bonding agent comprising a cyclic ether-amine resin obtained by an accelerated curing process according to the invention, as described generally and in any variants herein.

In another aspect, the present invention provides a composite comprising (i) a cyclic ether-amine resin obtained by an accelerated curing process according to the invention, as described generally and in any variants herein, and (ii) a reinforcing agent. Advantageously, the reinforcing agent may include fibers, such as glass fibers, carbon fibers, aramid fibers, basalt fibers, silica fibers, polymer fibers, natural fibers or a mixture of two or more of those.

In another aspect, the present invention provides the Use of a composition according to the invention, as described generally and in any variants herein, for increasing the delamination strength of laminated composite materials.

Likewise, for each of the above three aspects, the variants described above, notably for the various components for the compositions according to the invention are applicable mutatis mutandis to this section, and will be understood to apply to the articles/composites materials defined in this section. This includes all the variants described in the "DETAILED DESCRIPTION OF CERTAIN PREFERRED EMBODIMENTS OF THE INVENTION" section of this document, including any one and all variants relating to the a) polyfunctional cyclic ether component, b) polyfunctional amine component, c) photosensitizer or photoinitiator, and d) the oxidation agent. In addition, all the variants described below relating to the irradiation light source described below in the present document are applicable mutatis mutandis to this section.

Advantageously, the methods/processes according to the invention can generally be carried out using conventional methods of preparing the above described cyclic ether/amine adducts according to the present invention in a suitable mixing device such as, but not limited to, stirred tanks, dissolvers, homogenizers, microfluidizers, extruders, or other equipment conventionally used in the field.

When the method/process of the invention is used in the preparation of composites and/or laminated articles, the process may further comprise a step of adding a material/reinforcement designed for this purpose using known methods.

Advantageously, the method/process may further comprise a step of impregnating composite reinforcements with a mixture of the composition according to the present invention and a mixture of at least one polyfunctional cyclic ether component and at least one polyfunctional amine component according to the invention, in a mold, such as a silicone mold, prior to the application of light source.

Advantageously, the composite reinforcements may be any reinforcing conventionally used in the manufacture and implementation of composite materials. For example, the composite reinforcements may be selected from:

Glass fibers
Carbon fibers
Aramid fibers (Kevlar®)
Basalt fibers
Silica fibers
Silicon carbide fibers
Polymer fibers
Vegetal fibers (hemp, flax . . . )
Mineral, metallic or organic fillers (for example gravel, sand, glass beads, carbonate powder, alumina hydrate powder, steel powder, aluminum powder, polymer particles, titanium oxide, alumina, etc. . . . )

Advantageously, the composite reinforcements may be selected from glass fibers, carbon fibers, aramid fibers, basalt fibers, silica fibers, polymer fibers (such as polyesters, poly (p-phenylene-2,6-benzobisoxazole), aliphatic and aromatic polyamides, polyethylene, polymethyl methacrylate, polytetrafluoroethylene), natural fibers (such as nettle, flax or hemp fibers) . . . .

Advantageously, the composite reinforcements may be previously disposed in a mold, and then impregnated by a mixture of the red-NIR photoinduced thermal-initiating composition a mixture of at least one polyfunctional cyclic ether component and at least one polyfunctional amine component according to the invention (step(i)), before application of light radiation (step (ii)).

Alternatively, composite reinforcements may be pre-impregnated with a mixture of the photo-initiating composition and a mixture of at least one polyfunctional cyclic ether component and at least one polyfunctional amine component according to the invention. Then the resulting mixture may be deposited/spread evenly over the mold, either manually or using an automated robot, in the case of mass production.

The process may further include a step of adding any other additive conventionally used in the field of resins, composite materials and applications. Examples of suitable additives include:

- pigments, such as colored pigments, fluorescent pigments, electrically conductive pigments, magnetically shielding pigments, metal powders, scratch-proofing pigments, organic dyes or mixtures thereof;
- light stabilizers such as benzotriazoles or oxalanilides;
- crosslinking catalysts such as dibutyltin dilaurate or lithium decanoate;
- slip additives;
- defoamers;
- emulsifiers, especially nonionic emulsifiers such as alkoxylated alkanols and polyols, phenols and alkylphenols or anionic emulsifiers, such as alkali metal salts or ammonium salts of alkanecarboxylic acids, alkanesulfonic acids, alkanol sulfonic acids or alkoxylated polyols, phenols or alkyl phenols;
- wetting agents such as siloxanes, fluorinated compounds, carboxylic monoesters, phosphoric esters, polyacrylic acids or their copolymers, polyurethanes or acrylate copolymers, which are commercially available under the trademark MODAFLOW® or DISPERLON®;
- adhesion promoters such as tricyclodecan-dimethanol;
- leveling agents;
- film-forming adjuvants such as cellulose derivatives;
- flame retardants;
- sag control agents such as ureas, modified ureas and/or silicas,
- rheology control additives such as those described in patent documents WO 94/22968 [7], EP0276501A1 [8], EP0249201A1 [9], and WO 97/12945 [10];
- crosslinked polymeric microparticles, as described for example in EP0008127A1 [11];
- inorganic phyllosilicates such as aluminum magnesium silicate, magnesium sodium silicates or magnesium fluoride sodium lithium phyllosilicates of montmorillonite type;
- silicas such as Aerosils® silicas;
- flatting agents such as magnesium stearate; and/or
- tackifiers.

Mixtures of at least two of these additives are also suitable in the context of the invention.

As used herein, the term "tackifier" refers to polymers which increase the tack properties, that is to say, the intrinsic viscosity or self-adhesion, the compositions so that, after a slight pressure a short period, they adhere firmly to surfaces.

Irradiation Light Source

For purposes of the present invention, any light source known in the art, capable of generating light in the 200-2500 nm region, for example in the range of 200-1600 nm, may be used. For example, light emitted from LED bulbs, laser, laser diode, low pressure mercury and argon lamps, fluorescent light systems, electric arc-light sources, high intensity light sources may be used.

For example, the light source may generate light in the visible and middle-to-near UV spectrum, ranging from 200-900 nm in wavelengths. Any source of visible light or middle-to-near UV light may be used. By visible light is meant the visible spectrum in the wavelengths from about 390 to 700 nm. By middle-to-near UV light is meant the light spectrum in the wavelengths from about 200 to 390 nm. Sources of visible light include LED bulbs, laser diode, green fluorescence bulbs, halogen lamps, household lamps including energy-saving lamps, or natural light. Sources of middle-to-near UV light include BLB type lamps, Mercury-vapor lamps, Sodium vapor lamps or Xenon arc lamps.

Advantageously, the light source may generate light in the red region of the light spectrum (i.e., 625-750 nm). For example, light sources that may be used to that effect include LED bulb, laser, laser diode, fluorescent light system, electric arc light source, high intensity (metal halide 3000K, high pressure sodium lamp), Xenon light, Mercury-Xenon light.

Advantageously, the light source may generate light in the near-infrared region of the light spectrum (i.e., 700-2500 nm, for example 700-1500 nm). For example, light sources that may be used to that effect include NIR LEDs, NIR lasers, low pressure mercury and argon lamps (696-1704 nm) Tungsten light source, tungsten halogen light source, Nd:Yag laser, Nd:YVO$_4$, Nd:CidVO$_4$, Nd:LuVO$_4$, CO$_2$ laser, the intensity of which (especially for the most powerful irradiation light source systems such as lasers (e.g., Nd:Yag lasers)) may be tuned down to the desired intensity (for example 25 mW/cm$^2$≤I≤100 W/cm$^2$, preferably 25 mW/cm$^2$≤I≤20 W/cm$^2$) for purposes of reducing the present invention to practice.

An important advantage of the invention is that cyclic ether-amine polyaddition can be effected under moderate irradiation intensity, typically as low as 25 mW/cm$^2$ or even lower.

It is understood that the light source may be a tunable power light source; that is one that is equipped with tunable power, so as be able to adjust the power of the light irradiation (in UV-visible to near infrared range), if needed. Such tunable power light source may also be used to determine the light intensity threshold at which a particular dye starts to absorb at any given wavelength, and therefore to fine-tune the wavelength/irradiation intensity that may be used to obtain optimal conditions for polymerization.

Likewise, the absorbance profiles of dyes known to absorb in the UV-visible to near infrared range of the light spectrum are known or can be readily determined by running an absorbance vs. wavelength graph. As will be readily apparent throughout the teachings of the present document, if a particular dye exhibits low/moderate absorbance at a given wavelength, one may still proceed with that particular dye at the same given wavelength by increasing the intensity of the light irradiation. This may be done by using a tunable power light source for example, such as commercially available tunable power red to near-infrared light sources.

When a heat-generating dye in the red-NIR is used, the light source may be preferably selected as a function of the heat-generating dye to be used: most advantageously, the light source may be one that emits light in the wavelength range where the dye most readily absorbs the light to generate an exotherm, which thermally initiates the polymerization process. The heat-generating profiles of dyes known to absorb in the red or near infrared range of the light spectrum are known or can be readily determined by running an exotherm vs. wavelength graph using thermal imaging.

Briefly, the heat-generating potential of a red-NIR dye may be determined using an infrared thermal imaging camera, such as (Fluke TiX500) with a thermal resolution of about 1° C. and a spatial resolution of 1.31 mRad by recording the heat released by the red-NIR dye in the resin (mixture of at least one polyfunctional cyclic ether component and at least one polyfunctional amine component according to the invention) under exposition to the suitable irradiation is described in detail in [12].

As discussed above, if a particular dye generates low/moderate heat at a given wavelength, one may still proceed with that particular dye at the same given wavelength by increasing the intensity of the light irradiation. This may be done by using a tunable ower light source for example, such as commercially available tunable power red to near-infrared light sources.

Synthetic Methods

The practitioner has a well-established literature of synthetic organic and inorganic chemistry and polymer chemistry to draw upon, in combination with the information contained herein, for guidance on synthetic strategies, protecting groups, and other materials and methods useful for the synthesis of the compositions and cyclic etheramine polyaddition adducts according to the present invention. For example, the reader may refer to the Exemplification section below, and references cited therein for synthetic approaches suitable for the preparation of some of the compositions and cyclic ether-amine polyaddition materials described herein. The reader may refer for example to references [13] and [14], which relate to phthalocyanine dyes. These are often simple to synthesize with relatively high yields and have been used as commercial pigments and dyes for decades.

The present invention finds application in a wide variety of fields, including polymer synthesis, polymer and composite preparation, high adhesion adhesives, high performance composites and adhesives.

The initiation of polymerization by light (UV, visible, NIR) or photopolymerization is a polymer synthesis technique that is recent and whose both industrial and academic demands are constantly growing. The development of new photoinitiator and/or monomer systems is currently in great demand. It concerns many fields of applications such as coatings, inks, 3D printing . . . . One of the main defects of photopolymerization in its current state is the limited diversity of chemical compositions of photopolymerizing resins (acrylates, pure epoxides, thiol-ene, . . . ). The majority is photopolymerized by a free radical polymerization (for example acrylates) which induces a very strong shrinkage effect and, as a result, limits the interest of these resins. Also the adhesion properties of current photopolymerizable resins are not competitive with cyclic ether/amine resins, in particular epoxy/amine resins, on most surfaces/substrates.

On the other hand, two-component cyclic ether/amine resins have a very important industrial success especially in the field of adhesives because they have very important adhesion properties on a variety of very important surfaces/substrates (glass, metal, concrete, plastic, composite, wood, etc. . . . ). However, the setting/curing times of these resins are very long (3-48 hours) at room temperature, which greatly limits the productivity of these processes. In many areas, therefore, faster curing resins are preferred (although with lower properties than cyclic ether/amines, such as epoxy/amines) as setting must occur within the first 10 minutes.

A stark advantage of the invention over existing compositions/processes is that it greatly surpasses the performances of existing materials/methods (conventional photopolymerization and polyaddition), while obviating their drawbacks: the resulting material (polyaddition cyclic ether-amine adduct) exhibits a low shrinkage while having a temporal (acceleration) and spatial control of polymerization, no volatile organic compounds emitted, the polymerization conditions are gentle (no need to heat the medium, non-hazardous irradiation wavelengths, low intensities used . . . ), rapid polymerization, thick composite polymerization readily accessible.

The present invention provides for an unprecedented acceleration of cyclic etheramine polyaddition reactions (lowering the reaction time from 3 hours via conventional processes, down to a few minutes (2-5 minutes) via the process of the present invention.

In summary, the present invention offers many advantages, including:
- compared to conventional cyclic ether/amine polyaddition, such as epoxy/amine polyaddition:
  - Allows unprecedented acceleration of curing time
  - No need to heat the polymerization media (reaction at room temperature (20-25° C.))
  - Better final mechanical properties of the polycyclic ether-amine adduct because better conversion rates are obtained
- compared to conventional photopolymerization:
  - Allows access to photopolymerisable adhesives with much better adhesion properties on almost all substrates (e.g: glass, metal, concrete, plastic, composite, wood, etc.).
  - Allows polymerization of composites (opaque samples)
  - Allows the polymerization of thicker samples (of the order of a few centimetres, as compared to a few millimetres for visible light conventional photopolymerization and a hundred micrometres for UV light conventional photopolymerization)
  - Allows to use longer photopolymerization wavelengths (therefore less energetic and safer for the user)
  - Less expensive starting materials used
  - 2-component photoactivatable systems Other advantages may also emerge to those skilled in the art upon reading the examples below, with reference to the attached figures, which are provided as nonlimiting illustrations.

EQUIVALENTS

The representative examples that follow are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples which follow and the references to the scientific and patent literature cited herein. It should further be appreciated that the contents of those cited references are incorporated herein by reference to help illustrate the state of the art. The following examples contain important additional information, exemplification and guidance that can be adapted to the practice of this invention in its various embodiments and the equivalents thereof.

EXEMPLIFICATION

The polymer materials and compositions of this invention and their preparation can be understood further by the examples that illustrate some of the processes by which these polymer materials and compositions are prepared or used. It will be appreciated, however, that these examples do not limit the invention. Variations of the invention, now known or further developed, are considered to fall Within the scope of the present invention as described herein and as hereinafter claimed.

Materials and Methods

1/ Two-Component Mixing Procedure

All formulations were prepared from the bulk resin out at room temperature (RT) (21-25° C.). Unless otherwise indicated, about exactly 1.50±0.03 g epoxy (75%) was mixed with 0.5±0.02 g amine (25%) during about 45 sec before each experiment. Throughout the Examples, % in epoxy component and polyfunctional amine component are expressed in wt % relative to the total weight epoxy component+amine component, without additives. The photoinitiators were first dissolved in the amine component. Their weights are given as a percentage of the total epoxy/amine mixture (e.g. 1 wt % CPTX corresponds to 20 mg CPTX in 2.00 g of epoxy/amine mixture without additives).

2/ RT-FTIR Spectroscopy

A Jasco 6600 Real-Time Fourier Transformed Infrared Spectrometer (RT-FTIR) was used to follow the reactive function conversion versus time for polyadditions of 1.4 mm and 40 µm thick samples. The evolution of the near infrared epoxide peak was followed from 4470 to 4568 cm$^{-1}$. The evolution of the near infrared primary amine peak (NH$_2$) was followed from 4848 to 5050 cm$^{-1}$. The evolution of both near infrared primary and secondary amine peaks (NH) (Table 1) were followed from 6390 to 6635 cm$^{-1}$. A LED@405 nm (Thorlabs) having a limited irradiance of 110 mW/cm$^2$ at the sample position was used for the photopolymerization experiments (FIG. 5E). Another laser diode LD@405 nm (CNI lasers, MDL-Ill-405-500 mW) having an intensity of 450 mW/cm$^2$ (at the sample position) was used for photopolyaddition under higher intensity. The emission spectra are already available in the literature. [15]

Finally, thermal polyadditions were performed at 50° C. in a laboratory oven (50° C. corresponding to the maximum exothermicity of CPTX in epoxy component irradiated by the LED@405 nm, 210 mW/cm$^2$). Epoxy and amine components were mixed and then introduced in the oven. A first trial was checked for gelation time every 20 minutes. Sample was cured sample between 1 h 20 min and 1 h 40 min; 1 h 20 min was kept as curing time. That experiment was repeated three times and these samples were used for the determination of epoxy and amine conversion under heated media.

3/ Dynamic Mechanical Analysis (DMA) of the Materials

DMA measurements were carried out with shearing mode on a METTLER TOLEDO DMA 861 viscoanalyser. Cylindrical polymer samples for the DMA measurements had a diameter of 8 mm and thickness of 2 mm. This equipment meets the requirement of French ISO 9001 for regular calibration and reliable analyses.

4/ Monitoring Photopolymerization Reaction with Thermal Imaging Camera

An infrared thermal imaging camera (Fluke TiX500) was used to monitor the Photopolyaddition of the 4 mm samples. A LED@405 nm (Thorlabs, Solis 405C) having a conveniently adjustable irradiance of 0-1.1 W/cm$^2$ at the sample position was used for the Photopolyaddition experiments (FIG. 4, Table 2 shown in FIG. 18). Fluke SmartView4.1 software was used to present the images. A script—running under Spyder environment (Python language)—was used to recover temperature versus time (at the center of the sample) from raw Fluke data files. A complete description of thermal imaging features for photopolymerizations monitoring is reported in [12]

5/ Thick Samples (2.6 cm) Epoxy-Amine Photopolyaddition

A Pasteur glass pipette (6 mm inner diameter) having an approximate height of 9 cm was sealed at the bottom in order to introduce the epoxy-amine mixing. Irradiation from the top by a LED@405 nm (Thorlabs; light intensity around 230 mW/cm$^2$ at the surface of the sample) was performed from the top during an arbitrary time of 15 minutes. After this, the glass pipette was broken and the obtained polymer sample (thickness: ~2.6 cm) was measured (FIG. 7). The protocol was already validated in two studies using a black taped Pasteur glass in photopolymerization, as reported in [16] and [17].

6/ Computational Procedure

Protonic affinity for each epoxy and amine compounds reaction were calculated with the Gaussian 03 package. Geometries optimization were calculated at UB3LYP/LANL2DZ level; geometries were frequency checked (cf. [18]). Formation enthalpy of each product was subtracted by formation enthalpy of each reagent in the protonation reactions. Visualizations of the optimized geometries are available in Supplementary information. The calculations were performed thanks to the supercomputer located at University of Strasbourg (à verifier ou reformuler).

7/ Statistics

Figures 6A, 6B:
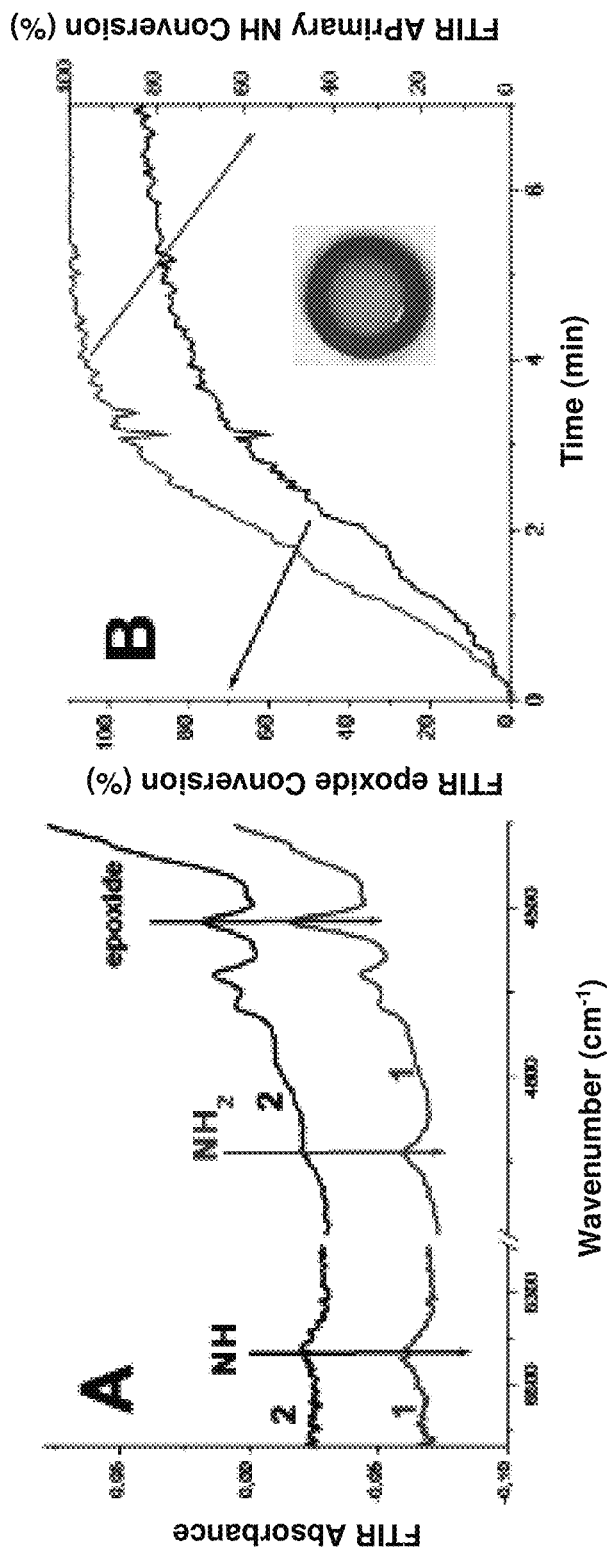
Figure 6D:
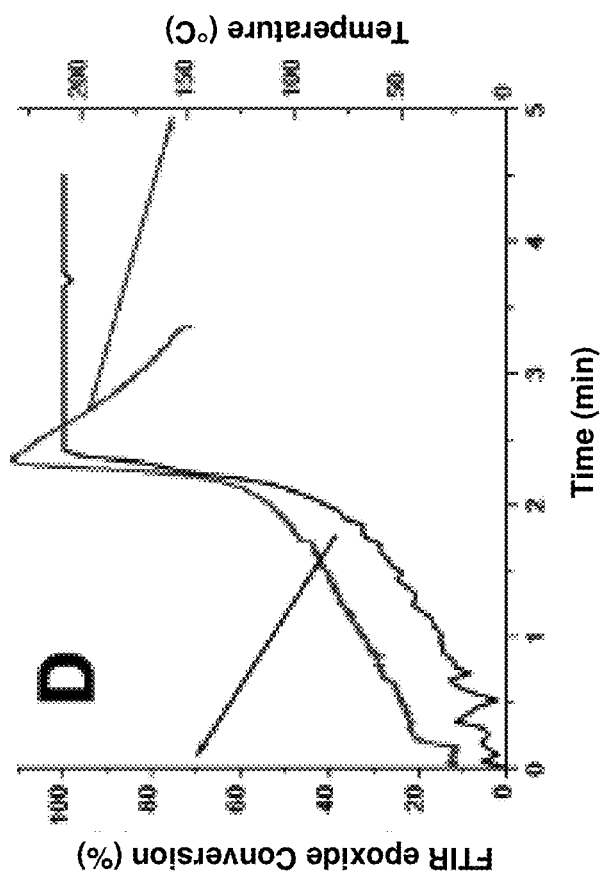
Figure 6C:
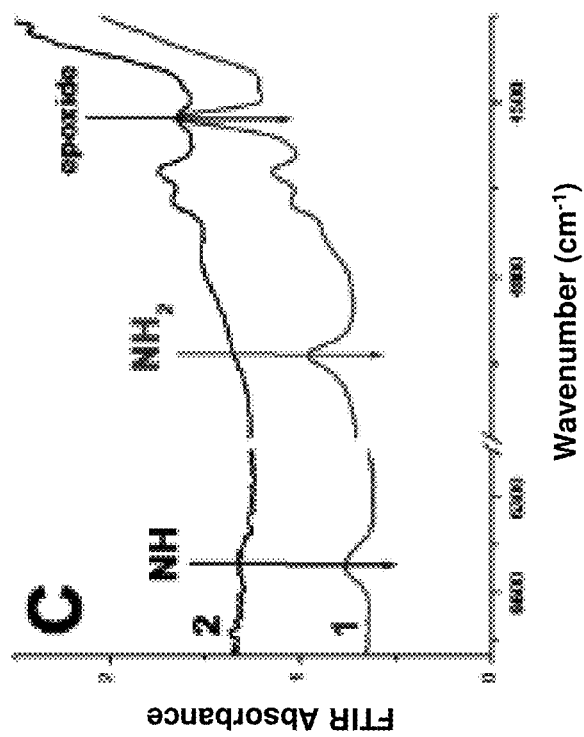

The light induced "Epoxy-amine Photopolyaddition" experiment was reproduced and the same kinetics were obtained (see FIG. 6). Uncertainty of RT-FTIR conversion measurement during photopolymerization experiments is changing as generally related to signal (which was high enough in the case of the 1.4 mm samples, but not very high for 40 µm samples) and noise (bubbles, poor solubility of the compounds, fillers). We estimated uncertainty on the size for thick samples epoxy-amine Photopolyaddition by 3 times reproduction of the experiment. Thermal and spatial resolution of the thermal imaging camera are ±1° C. and about 250 µm respectively, at a 40 cm distance (Cf. [12]).

The three light sources were characterized using a Thorlabs PM100D-S310C digital optical powermeter. First, the soft irradiation LED@405 nm (110 mW/cm$^2$) was used in RT-FTIR (FIG. 5). Then, the LED@405 nm (0-1.1 W/cm$^2$) was used for the thermal imaging characterization of the reaction; its size did not allow us to use it in RT-FTIR experiments. This is the reason why we used the third higher irradiance LD@405 nm (450 mW/cm$^2$, at the sample position) for the experiment presented in FIG. 2.

Example 1—Photopolyaddition of Epoxy-Amine Resins

Chemical Compounds

All the reactants were selected with high purity and used as received. 4-N,N trimethylaniline (4-N,N TMA) and dibenzoyl peroxide (BPO, powder in 50 wt % dicyclohexyl phthalate) were purchased from Sigma-Aldrich. 1-chloro-4-propoxythioxanthone (CPTX) and Di-tertbutyl-diphenyl iodonium hexafluorophosphate (Iod) were obtained from Lambson Ltd. Barium glass fillers (average diameter of 400 nm) were used for the preparation of composites.

Bisphenol A diglycidyl ether (BisA), Bisphenol F diglycidyl ether (BisF) were used in the epoxy component in order to provide good mechanical properties with still liquid viscosities. Trimethylol propane triglycidyl ether (tpte) was used as a reactive crosslinking reagent that lowered viscosity. m-xylylenediamine (mxda) was used as the aliphatic amine hardener. All these monomers were obtained from Sigma Aldrich.

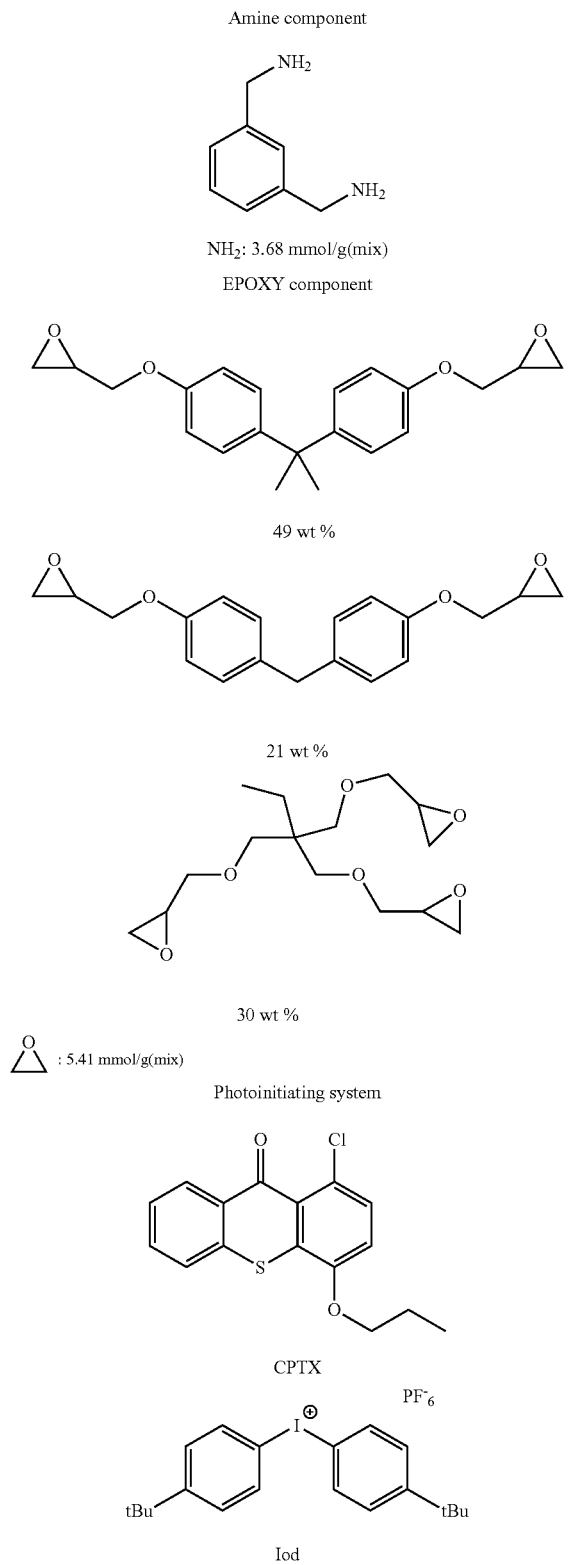

Experimentally, we observed in Real-time Fourier transformed infrared spectroscopy (RT-FTIR) the kinetics of epoxy-amine polyadditions (FIG. 2). Specifically, it was demonstrated that without light, primary amine (NH$_2$) and epoxide conversion are synchronized but very slow: after 180 minutes, only about 85% NH$_2$ are converted when epoxide are fully converted (100%) in good agreement with the initial stoichiometry: there is about 5.41 mmol per grams of epoxy-amine mixture (g(mix)) when there is 3.68 mmol/g(mix). As primary amines are converted into secondary amine (roughly as fast as primary ones) there is potentially more amine reactive functions (7.36 mmol/g(mix)) than epoxy ones. On the contrary, irradiation of epoxy-amine in the presence of CPTX/Iod photoacidic system leads to an outstanding increase of kinetics: epoxides were fully converted after less than 2.5 minutes so as about 90% of NH$_2$, these latter were fully converted after 3.5 min.

Without wishing to be bound by any particular theory, we propose that the CPTX/iodonium salt system generates strong acid, which promotes photoacidic enhancements of epoxy-amine polyaddition (Scheme 2). This surprising result comes in contradiction with common beliefs/knowledge whereby H$^+$ generation in an epoxy-amine media is expected to mainly react with the strongest base i.e. amines not leading to the acceleration of the polyaddition. Calculations indeed show that the aliphatic amine has the strongest protonic affinity against epoxy compounds (see Table 2 shown in FIG. 18). Nevertheless, as shown in this Example, drastic enhancement of epoxy-amine polyaddition does occur, despite the generation in situ of a strong acid (e.g., HPF$_6$). The present invention therefore is the very first report of photoacidic enhancements of epoxy-amine polyadditions. Without wishing to be bound by any particular theory, it is proposed that amine protonation by light generated HPF$_6$ is reversible, when protonation of the epoxy compounds will irreversibly lead to a carbon centered cation rapidly quenched by amine free double bond present in the media: therefore, epoxy-amine photoacidic reaction can occur strongly enhancing the polyaddition kinetic.

Scheme 2 photoacidic catalyzed epoxy-amine polyaddition

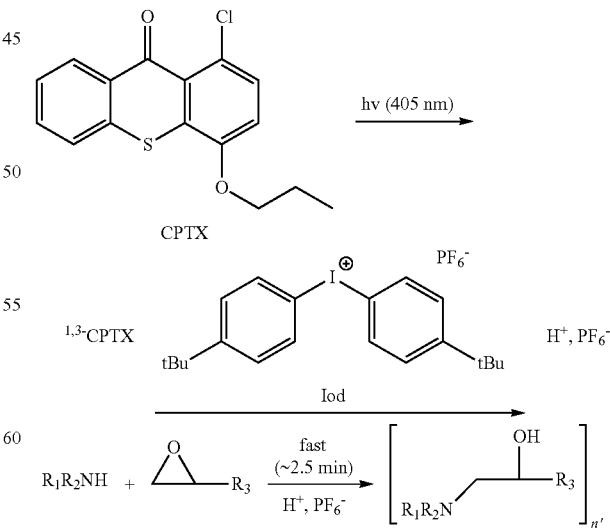

Other clues also show us that it is indeed a photoacidic enhancement of the reaction (FIGS. 4 and Table 3). First, we performed a blank redox reaction known to generate Ar⁺ in situ the polyaddition without light (amine/peroxide see in Table 3). [19] This did not at all accelerate the polyaddition (Table 3). Therefore, the polyaddition enhancement cannot be attributed to hypothetical aryl radicals (Ar⁺) byproducts of CPTX/Iod photoacidic reaction. Secondly, the CPTX/Iod 2-component system is indeed necessary for the photoacidic catalysis (see control experiments in FIG. 4A). Thirdly, photothermal accelerations i.e. light induced heating of the media were checked. CPTX absorbing species was irradiated in the epoxy resin alone for 15 minutes and a maximum temperature of 50° C. was obtained. In Table 3, one can see that the thermal polyaddition at 50° C. (without light) is lasting at least 1 h 20 min so simple thermal acceleration is not sufficient to explain improvements observed in epoxy-amine Photopolyaddition. Noteworthy (FIG. 4B and Table 3), the photoacidic enhancement must be performed under an irradiance of at least 150 mW/cm² in order to obtain very fast kinetics (<17 min).

Accordingly, in one variant, the catalytic species generated by the photoinitiating system in the composition photocurable on demand according to the invention may be a strong acid. This may be the case for example when an iodonium salt is used as oxidation agent, in combination with a photoinitiator or photosensitizer that absorbs light at the desired UV-visible to near-infrared irradiation under which the composition is to be cured.

Versatility of the epoxy-amine Photopolyaddition is discussed in Table 1 and FIGS. 5, 6 and 7 with detailed epoxide and amine conversions. The Example therefore demonstrates a huge versatility of epoxy-amine Photopolyaddition (cationic or free radical) and its high efficiency in thick samples and composites. Thin (40 µm), thick to very thick (1.4 and 26 mm, see FIG. 7) as well as filled samples for the access to composites can be produced in less than 10 minutes. Even more interestingly, no significant drawback such as oxygen inhibition (observed in free radical polymerization) or water inhibition (cationic polymerization) is observed with the process according to the present invention. Also remarkably, the process may be carried out upon safe (and efficient in terms of energy consumption[13]) irradiation wavelength @405 nm (no UV lamp is involved).

Full conversion (Table 1) was observed in all cases for epoxide function. Higher primary amine conversion is observed in the case of photopolyaddition experiments against thermal or RT polyadditions. For the primary and secondary amines conversions accounted together, a higher value was obtained especially for the fastest photopolyadditions. In all cases, dramatically enhanced kinetic of polyaddition reaction was observed (see comparative example in FIG. 8). Specifically, it was observed: NH conversion (no light)≤NH conversion (thin samples, LD@405 nm)<NH conversion (thick samples, LED@405 nm at 110 mW/cm², FIG. 6)<NH conversion (1.4 mm thick filled samples, LD@405 nm=450 mW/cm²)<NH conversion (1.4 mm thick samples, LED@405 nm=450 mW/cm²). Similar results were obtained with camphorquinone as photoinitiator/photosensitizer (FIG. 10).

TABLE 1

Representative epoxy-amine (Photo)polyadditions and quantitative estimations of conversions/curing times.

| Sample | Irradiation conditions | Epoxide conv. (%) | NH₂[1] conv. (%) | NH[1] conv. (%) | Curing time |
|---|---|---|---|---|---|
| 1.4 mm Clear | No light (NL) @ RT | ≥98 | 85 | 46 | ≥3 hours |
| 1.4 mm Clear | NL @ 50° C. | ≥98 | 86 ± 5 | 46 ± 7 | 90 ± 10 min |
| 1.4 mm Clear | LD@405 nm 450 mW/cm² | ≥98 | ≥98 | 83 ± 4 | 150 ± 15 sec |
| 1.4 mm Filled[2] | LD@405 nm 450 mW/cm² | 92 ± 2 | ≥98 | 68 ± 2 | 350 ± 30 sec |
| 40 µm Clear | LD@405 nm 450 mW/cm² | 65 ± 10 | ≥94 | 40 ± 10 | 12-18 min |
| 2.6 ± 0.2 cm Clear | LED@405 nm 230 mW/cm² | n.e.[3] | n.e. | n.e. | 530 ± 30 sec |

[1]NH₂ stands for primary amine and NH for both primary and secondary amines.
[2]Filled composite: 45 wt % barium glass fillers, 0.55 wt % CPTX; 1.10 wt % Iod.
[3]n.e: not estimated (as not compatible with FTIR analysis).
NL: no light.

TABLE 3

Summary of representative curing experiment (if mentioned, LED@405 nm irradiance of 210 mW/cm² for 15 min).

| Conditions | Estimated curing time |
|---|---|
| Epoxy-amine (no irradiation) | ≥3 hours |
| Epoxy-amine (no irradiation) + CPTX/Iod | ≥3 hours |
| Epoxy-amine (no irradiation) + 4-N,N TMA/BPO | ≥3 hours |
| Epoxy-amine (no irradiation, 50° C.) | 1 h 20 min-1 h 40 min |
| Epoxy-amine (LED@405 nm) + CPTX/Iod | 10 min |
| Epoxy-amine (LED@405 nm) + CPTX | 1 h |
| Epoxy-amine (LED@405 nm) + Iod | ≥3 hours |
| Epoxy-amine (LED@405 nm) | ≥3 hours |

Finally, improved mechanic properties and shear modulus were obtained in the case of Epoxy-amine Photopolyaddition (FIGS. 3 and 9). In detail, glassy transition temperature is of 48° C. for heated polyaddition, 51° C. for polyaddition at room temperature and 67° C. for epoxy-amine Photopolyaddition. Improved mechanical properties are concomitantly due to: i) higher conversion for primary and secondary amines (see Table 1); ii) higher polyaddition synthesis temperature.

In the Examples that follows, all wt % in respect of the photoinitiators, oxidation agent and optional benzyl-type alcohol additive, are provided based on the total weight of epoxide/amine mixture used (e.g. 1 wt % CPTX corresponds to 20 mg CPTX in 2.00 g of epoxy/amine mixture without additives).

Example 2—Use of a Variety of Photoinitiators for the Photopolyaddition of Epoxy-Amine Resins Example 1 was repeated, using Mix Araldite-TGE as cyclic ether components, m-XDA as polyfunctional amine, and 2-ITX, CPTX or G1+SC938 as photoinitiating system.

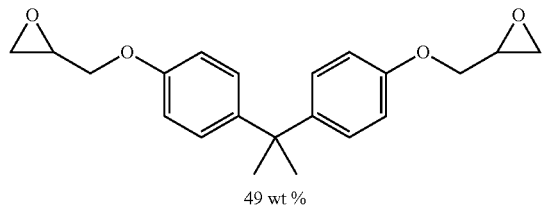

49 wt %

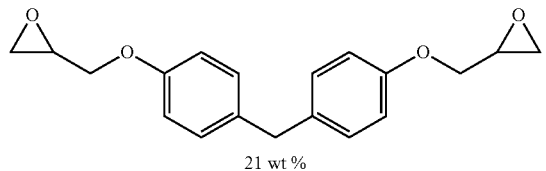

21 wt %

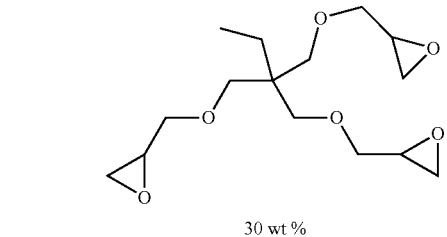

30 wt %

70% Araldite (70% Araldite GY 210-30% Araldite GY 282)
30% trimethylpropane triglycidyl ether

m-xylenediamine
m-XDA

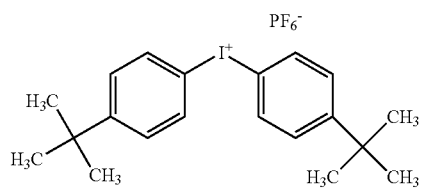

SC 938

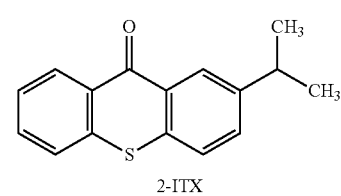

2-ITX

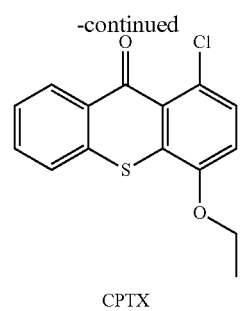

CPTX

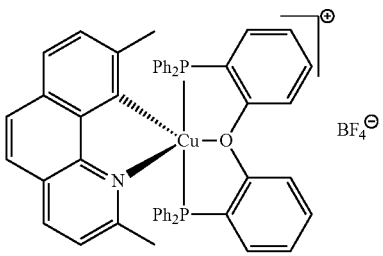

G1

The reagents were used in the following quantities: Mix Araldite-TGE (75 wt %)/mXDA (25 wt %)/Photoinitiator (2-ITX, CPTX, 1 wt % or G1, 0.5 wt %)/oxidation agent SC938 (2 wt %).

All kinetics were performed under the following conditions:

Laser diode@ 405 nm, I=450 mW/cm$^2$

In thick sample 1.4 mm

Under the air

All three photoinitiators: 2-ITX, G1 and CPTX gave excellent results for the polyaddition reaction: maximum conversion rates of 100% are observed at an irradiation time of less than 250 sec. Tackfree polymers were obtained in all cases.

Example 3—Use of a Variety of Polyfunctional Amines for the Photopolyaddition of Epoxy-Amine Resins Example 1 was repeated, using Mix Araldite-TGE as cyclic ether components, ITX, CPTX or G1+SC938 as photoinitiating system, and the following amines as polyfunctional amines:

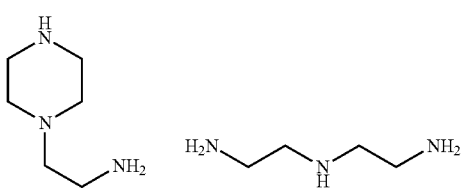

N-aminoethylpiperazine
N-AEP

Diethylenetriamine
DTA

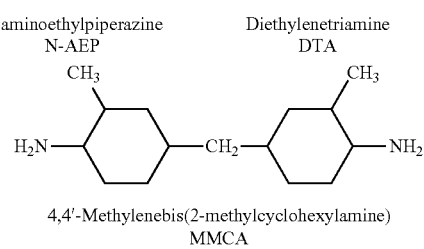

4,4'-Methylenebis(2-methylcyclohexylamine)
MMCA

-continued

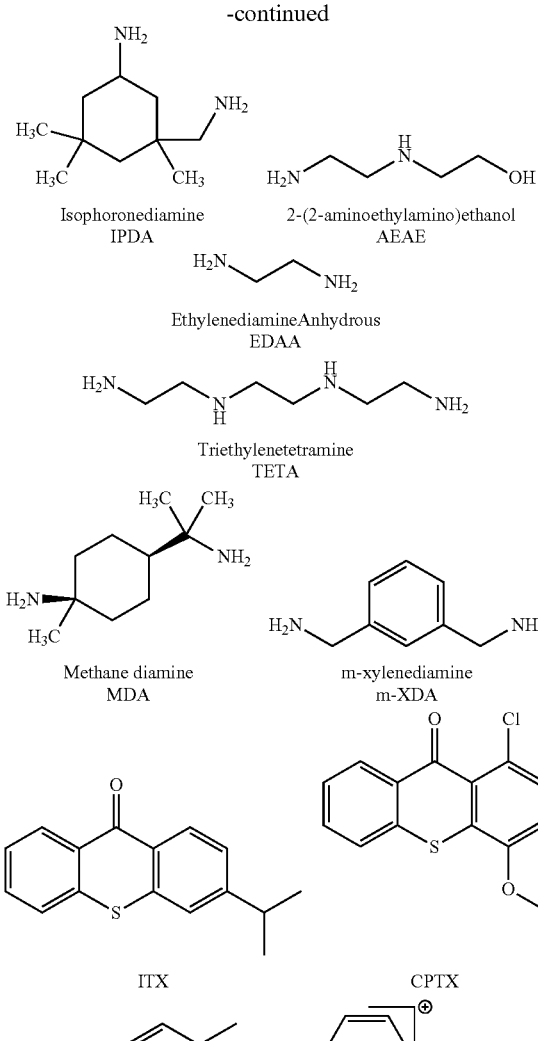

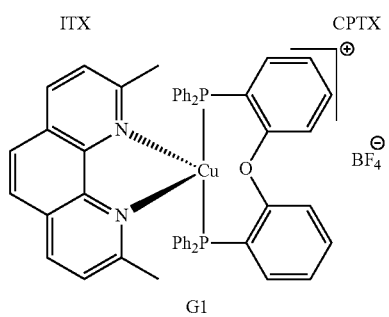

The reagents were used in the following quantities: Mix Araldite-TGE (75%)/Polyfunctional Amine (25%)/photoinitiator (ITX, CPTX: 0.1 wt %; or G1, 0.5 wt %)/oxidation agent SC938 (2 wt %).

All kinetics were performed under the following conditions:

Laser diode@ 405 nm, I=450 mW/cm²

In thick sample 1.4 mm

Under the air

TABLE 4

Curing time required to reach a full Final Conversion ("FC") of epoxide function

| | Photoinitiating system | | |
|---|---|---|---|
| Amine | $^a$G1/SC938 (min.) | $^a$ITX/SC938 (min.) | $^a$CPTX/SC938 (min.) |
| m-XDA | 3.5 | 2.7 | 1.6 |
| N-AEP | 2.4 | 10 | 3.6 |
| DTA | 3.3 | >20 | 4.6 |
| MDA | >20 | >20 | >20 |
| MMCA | >10 | >10 | 6 |
| IPDA | 4.8 | 11.6 | 9.5 |
| AEAE | 4 | >10 | 5.5 |
| EDAA | 6 | 3.3 | 3.3 |
| TETA | 5 | >10 | >10 |

$^a$DL@405 nm (I = 450 mW/cm²)

The Table 4 above shows the reactivity of the different amines with the Araldite-TGE Mix as epoxy resin. All polyfunctional amines tested worked well. N-EPA, DTA, EDAA and m-XDA are the most reactive amines. The reactivity depends on the functionality of the amine used. Tackfree polymers were obtain in all cases.

This Example was repeated using 2-ITX+SC938 as photoinitiating system, Epoxy MixB as Epoxy component:

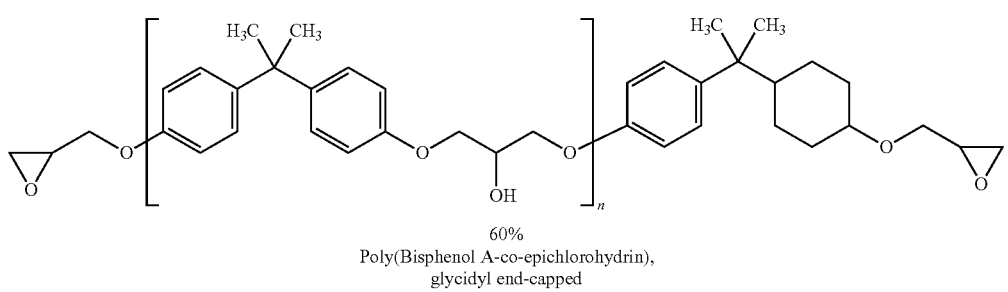

60%
Poly(Bisphenol A-co-epichlorohydrin), glycidyl end-capped

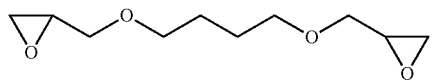

40%
1,4-Butanediol diglycidyl ether and m-XDA, DTA or EDAA as polyfunctional amine component.

The reagents were used in the following quantities: epoxide mix (75%)/Polyfunctional Amine (25%)/photoinitiator 2-ITX (1 wt %)/oxidation agent SC938 (2 wt %). All samples lead to 100% epoxide conversion after 600 sec irradiation with laser diode@405 nm (1=450 mW/cm$^2$), and tackfree polymers were obtained in all cases.

Example 4—Use of a Near IR Dye for the Photopolyaddition of Epoxy-Amine Resins Example 3 was repeated, using Mix Araldite-TGE as cyclic ether components, IR-813+SC938 as photoinitiating system, and the amines of Example 3 as polyfunctional amines.

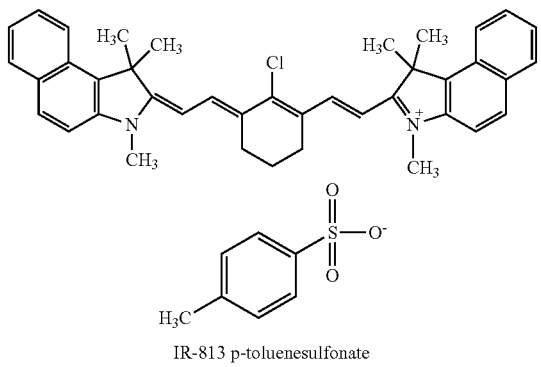

IR-813 p-toluenesulfonate

The reagents were used in the following quantities: Mix Araldite-TGE (75%)/m-XDA (25%)/IR-813 50 (0.1 wt %)/SC938 (2 wt %).

The kinetics were carried out under the following conditions

Laser diode@ 785 nm, I=2.5 W/cm$^2$
In thick sample 1.4 mm
Under the air

TABLE 5

Curing time required to reach a full FC of epoxide function

| Amine | Photoinitiating system $^a$IR-813/SC938 |
|---|---|
| m-XDA | 80 s |
| N-AEP | 1.2 min |
| DTA | 85 s |
| MDA | >20 min |
| MMCA | >10 min |
| IPDA | 2.2 min |
| AEAE | 85 s |
| EDAA | 1.8/min |
| TETA | 80 s |

$^a$DL@785 nm (I = 2.5 W/cm$^2$)

Excellent reactivity was obtained with the near-infrared epoxy-amine reaction with the IR-813 photoinitiator. The system in the near IR has an excellent conversion rate for an irradiation time of less than 100 sec. By comparing the polymerization rates for the visible and infrared absorbent systems used in Example 3, it is observed that the IR-813 system exhibited a faster polymerization rate than the visible absorbent systems. Cf. FIG. 11. Tackfree polymers were obtained in all cases.

Example 5—Use of an Epoxide Mix as Cyclic Ether Component for the Photopolyaddition of Epoxy-Amine Resins Example 2 was repeated, using Epoxy MixA as cyclic ether components, Amine MixC as polyfunctional amine component, and 2-ITX, CPTX or G1+SC938 as photoinitiating system. Amine MixC may be purchased as product reference "SD 8820®" from SICOMIN.

Epoxy MixA, which may be purchased as product reference "SR InfuGreen 810®" from SICOMIN, is composed of A+B+C below:

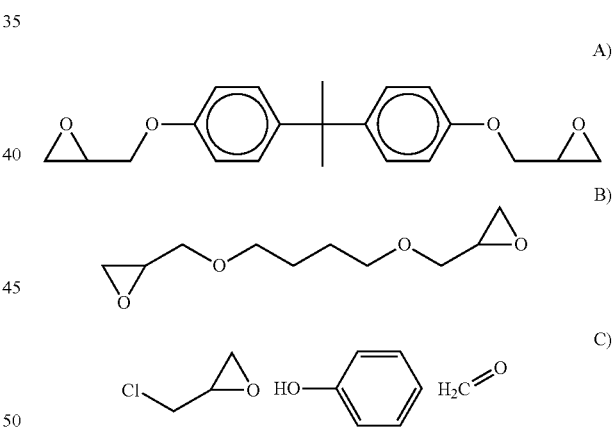

C being the oligomeric reaction products of formaldehyde with 1-chloro-2,3-epoxypropane and phenol.

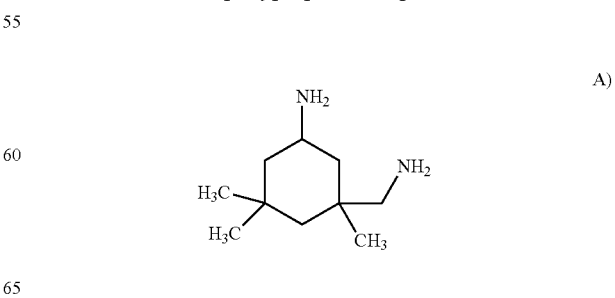

-continued

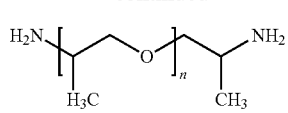

n = 2-6

Amine MixC
A: 50-75%
B: 25-50%
(molar ratio)

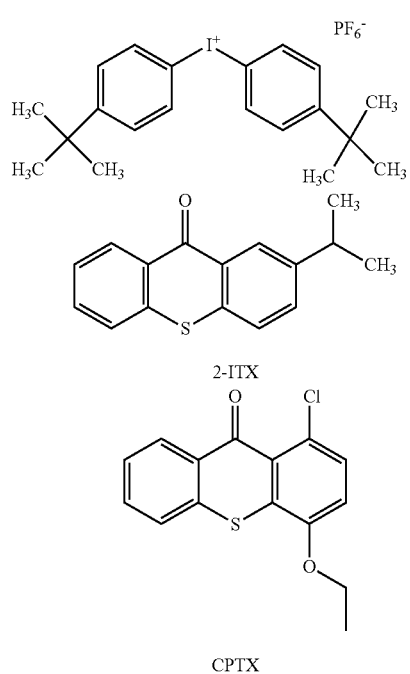

2-ITX

CPTX

G1

DBA

The reagents were used in the following quantities: Epoxy MixA (69%)/Amine MixC (31%)/Photoinitiator (2-ITX, CPTX or DBA: 1 wt %, or G1: 0.5 wt %)/oxidation agent SC938 (2 wt %).

All kinetics are performed under the following conditions:
Laser diode@ 405 nm, I=450 mW/cm$^2$
In thick sample 1.4 mm
Under the air The combination Epoxy MixA/Amine MixC exhibited very good conversion rates with all photoinitiators/photosensibilizers used, with CPTX and G1 having very high conversion rates (>95% and >80%, respectively). Cf. FIG. 12. Tackfree polymers were obtained in all cases.

Example 6—Use of Dibenzoyl Peroxide as Photoinitiator in the Photopolyaddition of Epoxy-Amine Resins Example 1 was repeated, using Mix Araldite-TGE as cyclic ether components, m-XDA as polyfunctional amine, and 2-ITX+dibenzoyl peroxide (REDIC BP 50 WHITE) as photoinitiating system.

The reagents were used in the following quantities: Mix Araldite-TGE (75 wt %)/mXDA (25 wt %)/2-ITX 1 wt % and REDIC BP 50 WHITE (2 wt %).

All kinetics were performed under the following conditions:
Laser diode@ 405 nm, I=450 mW/cm$^2$
In thick sample 1.4 mm
Under the air As shown in FIG. 13, dibenzyl peroxide as oxidation agent also gave excellent results for the polyaddition reaction (tackfree polymer).

Example 7—Use of Alcohol Additives for the Photopolyaddition of Epoxy-Amine Resins Example 5 was repeated, using benzyl-type alcohols (2 wt %) in the reaction mixture. As such, Epoxy MixA was used as cyclic ether component, Amine MixC as polyfunctional amine component, and 2-ITX, G1 or IR-813+SC938 as photoinitiating system, and one of the following benzyl-type alcohols:

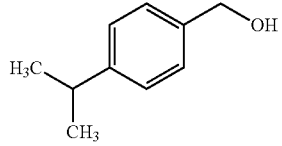

4-Isopropylbenzyl alcohol

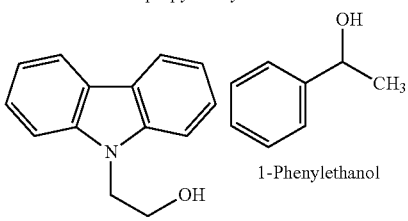

1-Phenylethanol

CARET

The reagents were used in the following quantities: Epoxy MixA (69%)/Amine MixC (31%)/Photoinitiator (2-ITX=1 wt % or G1=0.5 wt % or IR-813=0.1 wt %)/oxidation agent SC938 (2 wt %).

All kinetics were performed under the following conditions:
Irradiation with laser diode@405 nm (I=450 mW/cm$^2$) for G1 and 2-ITX. Irradiation with laser diode@785 nm (I=2.5 W/cm$^2$) for IR-813.
In thick sample 1.4 mm
Under the air From FIGS. 14, 15 and 16, it is observed that the reactivity of the polyaddition underwent a remarkable improvement in the presence of a benzyl-type alcohol. In all cases, a higher final conversion is obtained with the benzyl-type alcohol additive.

Example 8—Use of a Variety of Onium-Type Oxidation Agents+UV-Visible Photoinitiator for the Photopolyaddition of Epoxy-Amine Resins Example 1 was repeated, using Mix Araldite-TGE as cyclic ether components, m-XDA as polyfunctional amine, and 2-ITX+Onium salt as photoinitiating system.
The following onium salts were tested:
SC938
SC 938 Cl$^-$
Phenyl(2,4,6-trimethoxyphenyl)-iodonium p-toluenesulfonate
Triphenylsulfonium triflate

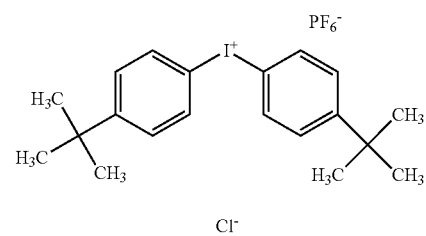

SC 938

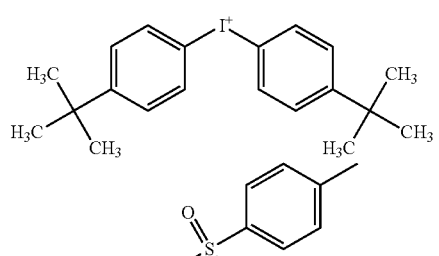

SC938 Cl$^-$

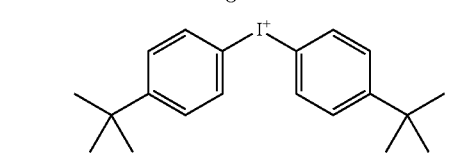

Phenyl(2,4,6-trimethoxyphenyl)-iodonium p-Toluenesulfonate

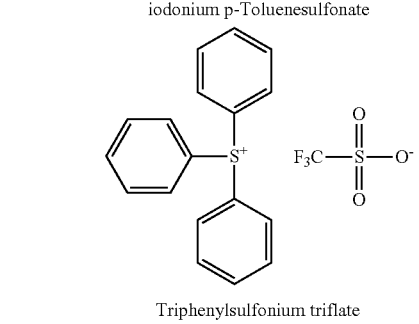

Triphenylsulfonium triflate

The reagents were used in the following quantities: Mix Araldite-TGE (75 wt %)/m-XDA (25 wt %)/Photoinitiator 2-ITX (1 wt %)/oxidation agent onium salt (2 wt %). All kinetics were performed under the following conditions:
Laser diode@ 405 nm, I=450 mW/cm$^2$
In thick sample 1.4 mm
Under the air
The photoinitiating system 2-ITX/onium salt (iodoniul or sulfoniul salts) gave excellent results for the polyaddition reaction: maximum conversion rates of 90-100% are observed at an irradiation time of 100 seconds (tackfree polymer). Cf. Table 6

TABLE 6

| Onium salt oxidation agent | Epoxide conversion (after 100 sec irradiation) |
|---|---|
| SC938 | 100% |
| SC938 Cl$^-$ | 100% |
| Phenyl(2,4,6-trimethoxyphenyl)-iodonium p-toluenesulfonate | 90% |
| Triphenylsulfonium triflate | 100% |

Example 9—Use of a Variety of Onium-Type Oxidation Agents+NIR Photoinitiator for the Photopolyaddition of Epoxy-Amine Resins Example 8 was repeated, using IR-813 (0.1 wt %) as photoinitiator.
The reagents were used in the following quantities: Mix Araldite-TGE (75 wt %)/mXDA (25 wt %)/Photoinitiator IR-813 (0.1 wt %)/oxidation agent onium salt (2 wt %). All kinetics were performed under the following conditions:
Laser diode@ 405 nm, I=450 mW/cm$^2$
In thick sample 1.4 mm
Under the air
The photoinitiating system IR-813/onium salt (iodonium or sulfonium salts) gave yet better results for the polyaddition reaction as compared to UV-visible photoinitiator 2-ITX: maximum conversion rates of 100% are observed at an irradiation time of fewer than 4 minutes (tackfree polymer), with SC938 being the most efficient with a curing time of ~80 seconds. Cf. Table 7

TABLE 7

Comparative curing time between NIR photoinitiator IR-813 and UV-visible photoinitiator 2-ITX: time required to reach a full FC of epoxide function, 1.4 mm sample, under air.

| | Onium oxidation agent | | | |
|---|---|---|---|---|
| Photoinitiator | SC938 | SC938 Cl$^-$ | Phenyl(2,4,6-trimethoxyphen-yl)-iodonium p-toluenesulfonate | Triphenyl-sulfonium triflate |
| 2-ITX (1 wt %)/onium salt (2 wt %) | ++ (~1.6 min) | + (~6.6 min) | + (~6.6 min) | ++ (~3.5 min) |
| IR-813 (0.1 wt %)/onium salt (2 wt %) | ++ (~80 sec) | ++ (~3.5 min) | ++ (~3.5 min) | ++ (~3.5 min) |

Example 10—Epoxy-Amine Resin Composites

Figure 17A:
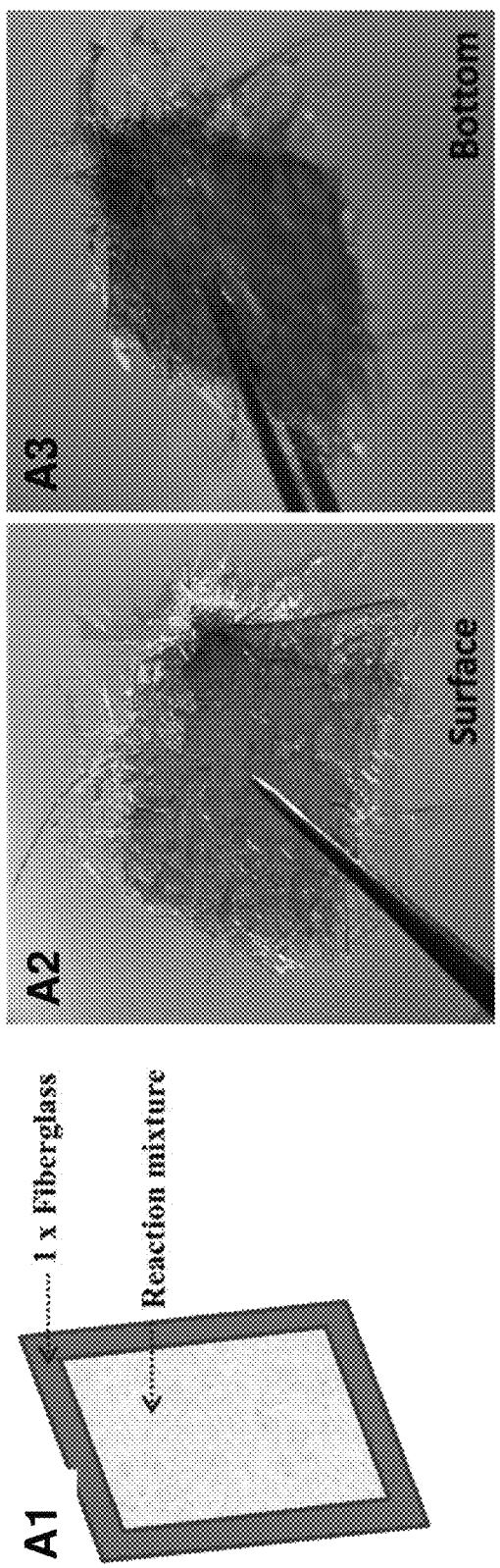

The photoinitiating system, composed of SC938 (2 wt %) and G1 (0.5 wt %) were first dissolved in 0.5±0.02 g Amine MixC at room temperature, together with 4-isopropylbenzyl alcohol (2 wt %), the wt % being calculated based on the total weight epoxy/amine. The resulting mixture was mixed with about 1.50±0.03 g Epoxy MixA at room temperature during about 45 sec before starting the experiment. The resulting mixture (50%) was enducted on a fiberglass sheet (50%). The enducted fiberglass support was then passed through a Hamamatsu conveyor belt under laser diode irradiation @405 nm (I=12 W/cm$^2$), with a speed of 2 m/min. The top surface of the sample was tackfree after 3 passes. After 2 days at room temperature, the bottom side of the sample was tackfree. Cf. FIG. 17A.

Figure 17B:
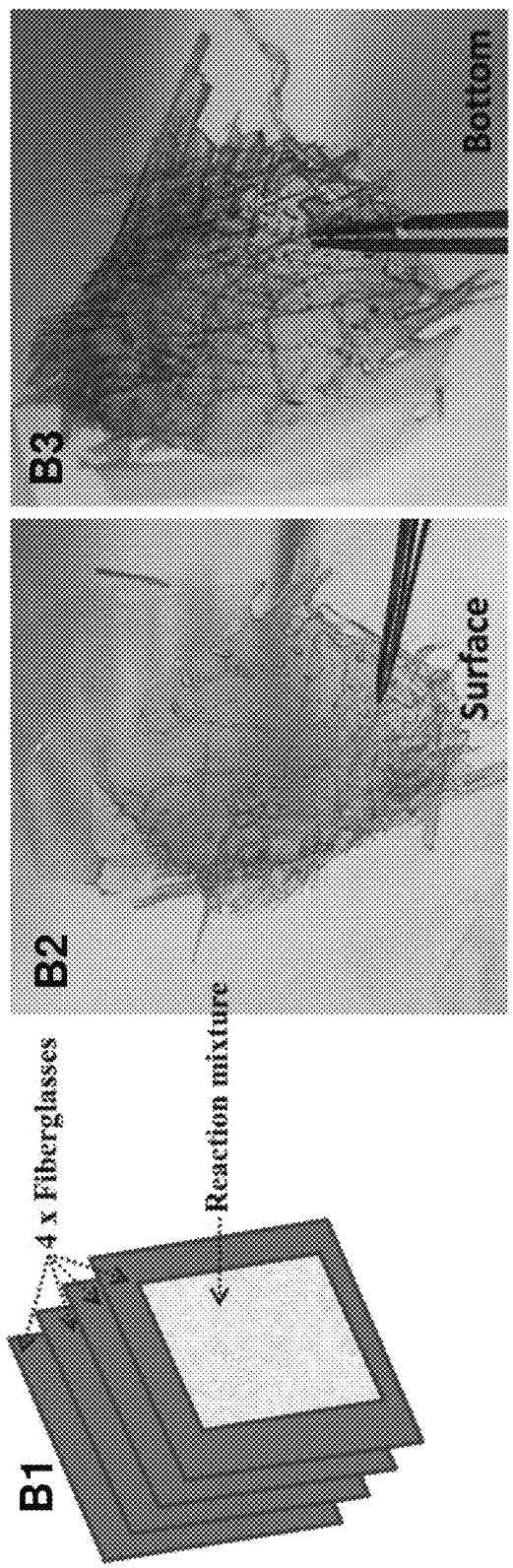

The same experiment was repeated using 4 fiberglass sheets (weight ratio reaction mixture/fiberglass sheets 50/50). The top surface of the sample was tackfree after 3 passes. After 2 days at room temperature, the bottom side of the sample was tackfree. Cf. FIG. 17B.

CONCLUSIONS

The Examples that precede illustrate the reduction to practice of enhanced/improved cyclic ether-amine photopolyaddition, which marks a significant leap forward in light induced production of materials. Its potential in the industry is huge as it allows spectacular kinetics enhancements (up to 72 fold) and improved mechanical properties for already widely used cyclic ether/amine resins, such as epoxy/amine resins. Even more interestingly, cyclic ether-amine photopolyaddition already shows a huge versatility from thin (40 μm) to thick (2.6 cm) samples and is compatible with composites production. Remarkably, this is the very first report of photoacidic catalysis to outstandingly enhance reaction kinetics (2.5 minutes) and final material properties (see below) upon safe irradiation conditions (@405 nm). The addition of benzyl-type alcohol additives proved to be particularly useful in enhancing the efficacy of the photopolyaddition process.

While we have described a number of embodiments of this invention, it is apparent that the Examples may be altered to provide other embodiments that utilize the compositions and methods of this invention. Therefore, it will be appreciated that the scope of this invention is to be defined by the appended claims rather than by the specific embodiments that have been represented herein by way of example.

REFERENCES

[1] "Handbook of Epoxy Resins," Lee & Neville, Mc Graw-Hill (1982), "Chemistry and technology of the epoxy Resins," B. Ellis, Chapman Hall (1993), New York and "Epoxy Resins Chemistry and technology," C. A. May, Marcel Dekker, New York (1988).
[2] IUPAC. Compendium of Chemical Terminology, 2nd ed. (the "Gold Book"). 6. Yilmaz, G., Beyazit, S. & Yagci, Y. Visible light induced free radical promoted cationic polymerization using thioxanthone derivatives. J. Polym. Sci. Part Polym. Chem. 49, 1591-1596 (2011).
[3] a) Ajayaghosh, A. Chemistry of Squaraine-Derived Materials: Near-IR Dyes, Low Band Gap Systems, and b) Cation Sensors. Acc. Chem. Res. 2005, 38, 449-459.
[4] Bures, F. Fundamental aspects of property tuning in push-pull molecules. RSC Adv. 2014, 4, 58826-58851.
[5] Alfred Treibs und Franz-Heinrich Kreuzer. Difluorboryl-Komplexe von Di- und Tripyrrylmethenen. Justus Liebigs Annalen der Chemie 1968, 718 (1): 208-223; BODIPY Dye Series Archived 2008 Feb. 26 at the Wayback Machine.
[6] K. L. Marshall, G. Painter, K. Lotito, A. G. Noto & P. Chang (2006) Transition Metal Dithiolene Near-IR Dyes and Their Applications in Liquid Crystal Devices, Molecular Crystals and Liquid Crystals, 454:1, 47/[449]-79/[481].
[7] WO 94/22968
[8] EP0276501A1
[9] EP0249201A1
[10] WO 97/12945
[11] EP0008127A1
[12] Garra, P., Bonardi, A., Baralle, A., Al Mousawi, A., Bonardi, F., Dietlin, C., Morlet-Savary, F., Fouassier, J. and Lalevée, J., Monitoring photopolymerization reactions through thermal imaging: A unique tool for the real-time follow-up of thick samples, 3D printing, and composites. J. Polym. Sci. Part A: Polym. Chem., 2018, 56: 889-899.
[13] Dahlen, M. A. The Phthalocyanines A New Class of Synthetic Pigments and Dyes. Ind. Eng. Chem. 1939, 31 (7), 839-847.
[14] Torre, G. de la; Claessens, C. G.; Torres, T. Phthalocyanines: Old Dyes, New Materials. Putting Color in Nanotechnology. Chem. Commun. 2007, 0 (20), 2000-2015.
[15] Dietlin, C. et al. Photopolymerization upon LEDs: new photoinitiating systems and strategies. Polym. Chem. 6, 3895-3912 (2015).
[16] Garra, P. et al. Copper (Photo)redox Catalyst for Radical Photopolymerization in Shadowed Areas and Access to Thick and Filled Samples. Macromolecules 50, 3761-3771 (2017).
[17] Garra, P., Morlet-Savary, F., Dietlin, C., Fouassier, J. P. & Lalevée, J. OnDemand Visible Light Activated Amine/Benzoyl Peroxide Redox Initiating Systems: A Unique Tool To Overcome the Shadow Areas in Photopolymerization Processes. Macromolecules 49, 9371-9381 (2016).
[18] Foresman, J. & Frish, E. Exploring chemistry with Electronic Structure Methods. Gaussian Inc Pittsbg. USA (1996).
[19] Garra, P. et al. New copper (I) complex based initiating systems in redox polymerization and comparison with amine/benzoyl peroxide reference. Polym. Chem. 8, 4088-4097 (2017).

The invention claimed is:
1. A composition curable on demand under the triggering action of UV-visible to near-infrared irradiation comprising:
(a) at least one polyfunctional cyclic ether component comprising at least two cyclic ether moieties, wherein the at least one polyfunctional cyclic ether component is selected from:
polyfunctional aromatic epoxy compounds selected from:

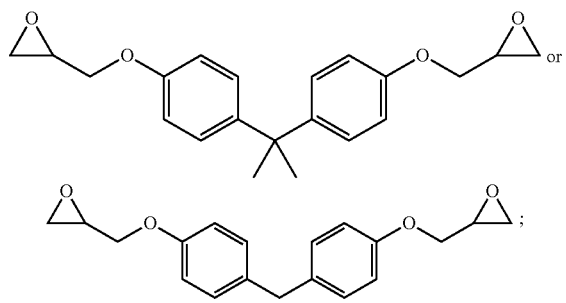

polyfunctional heteroaliphatic epoxy compounds selected from:

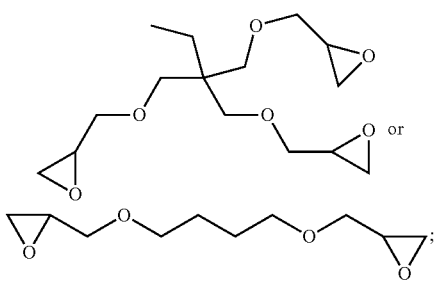

epoxy prepolymers obtained from reaction of diols with epichlorhydrine, selected from bisphenol A diglycidyl ether, 1,4-butanediol diglycidyl ether;
epoxy prepolymers obtained from reaction of diamines with epichlorhydrine, selected from 4,4'-diaminodiphenyl methane tetraglycidyl ether;
or a mixture of two or more of the above;
(b) at least one polyfunctional amine component comprising at least two primary or secondary amine moieties; and
(c) a photoinitiating system generating catalytic species comprising:
at least one suitable photoinitiator or photosensitizer that absorbs light at a UV-visible to near-infrared irradiation under which the composition is to be cured; and
at least one oxidation agent able to react with the photoinitiator or the photosensitizer, selected from iodonium salts, sulfonium salts, and thianthrenium salts.

2. A process for accelerated photopolyaddition of a cyclic ether-amine resin comprising the step of exposing the composition according to claim 1 to UV-visible to near-infrared irradiation.

3. A process for dark curing a cyclic ether-amine resin comprising the step of exposing the composition according to claim 1 to UV-visible to near-infrared irradiation.

4. A process for accelerated curing of a cyclic ether-amine resin comprising the step of exposing to a UV-visible to near-infrared irradiation the composition according to claim 1.

5. A process according to claim 4, wherein the irradiation intensity is greater than or equal to 25 mW/cm$^2$ and less than or equal to 100 W/cm$^2$.

6. The process according to claim 4, wherein the duration of exposure of the resin to the UV-visible to near-infrared irradiation is 1 to 800 seconds.

7. The process according to claim 4, further comprising a step of mixing or impregnating composite reinforcements with said composition prior to the UV-visible to near-infrared irradiation.

8. The process according to claim 7, wherein the composite reinforcements are glass fibers, carbon fibers, aramid fibers, basalt fibers, silica fibers, polymer fibers, natural fibers or a mixture of two or more of those.

9. The process according to claim 4, wherein crosslinking/curing of the composition occurs throughout the whole thickness of the composition.

10. The process according to claim 4, wherein the process is carried out under air.

11. A resin casting, film or coated substrate comprising a cyclic ether-amine resin obtained by the process according to claim 4.

12. The coated substrate of claim 11, wherein the substrate includes metal, glass, ceramic, plastic, adhesive, polymer, composite or wood.

13. An adhesive layer or bonding agent comprising a cyclic ether-amine resin obtained by the process according to claim 4.

14. A composite comprising (i) a cyclic ether-amine resin obtained by the process according to claim 4, and (ii) a reinforcing agent.

15. A process for forming the composite of claim 14, said process comprising spraying, coating or applying the composition onto a substrate and subsequently curing said composition under the UV-visible to near-infrared irradiation.

16. A process for increasing the delamination strength of a laminated composite material, said process comprising mixing or impregnating composite reinforcements with the composition of claim 1.

17. The process according to claim 4, wherein the composition further comprises an alcohol comprising an —OH group on a carbon α or β to an aromatic or heteroaromatic nucleus.

18. The composition according to claim 1, wherein the at least one polyfunctional amine component is selected from:
linear or branched chain aliphatic polyamines selected from ethylene diamine, diethylenetriamine (DTA), Triethylenetetramine (TTA), Tetraethylenepentamine (TEPA), Dipropenediamine (DPDA), Diethylaminopropylamine (DEAPA), hexamethylenediamine, 1,5-Diamino-2-methylpentane, 1,3-Diaminopentane, 2,2-Dimethyl-1,3-propanediamine, or aminoethylethanolamine;
alicyclic polyamines selected from N-aminoethylpiperazine (N-AEP),
Menthane diamine (MDA), Isophoronediamine (IPDA), and 2,4,6-tris(dimethylaminomethyl)phenol, piperazinoethylethylene-diamine, diaminoethylpiperazine, aminoethyltris-aminoethylamine, aminoethyl-diaminoethylpiperazine, aminoethylpiperazinoethylethylenediamine, aminoethyl-piperazine,

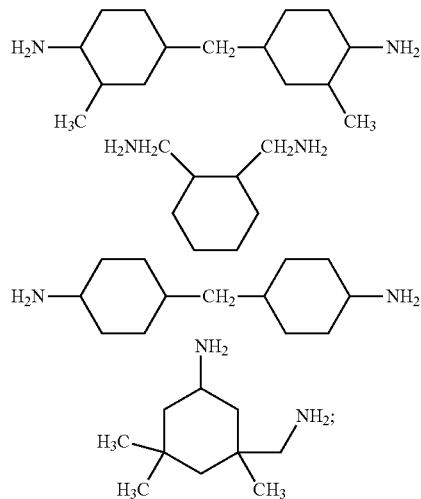

aliphatic aromatic polyamines selected from 1-N-benzyl-benzene-1,4-diamine, m-xylenediamine, xylylenediamine trimer, xylylenediamine derivatives;

aromatic polyamines selected from m-phenylene diamine, diaminodiphenylmethane, diaminodiphenylsulfone, melamine, melamine polyphosphate, 6-phenyl-1,3,5-triazine-2,4-diamine, or melamine cyanurate;

polyetheramines selected from

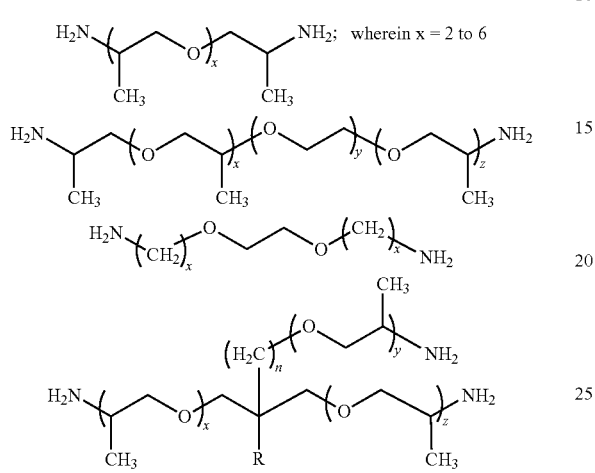

or a mixture of two or more of these.

19. A composition curable on demand under the triggering action of UV-visible to near-infrared irradiation comprising:
(a) at least one polyfunctional cyclic ether component comprising at least two cyclic ether moieties
(b) at least one polyfunctional amine component comprising at least two primary or secondary amine moieties; and
(c) a photoinitiating system generating catalytic species comprising:
at least one suitable photoinitiator or photosensitizer that absorbs light at a UV-visible to near-infrared irradiation under which the composition is to be cured, wherein the at least one suitable photoinitiator or photosensitizer is selected from
photoinitiators or photosensitizers in UV, near-UV and Visible spectra selected from:
2-hydroxy-2-methyl-1-phenylpropan-1-one, 2-hydroxy-1,2-diphenylethanone, (diphenylphosphoryl)(phenyl)methanone, 2-(dimethylamino)-1-(4-morpholinophenyl)ethanone, and bisacylphosphine oxide (BAPO);
xanthones, thioxanthones selected from ITX, 2-ITX and CPTX;

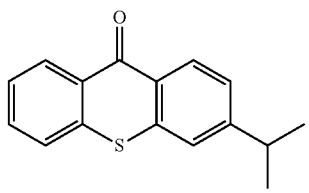

ITX

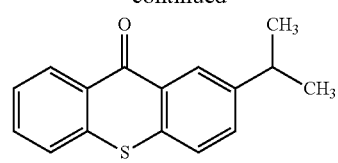

2-ITX

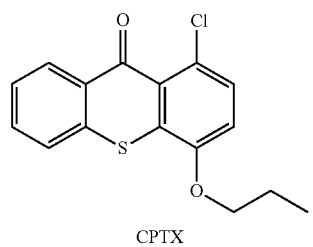

CPTX eosin Y (EY) and Rose Bengal (RB);

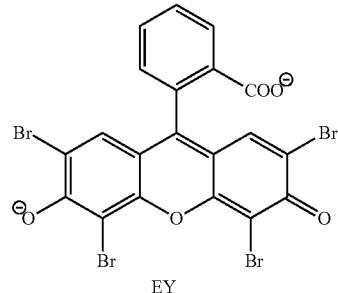

EY

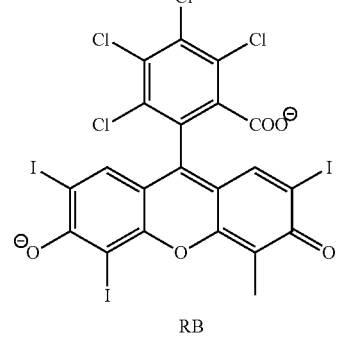

RB pyrene and anthracene; and photoinitiators or photosensitizers in red to Near infrared spectra selected from:

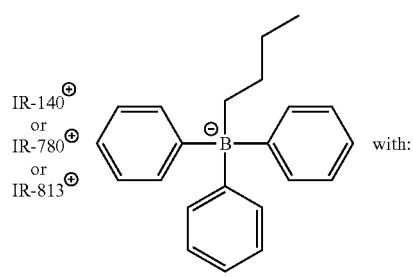

-continued
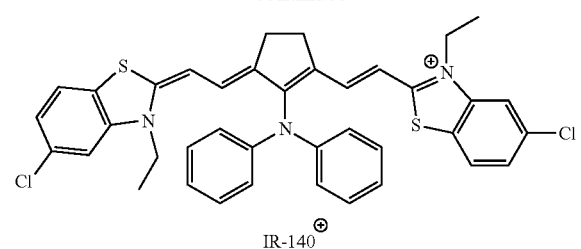
IR-140⁺
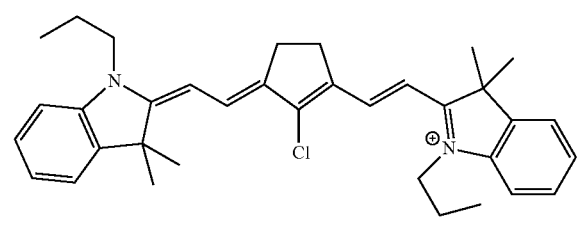
IR-780⁺
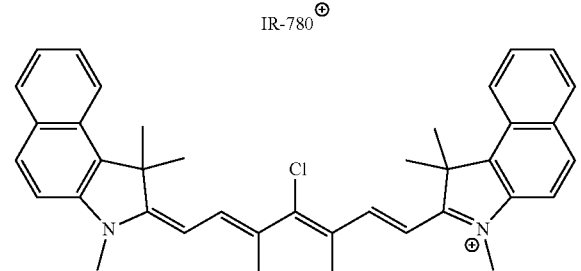
IR-813⁺
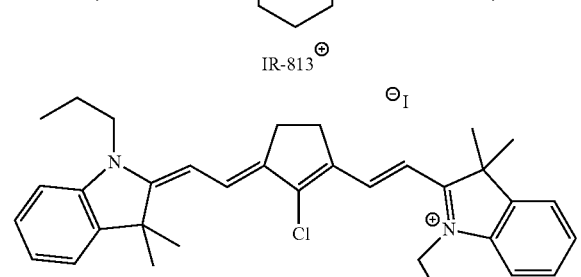
IR-780 iodide
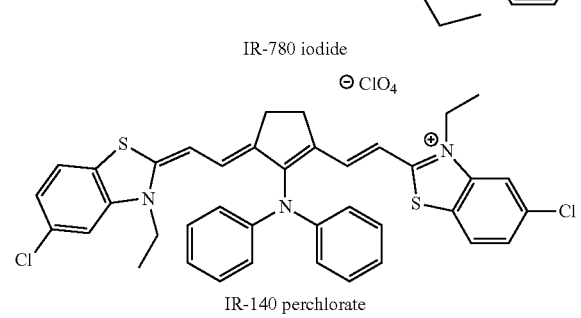
IR-140 perchlorate
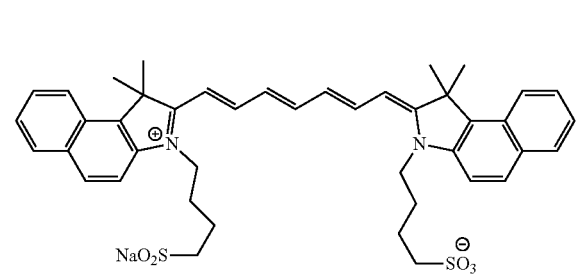
Indocyanine Green
-continued
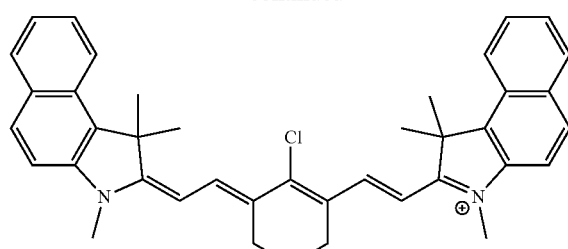
IR-813 p-toluenesulfonate
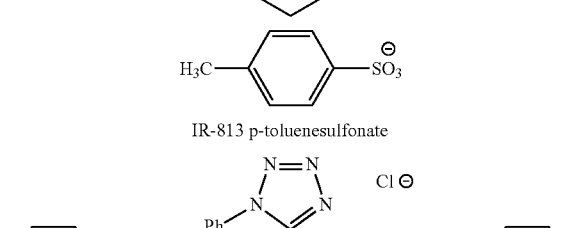
S0507
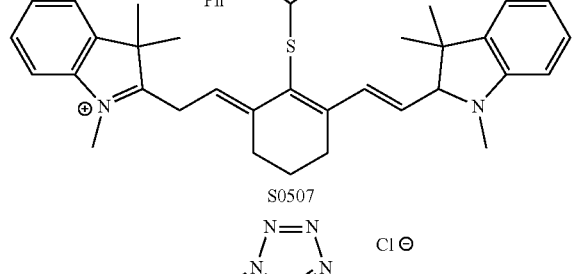
S0507
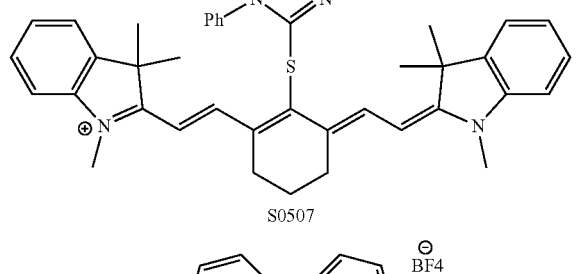
S2025
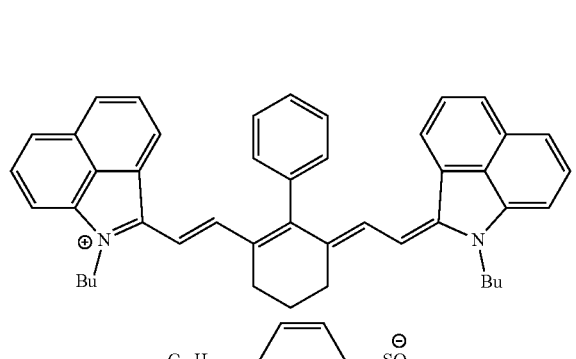
S0991

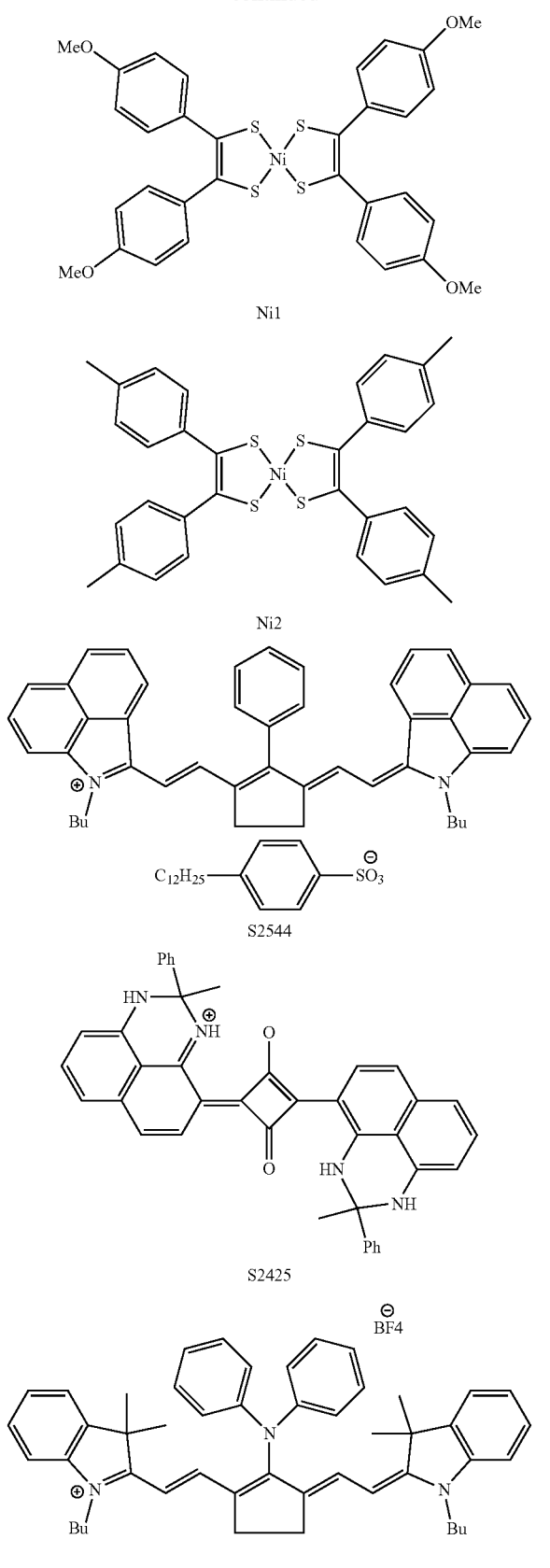
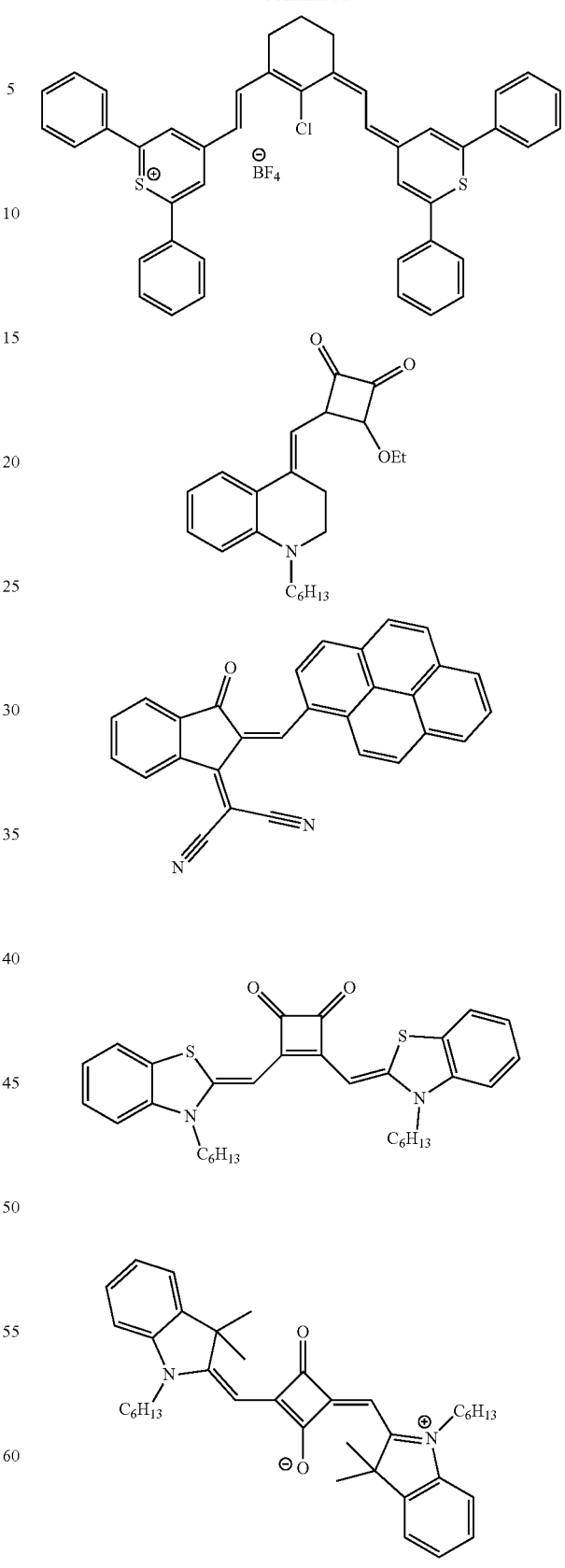

-continued

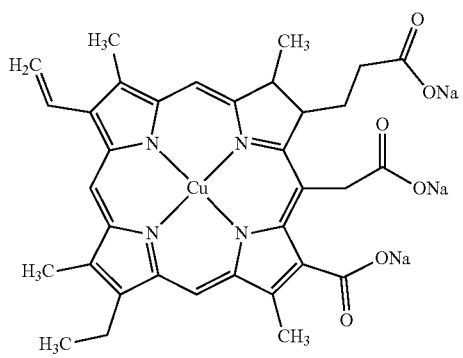

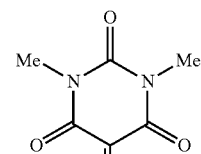

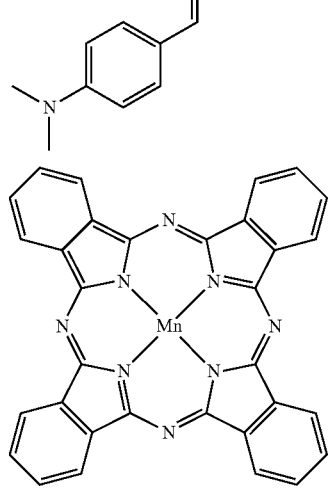

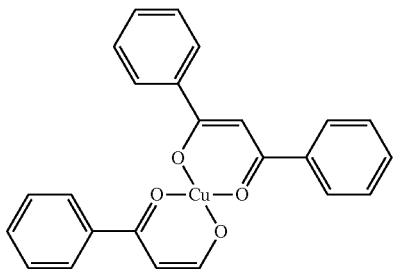

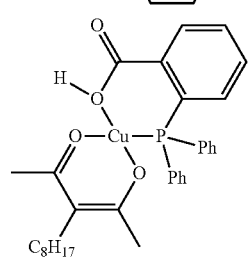

-continued

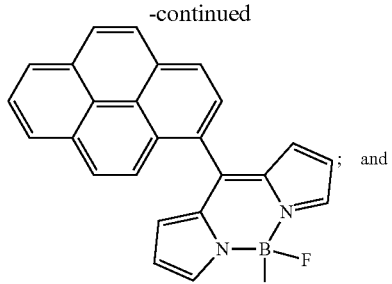
; and

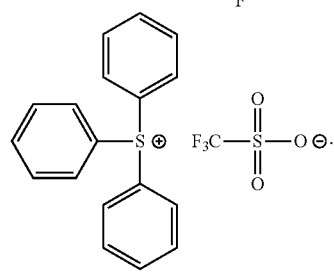

Triphenylsulfonium triflate at least one oxidation agent able to react with the photoinitiator or the photosensitizer, selected from iodonium salts, sulfonium salts, and thianthrenium salts.

20. A composition curable on demand under the triggering action of UV-visible to near-infrared irradiation comprising:
(a) at least one polyfunctional cyclic ether component comprising at least two cyclic ether moieties;
(b) at least one polyfunctional amine component comprising at least two primary or secondary amine moieties; and
(c) a photoinitiating system generating catalytic species comprising:
at least one suitable photoinitiator or photosensitizer that absorbs light at a UV-visible to near-infrared irradiation under which the composition is to be cured; and
at least one oxidation agent able to react with the photoinitiator or the photosensitizer, selected from iodonium salts, sulfonium salts, and thianthrenium salts, wherein the at least one oxidation agent is selected from:

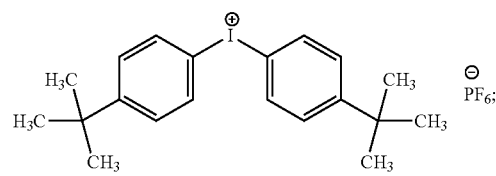

$Ar_2I^+/PF_6^-$

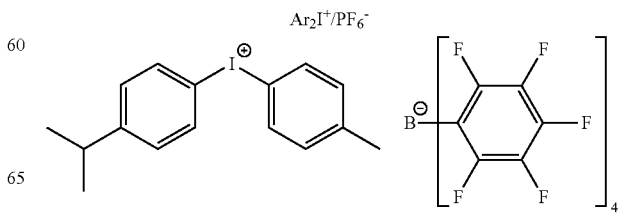

71
-continued
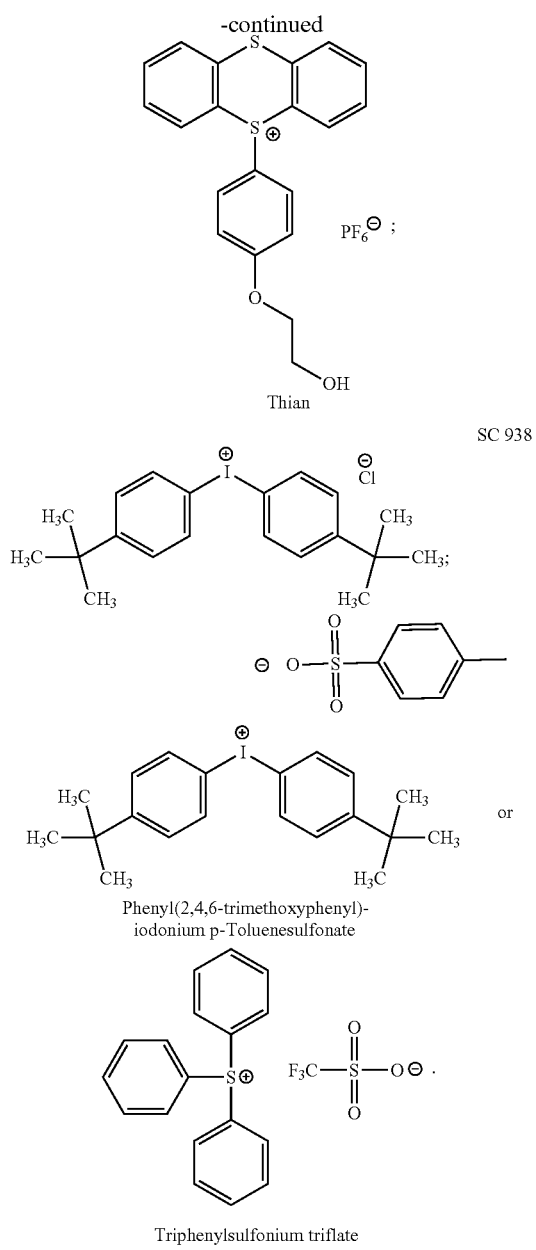
21. The composition according to claim 20, wherein the at least one oxidation agent is selected from:
72
-continued
* * * * *

UNITED STATES PATENT AND TRADEMARK OFFICE
CERTIFICATE OF CORRECTION

PATENT NO. : 12,227,612 B2
APPLICATION NO. : 17/280354
DATED : February 18, 2025
INVENTOR(S) : Patxi Garra et al.

Page 1 of 1

It is certified that error appears in the above-identified patent and that said Letters Patent is hereby corrected as shown below:

In the Specification

Please delete Column 1, Line 14, through Column 8, Line 48

Signed and Sealed this
Eighteenth Day of March, 2025

Coke Morgan Stewart
*Acting Director of the United States Patent and Trademark Office*